United States Patent
Satoh

[19]

[11] Patent Number: 5,877,714
[45] Date of Patent: Mar. 2, 1999

[54] SEARCH CIRCUIT FOR DATA COMPRESSION

[75] Inventor: Akashi Satoh, Yamato, Japan

[73] Assignee: International Business Machines Corporation, Armonk, N.Y.

[21] Appl. No.: 578,314

[22] Filed: Dec. 26, 1995

[30] Foreign Application Priority Data

Dec. 28, 1994 [JP] Japan ..................................... 6-327848
Aug. 22, 1995 [JP] Japan ..................................... 7-213852

[51] Int. Cl.$^6$ ....................................................... G06F 7/00
[52] U.S. Cl. ............................................... 341/87; 341/50
[58] Field of Search ................................. 341/50, 87, 67; 395/606, 612

[56] References Cited

U.S. PATENT DOCUMENTS 5,448,733  9/1995  Satoh et al. ............................. 395/600
5,602,764  2/1997  Eskandari-Gharnin ............ 364/715.09

*Primary Examiner*—Howard L. Williams
*Assistant Examiner*—Pegoy JeanPierre
*Attorney, Agent, or Firm*—Ronald L. Drumheller

[57] ABSTRACT

To compress data at high speed, a search character is input to a write buffer 56 in sequence. Each of content addressable memory (CAM) cell rows compares the search character with character data stored therein and outputs the comparison result through a match line MATCH to a comparison result control circuit 60 every time. The comparison result is held in sequence to latches 82 and 84. When a signal ORFB input to a signal generation circuit 64 is low, the circuit 86 outputs the logical product between the output of the latch 82 and the output of the latch 88 of the preceding stage to a priority encoder 74 through a latch 88 and also to an OR circuit 90. When the signal ORFB is high, the circuit 86 outputs the logical product between the output of the latch 82 and the output of the latch 84 of the preceding stage to the priority encoder 74 through the latch 88 and also to the OR circuit 90. The encoder 74 outputs the logical sum of input signals as a match signal MSIG0 representative of the comparison result, and likewise an encoder 76 outputs the logical sum of input signals as a match signal MSIG. The signal output from the OR circuit 90 is input through a latch 92 and an OR circuit 94 to each signal generation circuit 80 as a signal ORFB. With this arrangement, the length of a path through which a signal passes in one cycle of a clock is reduced to half and therefore data compression can be performed at high speed.

18 Claims, 23 Drawing Sheets

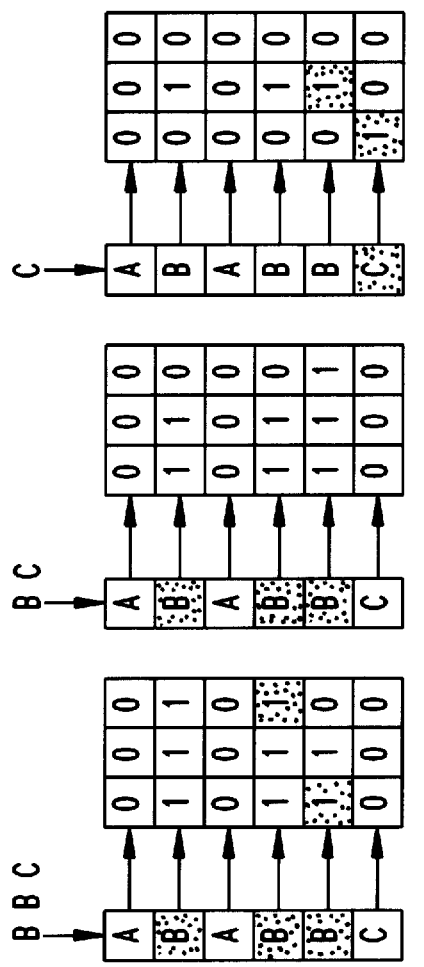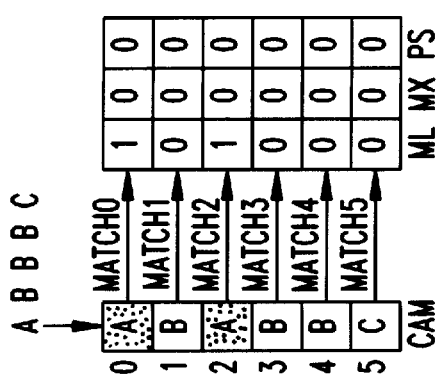

SEARCH CIRCUIT FOR DATA COMPRESSION

BACKGROUND OF THE INVENTION

1. Field of the Invention

The present invention relates to a data search circuit for data compression, and more particularly to a search circuit for data compression which searches repeat data existing in original data composed of text data to compress the length of the original data.

2. Related Art

Multimedia has been advanced in recent years and therefore a variety of systems need to handle massive amounts of various data such as image data, speech data, document data, and programs. When massive amounts of data are stored or transferred to memory devices, compressing data is very effective in costs and processing speed, so data compression techniques are becoming more important. Particularly, lossless compression has a wide range of application, because restored data exactly matches with original data before it is compressed and there is no loss of information.

A compression algoritnh (hereinafter referred to as simply LZ1) proposed as a sort of lossless compression in 1977 by Lemple and Ziv is a useful compression method in which a high compression rate is obtained with respect to a variety of data, as compared with entropy codes such as Huffman codes that are well known. LZ1 is a method in which repeat data included in original data is searched and replaced with another code (pointer indicating the position of the same data that has already appeared, and data length of repeat data) to remove redundancy and compress data. However, the repeat data is variable length data whose length is unpredictable, so there was the problem that the search process is complicated and the compressing process including search of this repeat data is difficult to perform at high speed with hardware.

For this reason, in Published Unexamined Patent Application No. 5-233212, there has been proposed a device for compressing data in which search of repeat data (and compression of data) is performed by a content addressable memory (hereinafter referred to as "CAM") as hardware used in search. In general memories, if the address of a storage position is specified, the data stored in a storage area corresponding to that address will be output, but in the CAM, if data is input, the address of a storage area where that data is stored will be output. More particularly, the CAM includes a comparison circuit for each memory portion for storing data having a predetermined bit length (for example, 8-bit data), and each comparison circuit compares data stored in the memory portion with input data and outputs a signal corresponding to the comparison result. A pair of a memory portion and a comparison circuit will hereinafter be referred to as a CAM cell row.

In the device shown in the above-described Published Unexamined Patent Application No. 5-233212, with respect to original data such as text data, unit data with a predetermined bit length (for example, character data of one character) is taken out from the head of the original data in sequence and input to each CAM cell row as a searched character, and comparison is performed in each CAM cell row every time. Also, based on a signal output from the comparison circuit of each CAM cell row, it is judged whether a repeat character string exists or not. The judgment of the existence of a repeat character string based on a signal output from the comparison circuit of each CAM cell row is performed with a circuit shown in FIG. 16.

In FIG. 16, search data is held in a write buffer and input to each of the CAM cell rows at the same time. The circuit for judging whether a repeat character string exists includes latches ML0 to MLN for holding a result of single character comparison, signal generation circuits $150_0$ to $150_N$, latches PS0 to PSN for holding a result of character string search, and OR circuits 158 and 160. The CAM cell rows are connected to match lines MATCH0 to MATCHN, respectively. The CAM cell rows perform comparison once with respect to a search character that was input, and make a corresponding match line a high level when the comparison result is "match" and make a corresponding match a low level when the comparison result is "non-match." The levels of the match lines are held in the latches ML0 to MLN once and then they are output to the signal generation circuits $150_0$ to $150_N$.

Although FIG. 16 shows the internal constitution of the signal generation circuit $150_1$ only, the signal generation circuits $150_0$ to $150_N$ are the same constitutions. In the signal generation circuit $150_1$, if a feedback signal ORFB output from the OR circuit 160 is a low level, a signal output from the latch ML1 (signal equivalent to a search result of a single character) will be output to the latch PS1, and if the feedback signal ORFB is a high level, a signal equivalent to the logical product between a signal output from the latch PS0 of the preceding stage and a signal from the latch ML1 (signal equivalent to a search result of a character string having a length of two characters or more) will be output to the latch PS1. The signal held in the latch PS1 is output at the next cycle to a first priority encoder 162 and the signal generation circuit $150_2$ of the next stage.

The feedback signal ORFB that is output from the OR circuit 160 is the logical sum of signals output from the AND circuits $154_0$ to $154_N$ of the signal generation circuits $150_0$ to $150_N$, the signal output from each AND circuit 154 being representative of the logical product between the output signal of the latch ML and the output signal of the latch PS of the preceding stage. If the signals from the latches ML and PS are input to each signal generation circuit 150 and then each AND circuit 154 output a signal, the signal from the AND signal circuit 154 will propagate through a signal path passing through the OR circuits 158 and 160 and returning to each signal generation circuit, within a period equivalent to one cycle of a clock signal, and will be input as a feedback signal ORFB to each signal generation circuit.

The feedback signal ORFB means whether in the entire search device a repeat character string with a length of two characters or more was found or not. If the feedback signal ORFB is a high level, the signal generation circuits $150_0$ to $150_N$ will output a signal representative of whether there exists a character string in which a character searched this time was added to repeat character strings found in the comparisons performed up to the last time. If the feedback signal ORFB is a low level, the signal generation circuits $150_0$ to $150_N$ will output to the latch PS the signal which was input from the latch ML for searching a repeat character string starting with the character searched this time.

In the first priority encoder 162, a signal equivalent to the logical sum of the signals input from the latches PS0 to PSN is output as a match signal MSIG1 to a second priority encoder 164, and an address of the latch PS that output a high level signal is output as a match address MADR1 to the second priority encoder 164. When the searches of repeat character string are performed with a plurality of CAMs in parallel, similar signals from the first priority encoders of other CAMs are input to the second priority encoder 164. Then, the second priority encoder 164 outputs to a controller (not shown) a match signal MSIG and a match address MADR of the plurality of CAMs according to the input signals. Also, when the searches of repeat character string are performed with a plurality of CAMs in parallel, signals from the signal generation circuits of other CAMs (not shown) are likewise input to the OR circuit 160.

If in the circuit of FIG. 16, a current cycle is expressed by m, a comparison signal output from the CAM cell row of an address n by ML(n,m), a logical product by "×," a logical sum by "+," and the maximum value of the address n by N, and also the address −1 is expressed by N, number of CAM Blocks is 1, the match of the comparison result by "1," and the non-match of the comparison result by "0," the feedback signal ORFB, the signal PS held in the latch PS, and the match signal MSIG will be given by the following equation (1)

$ORFB=\{ML(0,m)\times PS(N,m)\}+\{ML(1,m0\times PS(0,m)\}+\ldots+\{ML(N,m)\times PS(N-1,m)\}$ when $ORFB=1$, $PS(n,m+1)=ML(n,m)\times PS(n-1,m)$ when $ORFB=0$, $PS(n,m+1)=ML(n,m)$ $MSIG=S(0,m)+PS(1,m)+\ldots+PS(N,m)$ Equation (1)

For reference, if the match of the comparison result is expressed by "0" and the non-match of the comparison result is expressed by "1," the feedback signal ORFB, the signal PS, and the match signal MSIG will be given by the following equation (2)

$ORFB=\{ML(0,m)+PS(N,m)\}\times\{ML(1,m0+PS(0,m)\}\times\ldots\times\{ML(N,m)+PS(N-1,m)\}$ when $ORFB=1$, $PS(n,m+1)=ML(n,m)+PS(n-1,m)$ when $ORFB=0$, $PS(n,m+1)=ML(n,m)$ $MSIG=S(0,m)\times PS(1,m)\times\ldots\times PS(N,m)$ Equation (2)

Also, in the circuit of FIG. 16, a character data string of "ABABBC" has already been in stored in the CAM cell rows of addresses 0 to 5 in ascendant order as an example. Also, in a case where character data are input as search data in order of "ABBBC . . . ," the level held in each latch and the transition of the level of each signal are shown in FIG. 17, and the timing diagram at that time is shown in FIG. 18.

However, in the above-described device the feedback signal ORFB is generated with the signals output from a large number of signal generation circuits 150 provided for each CAM cell row, and the generated feedback signal ORFB is input to each of the signal generation circuits 150, so there is the need of providing a large number of signal lines for guiding to the OR circuits 158 and 160 the signals output from the signal generation circuits 150 and also a large number of signal lines for guiding to a large number of signal generation circuits the feedback signal ORFB output from the OR circuit 160. As a result, the portion in which these signal lines occupy a large area (about 10%) of the entire circuit. Therefore, there was the problem that the scale of the circuit is large and the size of the device is difficult to reduce.

Note that the portion which generates a match signal MSIG equivalent to the logical sum of the signals input from the latches PS0 to PSN to the priority encoder, also takes a relatively large area of the entire circuit.

Also, in the above-described device, since the physical length of the signal path leading from the signal generation circuits through the OR circuits 158 and 160 to the signal generation circuits is long, a signal takes a relatively long time to pass through that signal path ("delay" of FIG. 18), and that signal path is the critical path of the search device of FIG. 16. It is necessary, in the signal generation circuits of the search device of FIG. 16, that a signal propagate through the signal path returning from the signal generation circuits through the OR circuits 158 and 160 to the signal generation circuits, within a period equivalent to one cycle of a clock signal, and be input as a feedback signal ORFB to each signal generation circuit. Therefore, the operational speed (cycle of clock signal) of the entire circuit is determined according to the time required for generating the feedback signal ORFB, so there was the problem that the processing speed is low.

SUMMARY OF THE INVENTION

In view of the above facts, a first object of the present invention is to provide a search device for data compression which can be reduced in size.

Also, a second object of the present invention is to provide a search device for data compression in which data can be compressed at high speed.

To achieve the first object described above, there is provided according to the present invention a search circuit for data compression which comprises:

a plurality of memory means to store first unit data having a predetermined bit length;

a plurality of comparison means corresponding in number to said plurality of memory means for comparing said first unit data stored in said memory means and second unit data being input and for outputting a comparison signal representative of the comparison result;

control means for taking out said second unit data sequentially from primary data composed of a plurality of unit data and inputting said second unit data sequentially to each of said plurality of comparison means of said memory means and also for sequentially storing said second unit data input to each of said plurality of comparison means in said memory means in ascendant order of addresses respectively given to each set of each memory means and each comparison means;

comparison result control means for computing said comparison signal according to an equation for each cycle to generate first and second intermediate signals PS and PE corresponding to each comparison means and a signal MSIG and for outputting said signal MSIG as said comparison result, said comparison signal being output from each of said plurality of comparison means each time said second unit data is input to said comparison means and said equation being given by if a current cycle is expressed by m, the comparison signal output from the comparison means of an address n is expressed by ML(n,m), a logical sum is expressed by "+," a logical product is expressed by "×," the maximum value of the address n is expressed by N, the address −1 is expressed by N, match of the comparison result is expressed by "1," and non-match of the comparison result is expressed by "0,"

$PE(n,m)=ML(n,m)\times PS(n-1,m)$ $MSIG=PE(0,m)+PE(1,m)+\ldots+PE(N,m)$ when $MSIG=1,PS(n,m+1)=ML(n,m0\times PS(n-1,m)$ when $MSIG=0,PS(n,m+1)=ML(n,m)$, and if the match of the comparison result is expressed by "0" and the non-match of the comparison result is expressed by "1,"

$PE(n,m)=ML\ (n,m)+PS(n-1,m)$ $MSIG=PE(0,m)\times PE(1,m)\times\ldots\times PE(N,m)$ when $MSIG=0$, $PS(n,m+1)=ML(n,m)+PS(n-1,m)$ when $MSIG=1$, $PS(n,m+1)=ML(n,m)$.

Also, in the search device described above, the comparison result control means may comprise:

a plurality of first signal hold means corresponding in number to said plurality of comparison means for holding said comparison signal ML(n,m) that was output from the comparison means of the address n;

a plurality of first signal generation means to which said comparison signal ML(n,m) held in said first signal hold means of the address n, a first intermediate signal PS(n−1,m) of an address n−1, and said signal MSIG are input and which generate a first intermediate signal PS(n,m+1) and a second intermediate signal PE(n,m) of the address n, the plurality of first signal generation means corresponding in number to said plurality of comparison means; a plurality of second signal hold means corresponding in number to said plurality of comparison means for holding a first intermediate signal PS(n,m) that was output from the first signal generation means of the address n and for outputting said first intermediate signal PS(n,m) to the first signal generation means of an address n+1; and second signal generation means for generating and outputting said signal MSIG based on said second intermediate signal PE(n,m) that was input from each of said plurality of first signal generation means.

Also, to achieve the first object, there is provided according to the present invention a search circuit for data compression which comprises:

a plurality of memory means to store first unit data having a predetermined bit length;

a plurality of comparison means corresponding in number to said plurality of memory means for comparing said first unit data stored in said memory means and second unit data being input and for outputting a comparison signal representative of the comparison result;

control means for taking out said second unit data sequentially from primary data composed of a plurality of unit data and inputting said second unit data sequentially to each of said plurality of comparison means of said memory means and also for sequentially storing said second unit data input to each of said plurality of comparison means in said memory means in descendent order of addresses respectively given to each set of each memory means and each comparison means; and comparison result control means for computing said comparison signal according to an equation for each cycle to generate first and second intermediate signals PS and PE corresponding to each comparison means and a signal MSIG and for outputting said signal MSIG as said comparison result, said comparison signal being output from each of said plurality of comparison means each time said second unit data is input to said comparison means and said equation being given by if a current cycle is expressed by m, the comparison signal output from the comparison means of an address n is expressed by ML(n,m), a logical sum is expressed by "+," a logical product is expressed by "×," the maximum value of the address n is expressed by N, the address N+1 is expressed by 0, match of the comparison result is expressed by "1," and non-match of the comparison result is expressed by "0,"

$$PE(n,m)=ML(n,m) \times PS(n+1,m) \; MSIG=PE(0,m)+PE(1,m)+\ldots$$
$$+PE(N,m) \text{ when } MSIG=1, \; PS(n,m+1)=ML(n,m) \times PS(n+1,m)$$
$$\text{when } MSIG=0, \; PS(n,m+1)=ML(n,m), \text{ and}$$

if the match of the comparison result is expressed by "0" and the non-match of the comparison result is expressed by "1,"

$$PE(n,m)=ML(n,m)+PS(n+1,m) \; MSIG=PE(0,m) \times PE(1,m) \times \ldots$$
$$\times PE(N,m) \text{ when } MSIG=0, \; PS(n,m+1)=ML(n,m)+PS(n+1,m)$$
$$\text{when } MSIG=1, \; PS(n,m+1)=ML(n,m).$$

Also, in the search device described above, the comparison result control means may comprise:

a plurality of first signal hold means corresponding in number to said plurality of comparison means for holding said comparison signal ML(n,m) that was output from the comparison means of the address n;

a plurality of first signal generation means to which said comparison signal ML(n,m) held in said first signal hold means of the address n, a first intermediate signal PS(n+1,m) of an address n+1, and said signal MSIG are input and which generate a first intermediate signal PS(n,m+1) and a second intermediate signal PE(n,m) of the address n, the plurality of first signal generation means corresponding in number to said plurality of comparison means;

a plurality of second signal hold means corresponding in number to said plurality of comparison means for holding a first intermediate signal PS(n,m) that was output from the first signal generation means of the address n and for outputting said first intermediate signal PS(n,m) to the first signal generation means of an address n−1; and second signal generation means for generating and outputting said signal MSIG based on said second intermediate signal PE(n,m) that was input from each of said plurality of first signal generation means.

Also, to achieve the second object, there is provided according to the present invention a search circuit for data compression which comprises:

a plurality of memory means to store first unit data having a predetermined bit length;

a plurality of comparison means corresponding in number to said plurality of memory means for comparing said first unit data stored in said memory means and second unit data being input and for outputting a comparison signal representative of the comparison result;

control means for taking out said second unit data sequentially from primary data composed of a plurality of unit data and inputting said second unit data sequentially to each of said plurality of comparison means of said memory means and also for sequentially storing said second unit data input to each of said plurality of comparison means in said memory means in ascendant order of addresses respectively given to each set of each memory means and each comparison means; and comparison result control means for computing said comparison signal according to an equation for each cycle to generate third and fourth intermediate signals MX(n, m) and PX(n,m) corresponding to each comparison means, a feedback signal ORFB, and a signal MSIG and for outputting said signal MSIG as said comparison result, said comparison signal being output from each of said plurality of comparison means each time said second unit data is input to said comparison means and said equation being given by if a current cycle is expressed by m, the comparison signal output from the comparison means of an address n is expressed by ML(n,m), a logical sum is expressed by "+," a logical product is expressed by "×," the maximum value of the address n is expressed by N, the address −1 is expressed by N, match of the comparison result is expressed by "1," and non-match of the comparison result is expressed by "0,"

$$MX(n,m+1)=ML(n,m) \; ORFB=PX(0,m)+PX(1,m)+\ldots+PX(N,m)$$

when $ORFB=1$, $PX(n,m+1)=ML(n,m) \times PX(n-1,m)$ when $ORFB=0$, $PX(n,m+1)=ML(n,m) \times MX(n-1,m)$ $MSIG=PX(0,m)+PX(1,m)+\ldots+PX(N,m)$, and if the match of the comparison result is expressed by "0" and the non-match of the comparison result is expressed by "1,"

$$MX(n,m+1)=ML(n,m) \; ORFB=PX(0,m) \times PX(1,m) \times \ldots \times PX(N,m)$$

when $ORFB=1$, $PX(n,m+1)=ML(n,m)+PX(n-1,m)$ when $ORFB=0$, $PX(n,m+1)=ML(n,m)+MX(n-1,m)$ $MSIG=PX(0,m) \times PX(1,m) \times \ldots \times PX(N,m)$.

Also, in the search device described above, the comparison result control means may comprise:

a plurality of third signal hold means corresponding in number to said plurality of comparison means for holding said comparison signal ML(n,m) that was output from the comparison means of the address n;

a plurality of fourth signal hold means corresponding in number to said plurality of comparison means for holding as a third intermediate signal MX(n,m+1) said comparison signal ML(n,m) held once in said third signal hold means of the address n;

a plurality of third signal generation means to which said comparison signal ML(n,m) held in said third signal hold means of the address n, the third intermediate signal MX(n−1,m) held in the fourth signal hold means of an address n−1, a fourth intermediate signal PX(n−1,m) of the address n−1, and said feedback signal ORFB are input and which generate a fourth intermediate signal PX(n,m+1), the plurality of third signal generation means corresponding in number to said plurality of comparison means;

a plurality of fifth signal hold means corresponding in number to said plurality of comparison means for holding the fourth intermediate signal PX(n,m) that was output by the third signal generation means of the address n and for outputting said fourth intermediate signal PX(n,m) to the third signal generation means of an address n+1;

feedback signal generation means for generating said feedback signal ORFB based on said fourth intermediate signal PX(n,m) that was input from each of said plurality of third signal generation means and for outputting said feedback signal to each of said plurality of third signal generation means; and regulate means provided at the halfway of a signal path for regulating a time for a signal to pass through said signal path, the signal path including a first signal line for guiding said fourth intermediate signal PX(n,m) output by each of said plurality of third signal generation means, to said feedback signal generation means, and a second signal line for guiding said feedback signal ORFB output by said feedback signal generation means, to each of said plurality of third signal generation means.

Also, to achieve the second object, there is provided according to the present invention a search circuit for data compression which comprises:

a plurality of memory means to store first unit data having a predetermined bit length;

a plurality of comparison means corresponding in number to said plurality of memory means for comparing said first unit data stored in said memory means and second unit data being input and for outputting a comparison signal representative of the comparison result;

control means for taking out said second unit data sequentially from primary data composed of a plurality of unit data and inputting said second unit data sequentially to each of said plurality of comparison means of said memory means and also for sequentially storing said second unit data input to each of said plurality of comparison means in said memory means in descendent order of addresses respectively given to each set of each memory means and each comparison means; and comparison result control means for computing said comparison signal according to an equation for each cycle to generate third and fourth intermediate signals MX(n,m) and PX(n,m) corresponding to each comparison means, a feedback signal ORFB, and a signal MSIG and for outputting said signal MSIG as said comparison result, said comparison signal being output from each of said plurality of comparison means each time said second unit data is input to said comparison means and said equation being given by if a current cycle is expressed by m, the comparison signal output from the comparison means of an address n is expressed by ML(n,m), a logical sum is expressed by "+," a logical product is expressed by "×," the maximum value of the address n is expressed by N, the address N+1 is expressed by 0, match of the comparison result is expressed by "1," and non-match of the comparison result is expressed by "0,"

$$MX(n,m+1)=ML(n,m) \; ORFB=PX(0,m)+PX(1,m)+\ldots+PX(N,m)$$

when $ORFB=1$, $PX(n,m+1)=ML(n,m) \times PX(n+1,m)$ when $ORFB=0$, $PX(n,m+1)=ML(n,m) \times MX(n+1,m)$ $MSIG=PX(0,m)+PX(1,m)+\ldots+PX(N,m)$, and if the match of the comparison result is expressed by "0" and the non-match of the comparison result is expressed by "1,"

$$MX(n,m+1)=ML(n,m) \; ORFB=PX(0,m) \times PX(1,m) \times \ldots \times PX(N,m)$$

when $ORFB=1$, $PX(n,m+1)=ML(n,m)+PX(n+1,m)$ when $ORFB=0$, $PX(n,m+1)=ML(n,m)+MX(n+1,m)$ $MSIG=PX(0,m) \times PX(1,m) \times \ldots \times PX(N,m)$.

Also, in the search device described, the comparison result control means may comprise:

a plurality of third signal hold means corresponding in number to said plurality of comparison means for holding said comparison signal ML(n,m) that was output from the comparison means of the address n;

a plurality of fourth signal hold means corresponding in number to said plurality of comparison means for holding as a third intermediate signal MX(n,m+1) said comparison signal ML(n,m) held once in said third signal hold means of the address n;

a plurality of third signal generation means to which said comparison signal ML(n,m) held in said third signal hold means of the address n, the third intermediate signal MX(n+1,m) held in the fourth signal hold means of an address n+1, a fourth intermediate signal PX(n+1,m) of the address n+1, and said feedback signal ORFB are input and which generate a fourth intermediate signal PX(n,m+1), the plurality of third signal generation means corresponding in number to said plurality of comparison means;

a plurality of fifth signal hold means corresponding in number to said plurality of comparison means for holding the fourth intermediate signal PX(n,m) that was output by the third signal generation means of the address n and for outputting said fourth intermediate signal PX(n,m) to the third signal generation means of an address n−1;

feedback signal generation means for generating said feedback signal ORFB based on said fourth intermediate signal PX(n,m) that was input from each of said plurality of third signal generation means and for outputting said feedback signal to each of said plurality of third signal generation means; and regulate means provided at the halfway of a signal path for regulating a time for a signal to pass through said signal path, the signal path including a first signal line for guiding said fourth intermediate signal PX(n,m) output by each of said plurality of third signal generation means, to said feedback signal generation means, and a second signal line for guiding said feedback signal ORFB output by said feedback signal generation means, to each of said plurality of third signal generation means.

Also, to achieve the second object, there is provided according to the present invention a search circuit for data compression which comprises:

a plurality of memory means to store first unit data having a predetermined bit length;

a plurality of comparison means corresponding in number to said plurality of memory means for comparing said first unit data stored in said memory means and second unit data being input and for outputting a comparison signal representative of the comparison result;

control means for taking out said second unit data sequentially from primary data composed of a predetermined number of unit data and inputting said second unit data sequentially to each of said plurality of comparison means of said memory means and also for sequentially storing said second unit data input to each of said plurality of comparison means in said memory means in ascending order of addresses respectively given to each set of each memory means and each comparison means; and comparison result control means for computing said comparison signal according to an equation for each cycle to generate fifth, sixth, seventh and eighth intermediate signals MX(n,m), PX(n,m), ORMX(m) and ORPX(m) corresponding to each comparison means, a feedback signal ORFB, and a signal MSIG and for outputting said signal MSIG as said comparison result, said comparison signal being output from each of said plurality of comparison means each time said second unit data is input to said comparison means and said equation being given by if a current cycle is expressed by m, the comparison signal output from the comparison means of an address n is expressed by ML(n,m), a logical sum is expressed by "+," a logical product is expressed by "×," negation is expressed by "!," the maximum value of the address n is expressed by N, the value of address n−1 is expressed by 0 when the value of address n is N, match of the comparison result is expressed by "1," and non-match of the comparison result is expressed by "0,"

$MX(n,m+1)=ML(n,m)$ $ORMX(m)=(ML(0,m)\times MX(N,m))+(ML(1,m)\times MX(0,m))+\ldots +(ML(N,m)\times MX(N-1,m))$ $ORPX(m)=(ML(0,m)\times PX(N,m))+(ML(1,m)\times PX(0,m))+\ldots +(ML(N,m)\times PX(N-1,m))$ $ORFB=ORPX(m)+(ORMX(m)\times !ORPX(m-1))$ when $ORFB=1$, $PX(n,m+1)=ML(n,m)\times PX(n-1,m)$ when $ORFB=0$, $PX(n,m+1)=ML(n,m)\times MX(n-1,m)$ $MSIG=PX(0,m)+PX(1,m)+\ldots +PX(N,m)$, and if the match of the comparison result is expressed by "0" and the non-match of the comparison result is expressed by "1,"

$MX(n,m+1)=ML(n,m)$ $ORMX(m)=(ML(0,m)+MX(N,m))\times (ML(1,m)+MX(0,m))\times \ldots \times (ML(N,m)+MX(N-1,m))$ $ORPX(m)=(ML(0,m)+PX(N,m))\times (ML(1,m)+PX(0,m))\times \ldots \times (ML(N,m)+PX(N-1,m))$ $ORFB=ORPX(m)\times (ORMX(m)+!ORPX(m-1))$ when $ORFB=0$, $PX(n,m+1)=ML(n,m)+PX(n-1,m)$ when $ORFB=1$, $PX(n,m+1)=ML(n,m)+MX(n-1,m)$ $MSIG=PX(0,m)\times PX(1,m)\times \ldots \times PX(N,m)$.

Also, in the search device described, the comparison result control means may comprise:

a plurality of sixth signal hold means corresponding in number to said plurality of comparison means for holding said comparison signal ML(n,m) that was output from the comparison means of the address n;

a plurality of seventh signal hold means corresponding in number to said plurality of comparison means for holding as a fifth intermediate signal MX(n,m+1) said comparison signal ML(n,m) held once in said sixth signal hold means of the address n;

a plurality of fourth signal generation means to which said comparison signal ML(n,m) held in said sixth signal hold means of the address n, the fifth intermediate signal MX(n−1,m) held in the seventh signal hold means of an address n−1, a seventh intermediate signal PX(n−1,m) of the address n−1, and said feedback signal ORFB are input and which generate a sixth intermediate signal PX(n,m+1), the plurality of fourth signal generation means corresponding in number to said plurality of comparison means;

a plurality of eighth signal hold means corresponding in number to said plurality of comparison means for holding the sixth intermediate signal PX(n,m) that was output by the fourth signal generation means of the address n and for outputting said sixth intermediate signal PX(n,m) to the fourth signal generation means of an address n+1;

a plurality of fifth signal generation means to which said comparison signal ML(n,m) held in said sixth signal hold means of the address n and the fifth intermediate signal MX(n−1,m) held in the seventh signal hold means of an address n−1 are input and which generate a seventh intermediate signal ORMX(m), the plurality of fifth signal generation means corresponding in number to said plurality of comparison means;

a plurality of sixth signal generation means to which said comparison signal ML(n,m) held in said sixth signal hold means of the address n and said sixth intermediate signal PX(n−1,m) held in said eighth signal hold means of address n−1 are input and which generate an eighth intermediate signal ORPX(m);

feedback signal generation means for generating said feedback signal ORFB based on said seventh intermediate signal ORMX(m) output by said fifth signal generation means, said eighth intermediate signal ORPX(m) output by said sixth signal generation means and said eighth intermediate signal delayed by one cycle ORPX(m−1) and for outputting said feedback signal to each of said plurality of fourth signal generation means;

second regulation means provided at the halfway of a signal path for regulating a time for a signal to pass through said signal path, the signal path including a third signal line for guiding said comparison signal ML(n,m) output by said plurality of sixth signal hold means and said fifth intermediate signal MX(n−1,m) output by said plurality of seventh signal hold means to said fifth signal generation means, a fourth signal line for guiding said seventh intermediate signal ORMX(m) output by said fifth signal generation means, to said feedback signal generation means, and a fifth signal line for guiding said feedback signal ORFB output by said feedback signal generation means, to each of said plurality of fourth signal generation means; and third regulation means provided at the halfway of a signal path for regulating a time for a signal to pass through said signal path, the signal path including a sixth signal line for guiding said comparison signal ML(n,m) output by said plurality of sixth signal hold means and said sixth intermediate signal MX(n−1,m) output by said plurality of eighth signal hold means to said sixth signal generation means, a seventh signal line for guiding said eighth intermediate signal ORPX(m) output by said sixth signal generation means, to said feedback signal generation means, and a fifth signal line for guiding said feedback signal ORFB output by said feedback signal generation means, to each of said plurality of fourth signal generation means.

Also, to achieve the second object, there is provided according to the present invention a search circuit for data compression which comprises:

a plurality of memory means to store first unit data having a predetermined bit length;

a plurality of comparison means corresponding in number to said plurality of memory means for comparing said first unit data stored in said memory means and second unit data being input and for outputting a comparison signal representative of the comparison result;

control means for taking out said second unit data sequentially from primary data composed of a predetermined number of unit data and inputting said second unit data sequentially to each of said plurality of comparison means of said memory means and also for sequentially storing said second unit data input to each of said plurality of comparison means in said memory means in descendent order of addresses respectively given to each set of each memory means and each comparison means; and comparison result control means for computing said comparison signal according to an equation for each cycle to generate fifth, sixth, seventh and eighth intermediate signals MX(n,m), PX(n,m), ORMX(m) and ORPX(m) corresponding to each comparison means, a feedback signal ORFB, and a signal MSIG and for outputting said signal MSIG as said comparison result, said comparison signal being output from each of said plurality of comparison means each time said second unit data is input to said comparison means and said equation being given by if a current cycle is expressed by m, the comparison signal output from the comparison means of an address n is expressed by ML(n,m), a logical sum is expressed by "+," a logical product is expressed by "×," negation is expressed by "!," the maximum value of the address n is expressed by N, the value of the address n+1 is expressed by 0 when the value of the address n is N, match of the comparison result is expressed by "1," and non-match of the comparison result is expressed by "0,"

$MX(n,m+1)=ML(n,m)$ $ORMX(m)=(ML(0,m)\times MX(1,m))+(ML(1,m)\times MX(2,m))+\ldots+(ML(N,m)\times MX(0,m))$ $ORPX(m)=(ML(0,m)\times PX(1,m))+(ML(1,m)\times PX(2,m))+\ldots+(ML(N,m)\times PX(0,m))$ $ORFB=ORPX(m)+(ORMX(m)\times !ORPX(m-1))$ when $ORFB=1$, $PX(n,m+1)=ML(n,m)\times PX(n+1,m)$ when $ORFB=0$, $PX(n,m+1)=ML(n,m)\times MX(n+1,m)$ $MSIG=PX(0,m)+PX(1,m)+\ldots+PX(N,m)$, and if the match of the comparison result is expressed by "0" and the non-match of the comparison result is expressed by "1,"

$MX(n,m+1)=ML(n,m)$ $ORMX(m)=(ML(0,m)+MX(1,m))\times(ML(1,m)+MX(2,m))\times\ldots\times(ML(N,m)+MX(0,m))$ $ORPX(m)=(ML(0,m)+PX(1,m))\times(ML(1,m)+PX(2,m))\times\ldots\times(ML(N,m)+PX(0,m))$ $ORFB=ORPX(m)\times(ORMX(m)+!ORPX(m-1))$ when $ORFB=1$, $PX(n,m+1)=ML(n,m)+PX(n+1,m)$ when $ORFB=0$, $PX(n,m+1)=ML(n,m)+MX(n+1,m)$ $MSIG=PX(0,m)\times PX(1,m)\times\ldots\times PX(N,m)$.

Also, in the search device described, the comparison result control means may comprise:

a plurality of sixth signal hold means corresponding in number to said plurality of comparison means for holding said comparison signal ML(n,m) that was output from the comparison means of the address n;

a plurality of seventh signal hold means corresponding in number to said plurality of comparison means for holding as a fifth intermediate signal MX(n,m+1) said comparison signal ML(n,m) held once in said sixth signal hold means of the address n;

a plurality of fourth signal generation means to which said comparison signal ML(n,m) held in said sixth signal hold means of the address n, the fifth intermediate signal MX(n+1,m) held in the seventh signal hold means of an address n+1, a seventh intermediate signal PX(n+1,m) of the address n+1, and said feedback signal ORFB are input and which generate a sixth intermediate signal PX(n,m+1), the plurality of fourth signal generation means corresponding in number to said plurality of comparison means;

a plurality of eighth signal hold means corresponding in number to said plurality of comparison means for holding the sixth intermediate signal PX(n,m) that was output by the fourth signal generation means of the address n and for outputting said sixth intermediate signal PX(n,m) to the fourth signal generation means of an address n−1;

a plurality of fifth signal generation means to which said comparison signal ML(n,m) held in said sixth signal hold means of the address n and the fifth intermediate signal MX(n+1,m) held in the seventh signal hold means of an address n+1 are input and which generate a seventh intermediate signal ORMX(m), the plurality of fifth signal generation means corresponding in number to said plurality of comparison means;

a plurality of sixth signal generation means to which said comparison signal ML(n,m) held in said sixth signal hold means of the address n and said sixth intermediate signal PX(n+1,m) held by said eighth signal hold means of address n+1 are input and which generate an eighth intermediate signal ORMX(m);

feedback signal generation means for generating said feedback signal ORFB based on said seventh intermediate signal ORMX(m) output by said fifth signal generation means, said eighth intermediate signal ORPX(m) output by said sixth signal generation means and said eighth intermediate signal delayed by one cycle ORPX(m−1) and for outputting said feedback signal to each of said plurality of fourth signal generation means;

second regulation means provided at the halfway of a signal path for regulating a time for a signal to pass through said signal path, the signal path including a third signal line for guiding said comparison signal ML(n,m) output by said plurality of sixth signal hold means and said fifth intermediate signal MX(n+1,m) output by said plurality of seventh signal hold means to said fifth signal generation means, a fourth signal line for guiding said seventh intermediate signal ORMX(m) output by said fifth signal generation means, to said feedback signal generation means, and a fifth signal line for guiding said feedback signal ORFB output by said feedback signal generation means, to each of said plurality of fourth signal generation means; and third regulation means provided at the halfway of a signal path for regulating a time for a signal to pass through said signal path, the signal path including a sixth signal line for guiding said comparison signal ML(n,m) output by said plurality of sixth signal hold means and said sixth intermediate signal MX(n+1,m) output by said plurality of eighth signal hold means to said sixth signal generation means, a seventh signal line for guiding said eighth intermediate signal ORPX(m) output by said sixth signal generation means, to said feedback signal generation means, and a fifth signal line for guiding said feedback signal ORFB output by said feedback signal generation means, to each of said plurality of fourth signal generation means.

Also, in the present invention, a plurality of memory means and a plurality of comparison means may be formed with a content addressable memory.

In the search device disclosed in Published Unexamined Patent Application No. 5-233212, when comparison result with respect to input search data matches once (i.e., match of a single character), a match signal MSIG that is output from a priority encoder to the outside changes to a level corresponding to the "match." However, in compression algorithm LZ1 in which repeat data comprising a plurality of unit data is converted into another code, repeat data comprising single unit data, as in the case of the "non-match" of the comparison result, need not to be converted into code. From the facts, the inventor of this application has drawn the conclusion that in the stage where the comparison result with respect to single unit data becomes "match," there is no need of outputting "match" as a comparison result, and the present invention has been made based on this conclusion.

For this reason, in the present invention, when control means stores second unit data input to each of a plurality of comparison means in memory means in ascendant order of addresses respectively given to each set of each memory means and each comparison means, there is provided comparison result control means for computing a comparison signal according to an equation for each cycle to generate first and second intermediate signals PS and PE corresponding to each comparison means and a signal MSIG and for outputting said signal MSIG as a comparison result. The comparison signal is output from each of said plurality of comparison means each time said second unit data is input to said comparison means. If a current cycle is expressed by m, the comparison signal output from the comparison means of an address n is expressed by ML(n,m), a logical sum is expressed by "+," a logical product is expressed by "×," the maximum value of the address n is expressed by N, the address −1 is expressed by N, match of the comparison result is expressed by "1," and non-match of the comparison result is expressed by "0," the above-described equation is given by $$PE(n,m)=ML(n,m) \times PS(n-1,m) \quad MSIG=PE(0,m)+PE(1,m)+\ldots$$
$$+PE(N,m) \text{ when } MSIG=1, PS(n,m+1)=ML(n,m) \times PS(n-1,m)$$
$$\text{when } MSIG=0, PS(n,m+1)=ML(n,m) \qquad \text{Equation (3)}$$

If the equation (3) is compared with the equation (1) described above, the signal MSIG in the equation (3) will logically be equal to the feedback signal ORFB in equation (1). When the comparison result with respect to single unit data becomes "match," the signal MSIG in the equation (3) does not go to a 1. When, on the other hand, repeat data comprising a plurality of unit data is found, the signal MSIG in the equation (3) goes to a 1 (match). Therefore, the first intermediate signal PS whose value is determined by whether the signal MSIG is 1 or 0 in the equation (3), is also logically equal to the signal PS that is held in the latch PS in the equation (1).

On the other hand, in the present invention, in the stage where the comparison result with respect to single unit data becomes "match," there is no need of outputting "match" as a comparison result, as described above. Therefore, the signal MSIG used instead of the feedback signal in the conventional search device is also output as a comparison result. As a result, the present invention does not require the signal lines and OR circuits (for example, OR circuits 158 and 160 in FIG. 16) for generating the feedback signal ORFB, as compared with the conventional search device. Therefore, the present invention can reduce the scale of the circuit, as compared with the conventional search device, and the search device for data compression according to the present invention can be reduced in size.

While the match of the comparison result has been expressed by "1" and the non-match of the comparison result by "0," the match may be expressed by "0" and the non-match by "1." In such case, the comparison result control means computes the comparison signal according to the following equation for each cycle to generate first and second intermediate signals PS and PE corresponding to each comparison means and a signal MSIG, and then outputs said signal MSIG as a comparison result. The above-described equation is given by $$PE(n,m)=ML(n,m)+PS(n-1,m) \quad MSIG=PE(0,m) \times PE(1,m) \times \ldots$$
$$\times PE(N,m) \text{ when } MSIG=0, PS(n,m+1)=ML(n,m)+PS(n-1,m)$$
$$\text{when } MSIG=1, PS(n,m+1)=ML(n,m) \qquad \text{Equation (4)}$$

The equation (4) and the equation (3) are logically equivalent to each other. Therefore, even if the comparison result control means were so constituted as to perform the calculation of the equation (4), there could be obtained the same advantage as the equation (3).

Also, the comparison result control means described above may comprise:

a plurality of first signal hold means corresponding in number to said plurality of comparison means for holding said comparison signal ML.(n,m) that was output from the comparison means of the address n;

a plurality of first signal generation means to which said comparison signal ML(n,m) held in said first signal hold means of the address n, a first intermediate signal PS(n−1,m) of an address n−1, and said signal MSIG are input and which generate a first intermediate signal PS(n,m+1) and a second intermediate signal PE(n,m) of the address n, the plurality of first signal generation means corresponding in number to said plurality of comparison means;

a plurality of second signal hold means corresponding in number to said plurality of comparison means for holding a first intermediate signal PS(n,m) that was output from the first signal generation means of the address n and for outputting said first intermediate signal PS(n,m) to the first signal generation means of an address n+1; and second signal generation means for generating and outputting said signal MSIG based on said second intermediate signal PE(n,m) that was input from each of said plurality of first signal generation means.

In the above constitution, the first signal hold means and the second signal hold means can be formed, for example, with latches. The first signal generation means can be realized by a very simple circuit similar to the signal generation circuit of the conventional search device shown in FIG. 16. Also, the second signal generation means can be formed with an OR circuit or AND circuit. Therefore, because of the application of the present invention, there is no possibility that the circuit is structurally complicated and the scale of the circuit is increased. As will be understood from the above constitution, the present invention can omit the signal lines and OR circuits for generating the feedback signal ORFB, as compared with the conventional search device. As a result, it is apparent that the device can be reduced in size.

Further, when control means stores second unit data input to each of a plurality of comparison means in memory means in ascendant order of addresses respectively given to each set of each memory means and each comparison means, the comparison result control means computes the comparison signal according to an equation which is given by if a current cycle is expressed by m, the comparison signal output from the comparison means of an address n is expressed by ML(n,m), a logical sum is expressed by "+," a logical product is expressed by "×" the maximum value of the address n is expressed by N, the address N+1 is expressed by 0, match of the comparison result is expressed by "1," and non-match of the comparison result is expressed by "0,"

$PE(n,m)=ML(n,m)\times PS(n+1,m)$ $MSIG=PE(0,m)+PE(1,m)+\ldots +PE(N,m)$ when $MSIG=1$, $PS(n,m+1)=ML(n,m)\times PS(n+1,m)$
when $MSIG=0$, $PS(n,m+1)=ML(n,m)$  Equation (5)

and, if the match of the comparison result is expressed by "0" and the non-match of the comparison result is expressed by "1,"

$PE(n,m)=ML(n,m)+PS(n+1,m)$ $MSIG=PE(0,m)\times PE(1,m)\times \ldots \times PE(N,m)$ when $MSIG=0$, $PS(n,m+1)=ML(n,m)+PS(n+1,m)$
when $MSIG=1$, $PS(n,m+1)=ML(n,m)$  Equation (6)

The equation (5) and the equation (6) are logically equivalent to the equation (3) and the equation (4), respectively. Therefore, even if the comparison result control means were so constituted as to perform the calculation of the equation (5) or (6), there could be obtained the same advantage as the equation (3) or (4).

The comparison result control means which performs the calculation of the equation (5) or (6) can be realized by a plurality of first signal generation means to which said comparison signal ML(n,m) held in said first signal hold means of the address n, a first intermediate signal PS(n+1,m) of an address n+1, and said signal MSIG are input and which generate a first intermediate signal PS(n,m+1) and a second intermediate signal PE(n,m) of the address n, and a plurality of second signal hold means for holding a first intermediate signal PS(n,m) that was output from the first signal generation means of the address n and for outputting said first intermediate signal PS(n,m) to the first signal generation means of an address n−1.

Incidentally, when in a digital circuit, among a plurality of signal paths through which a signal passes for one cycle of a clock signal, a predetermined signal path is a critical path, a circuit can be operated at high speed if the predetermined signal path is divided into several stages and a signal passes one stage within one cycle of a clock signal and the cycle of the clock signal is made shorter (frequency is made higher). However, since the conventional search device is on the assumption that within a period equivalent to one cycle of a clock signal, a signal passes through a signal path for generating and outputting a feedback signal ORFB being a critical path, the cycle of the clock signal cannot be made shorter.

For this reason, in the present invention, when control means stores second unit data input to each of a plurality of comparison means in memory means in ascendant order of addresses respectively given to each set of each memory means and each comparison means, there is provided comparison result control means for computing a comparison signal according to an equation for each cycle to generate third and fourth intermediate signals MX(n,m) and PX(n,m) corresponding to each comparison means, a feedback signal ORFB, and a signal MSIG and for outputting said signal MSIG as said comparison result. The comparison signal is output from each of said plurality of comparison means each time said second unit data is input to said comparison means. If a current cycle is expressed by m, the comparison signal output from the comparison means of an address n is expressed by ML(n,m), a logical sum is expressed by "+," a logical product is expressed by "×," the maximum value of the address n is expressed by N, the address −1 is expressed by N, match of the comparison result is expressed by "1," and non-match of the comparison result is expressed by "0," the above-described equation is given by $MX(n,m+1)=ML(n,m)$ $ORFB=PX(0,m)+PX(1,m)+\ldots +PX(N,m)$ when $ORFB=1$, $PX(n,m+1)=ML(n,m)\times PX(n-1,m)$ when $ORFB=0$, $PX(n,m+1)=ML(n,m)\times MX(n-1,m)$ $MSIG=PX(0,m)+PX(1,m)+\ldots +PX(N,m)$  Equation (7)

The comparison result control means described above also uses that in the stage where the comparison result with respect to single unit data becomes "match," there is no need of outputting "match" as a comparison result. As will be understood from the equation (7), the signal MSIG goes to a 1 (match) only when repeat data comprising two or more unit data is found. Also, the feedback signal ORFB is logically equal to the feedback signal ORFB (equation (1)) in the conventional search device.

Incidentally, in a case where the propagation of the feedback signal ORFB is delayed by one cycle of a clock signal, even if repeat data comprising two unit data is found at a predetermined cycle, in this cycle the feedback signal ORFB would not go to a 1 and in the next cycle the feedback signal ORFB would go to a 1. Also, even if the end of repeat data comprising two or more unit data is detected at a predetermined cycle, in this cycle the feedback signal ORFB would not go to a 0 and in the next cycle the feedback signal ORFB would go to a 0.

On the other hand, in the equation (7), if repeat data comprising two unit data is found (i.e., ML(n,m)×MX(n−1, m)=1), this will be reflected on the fourth intermediate signal PX(n,m) even if the feedback signal ORFB were a 0. Also, when the end of repeat data comprising two or more unit data is detected (i.e., ML(n,m)×PX(n−1,m)=0), the comparison signal ML(n,m) at that time is held as the third intermediate signal MX(n,m+1), and in the next cycle the logical product with the comparison signal ML(n,m) of the address n+1 can be calculated.

In order to realize the above-described processing, there is the need of newly providing signal hold means for holding at least the third intermediate signal MX, so the scale of the circuit is increased. However, since the propagation of the feedback signal ORFB can be delayed by one cycle of a clock signal, the cycle of the clock signal can be reduced to half (frequency is doubled). Therefore, the operational speed of the device can be doubled, and data compression can be performed at high speed.

While the match of the comparison result has been expressed by "1" and the non-match of the comparison result by "0," the match may be expressed by "0" and the non-match by "1." In such case, the comparison result control means computes the comparison signal according to the following equation for each cycle to generate first and second intermediate signals PS and PE corresponding to each comparison means, and a signal MSIG and for outputting said signal MSIG as said comparison result. The above-described equation is given by $$MX(n,m+1)=ML(n,m) \; ORFB=PX(0,m) \times PX(1,m) \times \ldots \times PX(N,m)$$

when $ORFB=1$, $PX(n,m+1)=ML(n,m)+PX(n-1,m)$ when $ORFB=0$, $PX(n,m+1)=ML(n,m)+MX(n-1,m)$ $MSIG=PX(0,m) \times PX(1,m) \times \ldots \times PX(N,m)$     Equation (8)

The equation (8) is logically equivalent to the equation (7). Therefore, even if the comparison result control means were so constituted as to perform the calculation of the equation (8), there could be obtained the same advantage as the equation (7).

Note that the above-described comparison result control means may comprise: a plurality of third signal hold means corresponding in number to said plurality of comparison means for holding said comparison signal ML(n,m) that was output from the comparison means of the address n; a plurality of fourth signal hold means corresponding in number to said plurality of comparison means for holding as a third intermediate signal MX(n,m+1) said comparison signal ML(n,m) held once in said third signal hold means of the address n; a plurality of third signal generation means to which said comparison signal ML(n,m) held in said third signal hold means of the address n, the third intermediate signal MX(n−1,m) held in the fourth signal hold means of an address n−1, a fourth intermediate signal PX(n−1,m) of the address n−1, and said feedback signal ORFB are input and which generate a fourth intermediate signal PX(n,m+1), the plurality of third signal generation means corresponding in number to said plurality of comparison means; a plurality of fifth signal hold means corresponding in number to said plurality of comparison means for holding the fourth intermediate signal PX(n,m) that was output by the third signal generation means of the address n and for outputting said fourth intermediate signal PX(n,m) to the third signal generation means of an address n+1; feedback signal generation means for generating said feedback signal OREB based on said fourth intermediate signal PX(n,m) that was input from each of said plurality of third signal generation means and for outputting said feedback signal to each of said plurality of third signal generation means; and regulate means provided at the halfway of a signal path for regulating a time for a signal to pass through said signal path, the signal path including a first signal line for guiding said fourth intermediate signal PX(n,m) output by each of said plurality of third signal generation means, to said feedback signal generation means, and a second signal line for guiding said feedback signal ORFB output by said feedback signal generation means, to each of said plurality of third signal generation means.

The regulate means regulates the timing at which the feedback signal ORFB is input to a plurality of third signal generation means, by regulating the time for a signal to pass through the signal path, and may comprise signal delay means such as a latch.

Further, when control means stores second unit data input to each of a plurality of comparison means in memory means in ascendant order of addresses respectively given to each set of each memory means and each comparison means, the comparison result control means computes the comparison signal according to an equation which is given by if a current cycle is expressed by m, the comparison signal output from the comparison means of an address n is expressed by ML(n,m), a logical sum is expressed by "+," a logical product is expressed by "×," the maximum value of the address n is expressed by N, the address N+1 is expressed by 0, match of the comparison result is expressed by "1," and non-match of the comparison result is expressed by "0,"

$$MX(n,m+1)=ML(n,m) \; ORFB=PX(0,m)+PX(1,m)+ \ldots +PX(N,m)$$

when $ORFB=1$, $PX(n,m+1)=ML(n,m) \times PX(n+1,m)$ when $ORFB=0$, $PX(n,m+1)=ML(n,m) \times MX(n+1,m)$ $MSIG=PX(0,m)+PX(1,m)+ \ldots +PX(N,m)$     Equation (9)

and, if the match of the comparison result is expressed by "0" and the non-match of the comparison result is expressed by "1,"

$$MX(n,m+1)=ML(n,m) \; ORFB=PX(0,m) \times PX(1,m) \times \ldots \times PX(N,m)$$

when $ORFB=1$, $PX(n,m+1)=ML(n,m)+PX(n+1,m)$ when $ORFB=0$, $PX(n,m+1)=ML(n,m)+MX(n+1,m)$ $MSIG=PX(0,m) \times PX(1,m) \times \ldots \times PX(N,m)$     Equation (10)

The equation (9) and the equation (10) are equivalent to the equation (7) and the equation (8), respectively. Therefore, even if the comparison result control means were so constituted as to perform the calculation of the equation (9) or (10), there could be obtained the same advantage as the equation (7) or (8).

The comparison result control means which performs the calculation of the equation (9) or (10) can be realized by a plurality of third signal generation means to which said comparison signal ML(n,m) held in said third signal hold means of the address n, the third intermediate signal MX(n+1,m) held in the fourth signal hold means of an address n+1, a fourth intermediate signal PX(n+1,m) of the address n+1, and said feedback signal ORFB are input and which generate a fourth intermediate signal PX(n,m+1), and a plurality of fifth signal hold means for holding the fourth intermediate signal PX(n,m) that was output by the third signal generation means of the address n and for outputting said fourth intermediate signal PX(n,m) to the third signal generation means of an address n−1.

Also in the present invention, when control means stores unit data input to each of a plurality of comparison means in memory means in ascending order of addresses respectively given to each pair of memory means and comparison means, there is provided comparison result control means for computing a comparison signal according to an equation for each cycle to generate fifth and sixth intermediate signals MX(n, m) and PX(n,m) corresponding to each comparison means, seventh and eighth intermediate signals ORMX(m) and ORPX(m), a feedback signal ORFB and a signal MSIG and for outputting said signal MSIG as a comparison result. The comparison signal is output from each of said plurality of comparison means each time said second unit data is input to said comparison means. If a current cycle is expressed by m, the comparison signal output from the comparison means of an address n is expressed by ML(n,m), a logical sum is expressed by "+," a logical product is expressed by "×," negation is expressed by "!," the maximum value of the address n is expressed by N, the value of address n−1 is expressed by N when the value of address n is 0, match of the comparison result is expressed by "1," and non-match of the comparison result is expressed by "0," the above-described equation is given by $$MX(n,m+1)=ML(n,m)\ ORMX(m)=(ML(0,m)\times MX(N,m))+(ML(1,m)\times MX(0,m))+\ldots +(ML(N,m)\times MX(N-1,m))\ ORPX(m)=(ML(0,m)\times PX(N,m))+(ML(1,m)\times PX(0,m))+\ldots +(ML(N,m)\times PX(N-1,m))$$

$$ORFB=ORPX(m)+(ORMX(m)\times !ORPX(m-1))\ \text{when}\ ORFB=1,$$
$$PX(n,m+1)=ML(n,m)\times PX(n-1,m)\ \text{when}\ ORFB=0,\ PX(n,m+1)=ML(n,m)\times MX(n-1,m)\ MSIG=PX(0,m)+PX(1,m)+\ldots +PX(N,m).\qquad\text{Equation (11)}$$

The comparison result control means described above also uses that in the stage where the comparison result with respect to single unit data becomes "match," there is no need of outputting "match" as a comparison result as in the equation (7), and if repeat data comprising two unit data is found (i.e., ML(n,m)×MX(n−1,m)=1), this will be reflected on the fourth intermediate signal PX(n,m) even if the feedback signal ORFB were a 0. Also, when the end of repeat data comprising two or more unit data is detected (i.e., ML(n,m)×PX(n−1,m)=0), the comparison signal ML(n,m) at that time is held as the third intermediate signal MX(n,m+1), and in the next cycle the logical product with the comparison signal ML(n,m) of the address n+1 can be calculated.

In order to realize the above-described processing, there are provided two sets of feedback paths ORMX(m) and ORPX(m) in addition to the newly providing signal hold means for holding at least the third intermediate signal MX, so the scale of the circuit is increased in comparison to the method of (3). However, since the propagation of the feedback signal ORFB can be delayed by one cycle of a clock signal as in the method of (7), the cycle of the clock signal can be reduced to half (frequency is doubled). Therefore, the operational speed of the device can be doubled, and data compression can be performed at high speed.

While the match of the comparison result has been expressed by "1" and the non-match of the comparison result by "0," the match may be expressed by "0" and the non-match by "1." In such case, the comparison result control means computes the comparison signal according to the following equation for each cycle to generate first and second intermediate signals PS and PE corresponding to each comparison means, and a signal MSIG and for outputting said signal MSIG as said comparison result. The above-described equation is given by $$MX(n,m+1)=ML(n,m)\ ORMX(m)=(ML(0,m)+MX(N,m))\times (ML(1,m)+MX(0,m))\times \ldots \times (ML(N,m)+MX(N-1,m))\ ORPX(m)=(ML(0,m)+PX(N,m))\times (ML(1,m)+PX(0,m))\times \ldots \times (ML(N,m)+PX(N-1,m))$$

$$ORFB=ORPX(m)\times (ORMX(m)+!ORPX(m-1))\ \text{when}\ ORFB=0,$$
$$PX(n,m+1)=ML(n,m)+PX(n-1,m)\ \text{when}\ ORFB=1,\ PX(n,m+1)=ML(n,m)+MX(n-1,m)\ MSIG=PX(0,m)\times PX(1,m)\times \ldots \times PX(N,m).\qquad\text{Equation (12)}$$

The equation (12) is logically equivalent to the equation (11). Therefore, even if the comparison result control means were so constituted as to perform the calculation of the equation (12), there could be obtained the same advantage as the equation (11).

Note that the above-described comparison result control means may comprise:

a plurality of sixth signal hold means corresponding in number to said plurality of comparison means for holding said comparison signal ML(n,m) that was output from the comparison means of the address n;

a plurality of seventh signal hold means corresponding in number to said plurality of comparison means for holding as a fifth intermediate signal MX(n,m+1) said comparison signal ML(n,m) held once in said sixth signal hold means of the address n;

a plurality of fourth signal generation means to which said comparison signal ML(n,m) held in said sixth signal hold means of the address n, the fifth intermediate signal MX(n−1,m) held in the seventh signal hold means of an address n−1, a seventh intermediate signal PX(n−1,m) of the address n−1, and said feedback signal ORFB are input and which generate a sixth intermediate signal PX(n,m+1), the plurality of fourth signal generation means corresponding in number to said plurality of comparison means;

a plurality of eighth signal hold means corresponding in number to said plurality of comparison means for holding the sixth intermediate signal PX(n,m) that was output by the fourth signal generation means of the address n and for outputting said sixth intermediate signal PX(n,m) to the fourth signal generation means of an address n+1;

a plurality of fifth signal generation means to which said comparison signal ML(n,m) held in said sixth signal hold means of the address n and the fifth intermediate signal MX(n−1,m) held in the seventh signal hold means of an address n−1 are input and which generate a seventh intermediate signal ORMX(m), the plurality of fifth signal generation means corresponding in number to said plurality of comparison means;

a plurality of sixth signal generation means to which said comparison signal ML(n,m) held in said sixth signal hold means of the address n and said sixth intermediate signal PX(n−1,m) held in said eighth signal hold means of address n−1 are input and which generate an eighth intermediate signal ORMX(m);

feedback signal generation means for generating said feedback signal ORFB based on said seventh intermediate signal ORMX(m) output by said fifth signal generation means, said eighth intermediate signal ORPX(m) output by said sixth signal generation means and said eighth intermediate signal delayed by one cycle ORPX(m−1) and for outputting said feedback signal to each of said plurality of fourth signal generation means;

second regulation means provided at the halfway of a signal path for regulating a time for a signal to pass through said signal path, the signal path including a third signal line for guiding said comparison signal ML(n,m) output by said plurality of sixth signal hold means and said fifth intermediate signal MX(n−1,m) output by said plurality of seventh signal hold means to said fifth signal generation means, a fourth signal line for guiding said seventh intermediate signal ORMX(m) output by said fifth signal generation means, to said feedback signal generation means, and a fifth signal line for guiding said feedback signal ORFB output by said feedback signal generation means, to each of said plurality of fourth signal generation means; and third regulation means provided at the halfway of a signal path for regulating a time for a signal to pass through said signal path, the signal path including a sixth signal line for guiding said comparison signal ML(n,m) output by said plurality of sixth signal hold means and said sixth intermediate signal MX(n−1,m) output by said plurality of eighth signal hold means to said sixth signal generation means, a seventh signal line for guiding said eighth intermediate signal ORPX(m) output by said sixth signal generation means, to said feedback signal generation means, and a fifth signal line for guiding said feedback signal ORFB output by said feedback signal generation means, to each of said plurality of fourth signal generation means.

Further, when control means stores unit data input to each of a plurality of comparison means in memory means in descending order of addresses respectively given to each pair of memory means and comparison means, the comparison result control means computes the comparison signal according to an equation which is given by if the maximum value of the address n is expressed by N, the value of the address n+1 is expressed by 0 when the value of address n is N, match of the comparison result is expressed by "1," and non-match of the comparison result is expressed by "0,"

$$MX(n,m+1)=ML(n,m) \ ORMX(m)=(ML(0,m)\times MX(1,m))+(ML(1,m)\times MX(2,m))+\ldots+(ML(N,m)\times MX(0,m)) \ ORPX(m)=(ML(0,m)\times PX(1,m))+(ML(1,m)\times PX(2,m))+\ldots+(ML(N,m)\times PX(0,m)) \ ORFB=ORPX(m)+(ORMX(m)\times !ORPX(m-1))$$

when $ORFB=1$, $PX(n,m+1)=ML(n,m)\times PX(n+1,m)$ when $ORFB=0$, $PX(n,m+1)=ML(n,m)\times MX(n+1,m) \ MSIG=PX(0,m)+PX(1,m)+\ldots+PX(N,m)$  Equation (13)

if the match of the comparison result is expressed by "0" and the non-match of the comparison result is expressed by "1,"

$$MX(n,m+1)=ML(n,m) \ ORMX(m)=(ML(0,m)+MX(1,m))\times(ML(1,m)+MX(2,m))\times\ldots\times(ML(N,m)+MX(0,m)) \ ORPX(m)=(ML(0,m)+PX(1,m))\times(ML(1,m)+PX(2,m))\times\ldots\times(ML(N,m)+PX(0,m))$$

$ORFB=ORPX(m)\times(ORMX(m)+!ORPX(m-1))$ when $ORFB=0$, $PX(n,m+1)=ML(n,m)+PX(n+1,m)$ when $ORFB=1$, $PX(n,m+1)=ML(n,m)+MX(n+1,m) \ MSIG=PX(0,m)\times PX(1,m)\times\ldots\times PX(N,m)$.  Equation (14)

The equation (13) and the equation (14) are equivalent to the equation (11) and the equation (12), respectively. Therefore, even if the comparison result control means were so constituted as to perform the calculation of the equation (13) or (14), there could be obtained the same advantage as the equation (11) or (12).

The comparison result control means which performs the calculation of the equation (13) or (14) can be realized by a plurality of fourth signal generation means to which said comparison signal ML(n,m) held in said sixth signal hold means of the address n, the fifth intermediate signal MX(n+1,m) held in the seventh signal hold means of an address n+1, a seventh intermediate signal PX(n+1,m) of the address n+1, and said feedback signal ORFB are input and which generate a sixth intermediate signal PX(n,m+1), a plurality of eighth signal hold means which hold the sixth intermediate signal PX(n,m) output by the fourth signal generation means of the address n and output said sixth intermediate signal PX(n,m) to the fourth signal generation means of an address n−1, a fifth signal generation means to which said comparison signal ML(n,m) held by the sixth signal hold means of the address n and the fifth intermediate signal MX(n+1,m) held by the seventh signal hold means of address n+1 are input and which generates a seventh intermediate signal ORMX(m), a sixth signal generation means to which said comparison signal ML(n,m) held by the sixth signal hold means of the address n and said sixth intermediate signal PX(n+1,m) held by the eighth signal hold means of the address n+1 are input and which generate an eighth intermediate signal ORPX(m) and a feedback signal ORFB generated on the basis of said seventh and eighth intermediate signals ORMX(m) and ORPX(m) and the eighth intermediate signal delayed by one cycle ORPX(m−1).

Also, in the equations (3), (4), (7), (8), (11), and (12), the address n−1 is expressed by N, and the first intermediate signal PS(n−1,m), third intermediate signal MX(n−1,m) and fourth intermediate signal PX(n−1,m) as the address n is 0 are expressed by PS(N,m), third intermediate signal MX(N,m) and fourth intermediate signal PX(N,m). Therefore, when the size of original data is greater than the memory capacity of a plurality of memory means, unit data are stored in all of a plurality of memory means and then unit data is stored in memory means in which the address n is 0. As a result, a plurality of memory means can be used as a so-called ring buffer.

Also, in the equations (5), (6), (9), (10), (13), and (14), the address N+1 is expressed by a 0, and the first intermediate signal PS(n+1,m), third intermediate signal MX(n+1,m) and fourth intermediate signal PX(n+1,m) as the address n is N are expressed by PS(0,m), third intermediate signal MX(0,m) and fourth intermediate signal PX(0,m). Therefore, when the size of original data is greater than the memory capacity of a plurality of memory means, unit data are stored in all of a plurality of memory means and then unit data are stored in memory means in which the address n is N. As a result, a plurality of memory means can be used as a so-called ring buffer.

On the other hand, when it has been found that the memory capacity of a plurality of memory means is sufficiently large as compared with the size of original data, in the equations (3), (4), (7), (8), (11), and (12) the first intermediate signal PS(n−1,m), third intermediate signal MX(n−1,m) and fourth intermediate signal PX(n−1,m) corresponding to the address n=0 may be a certain value corresponding to "non-match." Also, in the equations (5), (6), (9), (10), (13), and (14) the first intermediate signal PS(n+1,m), third intermediate signal MX(n+1,m) and fourth intermediate signal PX(n+1,m) corresponding to the address n=N may be a certain value corresponding to "non-match."

Also, while the match of the comparison result has been expressed by 1 and the non-match by 0 or the match has been expressed by 0 and the non-match by 1, and the present invention has been defined by the equations (3) to (14), the present invention is not limited to the embodiments in which the level of a signal is changed according to the "match" and "non-match." For example, each signal may comprise 2-bit data, and the "match" may be expressed by $(10)_2$ and the "non-match" by $(01)_2$ ($()_2$ indicates that the numeral within () is a binary number). However, it is preferable that the level of a signal be changed according to the "match" and "non-match," because the device becomes complicated.

BRIEF DESCRIPTION OF THE DRAWINGS

FIGS. 21(A) to 21(E) are diagrams used to explain the operation of the comparison result control circuit of the third embodiment.

DESCRIPTION OF THE PREFERRED EMBODIMENTS

Preferred embodiments of the present invention will hereinafter be described in detail with reference to the accompanying drawings.

First Embodiment

Figure 1:
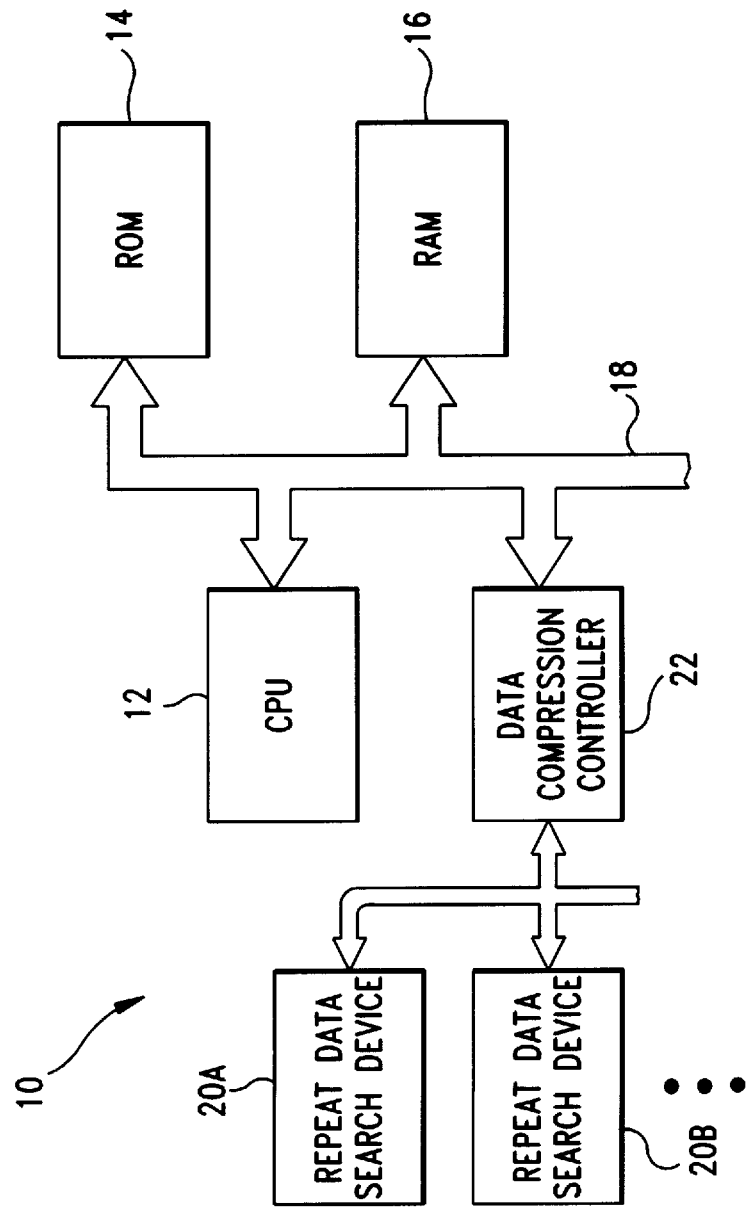
FIG. 1 is a block diagram showing a microcomputer according to a first embodiment of the present invention.

FIG. 1 shows part of a microcomputer 10 to which a first embodiment of the present invention may be applied. The microcomputer 10 includes a central processing unit (CPU) 12, a read-only memory (ROM) 14, and a random access memory (RAM) 16, and these are interconnected through a bus 18 comprising an address bus, a data bus, and a control bus.

Also, the microcomputer 10 includes a plurality of repeat data search devices 20A, 20B, . . which are used as search devices for data compression of the present invention. These devices are connected to the bus 18 through a data compression controller 22 for controlling the operation of the repeat data search device. The repeat data search devices 20A, 20B, . . . are the same constitutions and, in this embodiment, comprises P+1 repeat data search devices. The P+1 repeat data search devices will hereinafter be referred to as a "repeat data search device 20," and the individual repeat data search devices will be represented by blocks O to P.

Figure 2:
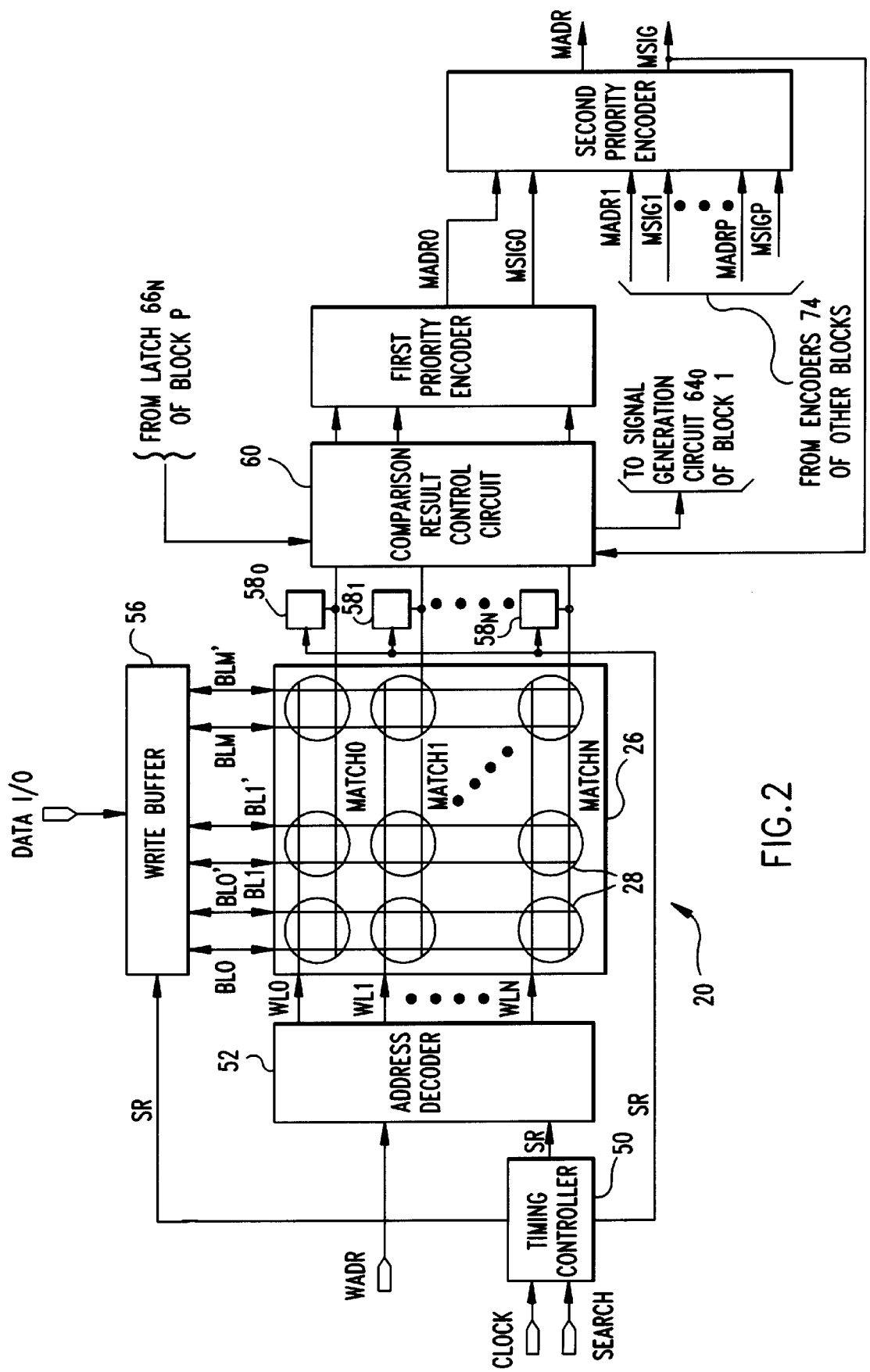
FIG. 2 is a block diagram showing a repeat data search device of the first embodiment.

As shown in FIG. 2, the repeat data search device 20 includes a (content addressable memory) CAM cell array 26 in which a plurality of CAMs 28 indicated by "o" shown in FIG. 2 are arranged in the form of a matrix. In the CAM cell array 26 there are disposed N+1 word lines WL0 to WLN, N+1 match lines MATCH0 to MATCHN, and M+1 sets of bit line pairs BL0, BL0' to BLM, BLM' in the form of a matrix. Each CAM cell 28 is connected to any of the word lines WL0 to WLN, any of the match lines MATCH0 to MATCHN, and any of the bit line pairs BL0, BL0' to BLM, BLM'.

Figure 3:
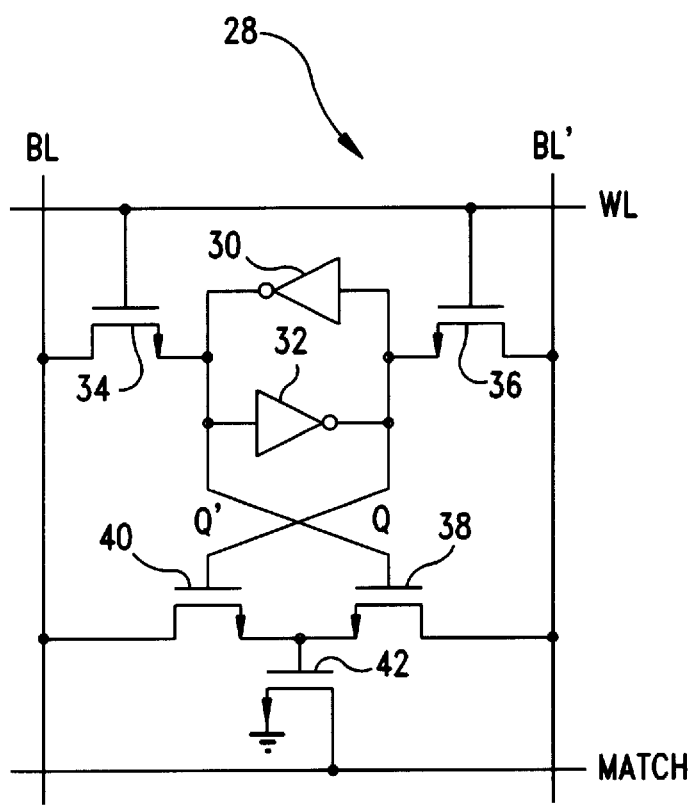
FIG. 3 is a circuit diagram showing the structure of the CAM cell of FIG. 2.

The plurality of CAM cells 28 are the same in constitution. As shown in FIG. 3, the CAM cell 28 is provided with two NOT circuits 30 and 32 in which the input terminal of one circuit and the output terminal of the other circuit are connected. A loop of these NOT circuits 30 and 32 constitutes a memory circuit (static random access memory (SRAM) type) for storing one bit of data. The output terminal of the NOT circuit 30 is connected to the source of an N-MOSFET 34, the output terminal of the NOT circuit 32 is likewise connected to the source of an N-MOSFET 36, and the gates of the N-MOSFETs 34 and 36 are connected to the word line WL.

Also, the drains of N-MOSFETs 34 and 36 are connected to the bit lines BL and BL', respectively. When one bit of data is written to the CAM cell 28, the word line WL is made a high level, the bit line BL is made a level corresponding to data D to be written (when D is a 1, the bit line BL is made a high level, and when D is a 0, the bit line BL is made a low level), and the bit line BL' is made the inverted level of the bit line BL (when the bit line BL is a high level, the bit line BL' made a low level, and when the bit line BL is a low level, the bit line BL' made a high level). As a result, the N-MOSFETs 34 and 36 are switched on, and the data supplied through the bit lines BL and BL' is held in the loop of the NOT circuits 30 and 32.

Also, the output terminal of the NOT circuit 30 is connected to the gate of an N-MOSFET 38, and the output terminal of the NOT circuit 32 is connected to the gate of an N-MOSFET 40. Note that the inverted data (Q') of the data D is outputted from the NOT circuit 32 and the inverted data Q (=D) of the data Q' is outputted from the NOT circuit 30. The drains of the N-MOSFETs 38 and 40 are connected to the bit lines BL' and BL, respectively, and the sources are connected to the gate of an N-MOSFET 42. The drain of the N-MOSFET 42 is connected to the match line MATCH, and the source is connected to ground.

Note that in this embodiment, M+1 CAM cells 28 are connected to the same word line and match line as an example, and (M+1)-bit data can be stored in a plurality of CAM cells 28 connected to the same word line and match line. The plurality of CAM cells 28 will hereinafter be referred to as CAM cell row. Also, in the CAM cell array 26 an address is given to each CAM cell row. Also, the loop of the NOT circuits 30 and 32 of each CAM cell 28 constituting a single CAM cell row corresponds to the storage means of the present invention. The N-MOSFETs 38, 40, and 42 of each CAM cell correspond to the comparison means of the present invention.

On the other hand, as shown in FIG. 2, the repeat data search device 20 is provided with a timing controller 50. The timing controller 50 is connected to a data compression controller 22. If a search instruction SEARCH from the data compression controller 22 is input to the timing controller 50, the repeat data search device 20 will compare the input search data with the data stored in each CAM cell row of the CAM cell array 26 and then execute a search mode in which writing the search data to any of the CAM cell rows of the CAM cell array 26 is repeated.

A system clock CLOCK from the data compression controller 22 is input to the timing controller 50, and the timing controller 50 generates and outputs a clock SR synchronized with the system clock CLOCK. The clock SR is output to a write buffer 56 connected to the timing controller 50.

The write buffer 56 is connected to the data compression controller 22, and search data (corresponding to unit data taken out from the original data in the present invention) is input sequentially from the controller 22 to the write buffer 56. The write buffer 56 is connected to the bit line pairs BL0, BL0' to BLM, BLM'. The write buffer 56 holds the input search data and, at the timing synchronized to the clock SR input from the timing controller 50, changes (or drives) the levels of the bit line pairs BL0, BL0' to BLM, BLM' in accordance with the value of the search data held. During the time the write buffer 56 is driving each bit line pair according to search data, the comparison of the data stored in each CAM cell row with that the search data is performed and also the writing of the search data to a predetermined CAM cell row is performed.

The timing controller 50 is connected to the address decoder 52, and the clock SR is also output to the address decoder 52. The address decoder 52 is connected to the data compression controller 22, and the address (write address WADR) of the CAM cell row to which the research data is written is specified by the data compression controller 22. The address decoder 52 is connected to the word lines WL0 to WLN, and at the timing synchronized with the clock SR, more particularly, within the time the write buffer 56 is driving each bit line pair according to search data, and after the comparison of the data stored in each CAM cell row and the search data is performed, the word line of CAM cell row corresponding to the specified write address WADR is asserted (or enabled) and the search data is written to the CAM cell row corresponding to the specified address.

Also, the timing controller 50 is also connected to each of N+1 match line controllers $58_1$ to $58_N$ respectively connected to the match lines MATCH0 to MATCHN, and the clock SR is also output to each of the match line controllers $58_0$ to $58_N$. Based on the input clock SR, the match line controllers $58_0$ to $58_N$ charge (precharge) the match lines MATCH0 to MATCHN to a high level, prior to the comparison of the data stored in each CAM cell row with the search data. The precharging of the match lines by these match line controllers $58_0$ to $58_N$ is performed within the period between the time that the write buffer 56 ends driving each bit line pair according to predetermined search data and the time that the write buffer 56 starts driving each bit line pair according to the next search data.

Figure 4:
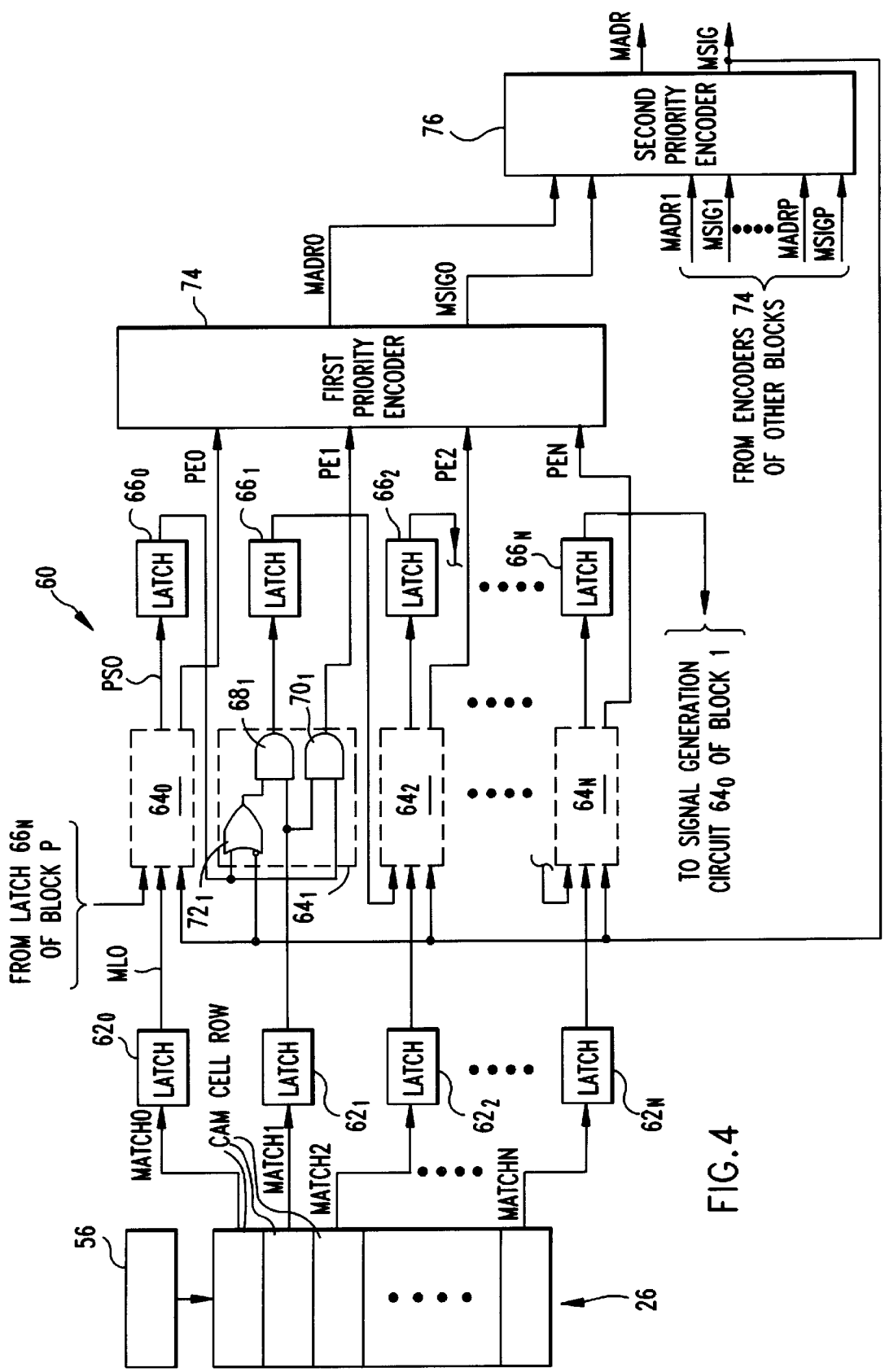
FIG. 4 is a block diagram showing the comparison result control circuit of the first embodiment.

Also, the match lines MATCH0 to MATCHN are connected to a comparison result control circuit 60 forming part of the comparison result control means of the present invention. As shown in FIG. 4, the comparison result control circuit 60 comprises latches $62_0$ to $62_N$ as first signal hold means, signal generation circuits $64_0$ to $64_N$ as first signal generation means, and latches $66_0$ to $66_N$ as second signal hold means. Note that in FIG. 4, the illustration of the match line controllers $58_0$ to $58_N$ has been omitted. Also, in FIG. 4, only the internal constitution of the signal generation circuit 64, connected to the match line MATCH1 is shown, but the signal generation circuits $64_0$ to $64_N$ are the same in constitution. Therefore, only that circuit portion of the comparison result control circuit 60 corresponding to the match line MATCH1 will hereinafter be described.

The match line MATCH1 is connected to the input terminal of the latch $62_1$. The output terminal of the latch $62_1$ is connected to one of the input terminals of an upper AND circuit $68_1$ of the signal generation circuit $64_1$ and to one of the input terminals of a lower AND circuit $70_1$. The other input terminal of the upper AND circuit $68_1$ is connected to the output terminal of an OR circuit $72_1$. The upper input terminal of the OR circuit $72_1$ and the lower input terminal of the lower AND circuit $70_1$ are connected to the output terminal of the latch $66_0$ of the preceding stage. The output terminal of the upper AND circuit $68_1$ is connected to the input terminal of the latch $66_1$. Likewise, the output terminal of the latch $66_1$ is connected to the upper input terminal of an OR circuit $72_2$ (not shown) of the signal generation circuit $64_2$ of the next stage and also to the lower input terminal of a lower AND circuit $72_2$ (not shown). Also, the output terminal of the AND circuit $70_1$ is connected to the input terminal of a first priority encoder 74.

Note that FIG. 4 shows only the comparison result control circuit 60 of the repeat data search device 20 of the block 0, but in the same way, one of two input terminals of an OR circuit $72_0$ (not shown) of the signal generation circuit $64_0$ is connected to the output terminal of a latch $66_N$ (not shown) of the comparison result control circuit 60 of the block P. Likewise, the output terminal of the latch $66_N$ (not shown) of the comparison result control circuit 60 of the block 0 is connected to one of two input terminals of an OR circuit $72_0$ (not shown) of the comparison result control circuit 60 of the block 1 (FIG. 2).

The output terminal of the first priority encoder 74 is connected to the input terminal of a second priority encoder 76. The first priority encoder 74 encodes an address corresponding to the signal which, among the signals PE0 to PEN input from the AND circuits $70_0$ to $70_N$ in the comparison result control circuit 60, is a high level after the search operation is performed, and outputs the encoded address to the second priority encoder 76 as a match address MADR0. Also, the logical sum of the signals PE0 to PEN is output as a match signal MSIG0 to the second priority encoder 76. In a case where a plurality of signals are high levels among the input signals PE0 to PEN, an address of the CAM cell row whose priority order is high according to a predetermined rule, for example, the lowest address is output as a match address MADR0.

Figure 5:
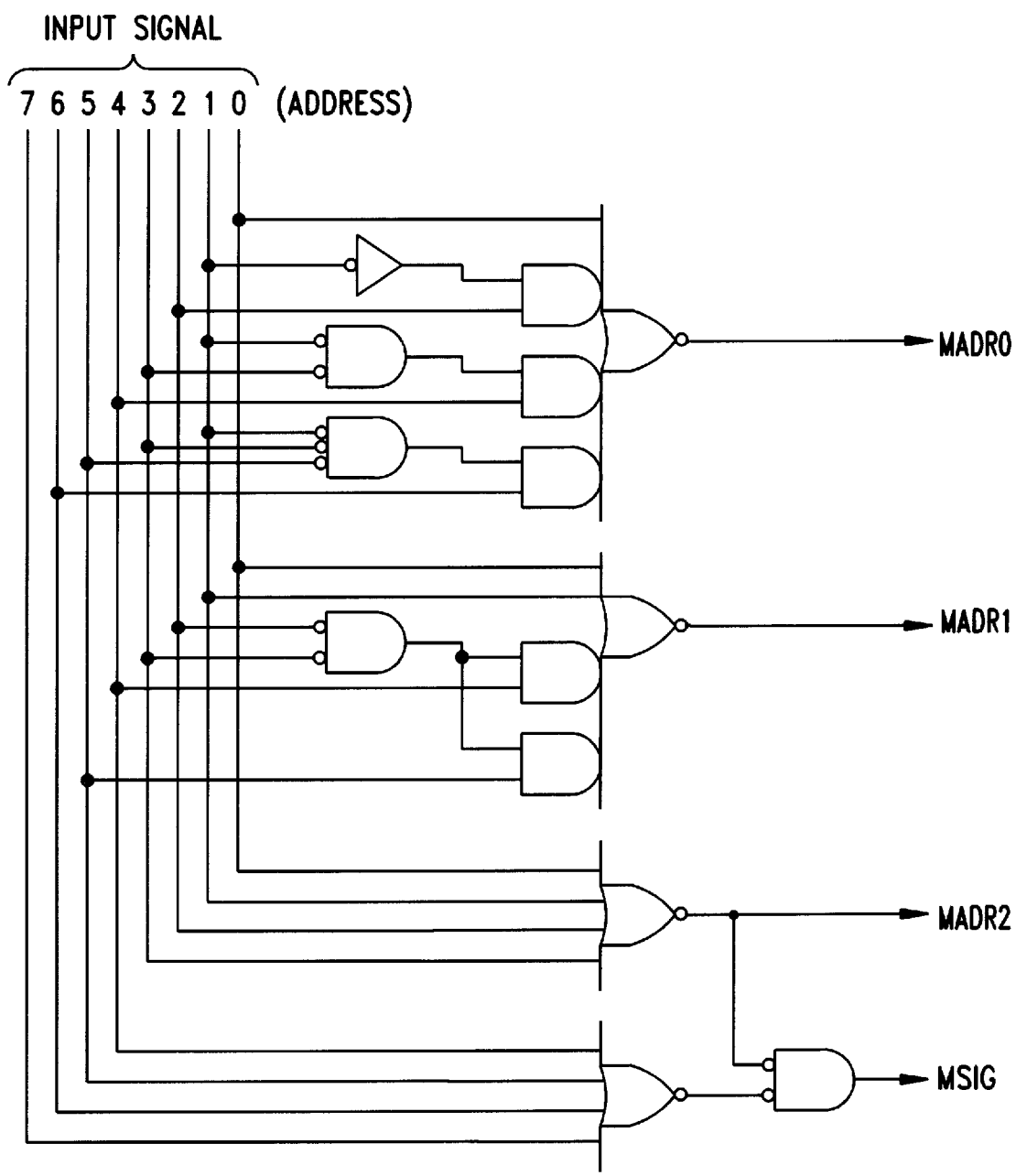
FIG. 5 is a circuit diagram showing an example of the structure of the priority encoder.

As an example, the constitution of an 8-bit priority encoder which outputs a 3-bit match address MADR ($MADR_0$ to $MADR_2$) and a match signal MSIG with respect to 8 input signals is shown in FIG. 5, and a truth table representative of the relationship between the combinations of 8 input signals to the priority encoder and the outputs (match address MADR and match signal MSIG) is shown in Table 1.

TABLE 1

| Input signal (numerals indicates addresses) | | | | | | | | MADR | | | MSIG |
|---|---|---|---|---|---|---|---|---|---|---|---|
| 7 | 6 | 5 | 4 | 3 | 2 | 1 | 0 | 2 | 1 | 0 | |
|   |   |   |   |   |   |   | H | L | L | L | H |
|   |   |   |   |   |   | H |   | L | L | H | H |
|   |   |   |   |   | H |   |   | L | H | L | H |
|   |   |   |   | H |   |   |   | L | H | H | H |
|   |   |   | H |   |   |   |   | H | L | L | H |
|   |   | H |   |   |   |   |   | H | L | H | H |
|   | H |   |   |   |   |   |   | H | H | L | H |
| H |   |   |   |   |   |   |   | H | H | H | H |
| L | L | L | L | L | L | L | L | H | H | H | L |

In table 1, H represents a logical high level, L represents a logical low level, and a blank represents that a match address MADR and a match signal MSIG do not change independently of the high or low level of an input signal. As shown in Table 1, the priority encoder shown as an example in FIG. 5 outputs the address of an input signal whose level is high, as a match address MADR, and when a plurality of signals whose level is high is input, outputs the lowest address. Also, as clearly shown in FIG. 5, a signal representative of the logical sum of 8 input signals is output as a match signal MSIG.

Also, to the input terminal of the second priority encoder 76 there are also input match addresses MADR and match signals MSIG output by the first priority encoders 74 of repeat data search device 20. The output terminal of the second priority encoder 76 is connected to the data compression controller 22.

The second priority encoder 76 is substantially the same constitution as the first priority encoder 74. A block address (address given to each of the repeat data search devices) is added to an address whose priority order is the highest according to a predetermined rule, for example, the lowest address, among the addresses MADR0 to MADRP whose level is high input from the first priority encoders 74, and is output as a match address MADR0 to the data compression controller 22. At the same time, a signal representative of the logical sum of the match signals MSIG0 to MSIGP input by a plurality of first priority encoders 74 is output as a match signal MSIG to the data compression controller 22. Note that in the first and second priority encoders 74 and 76, the circuit portion for generating the match signal MSIG corresponds to the second signal generation means of the present invention.

The match signal output terminal of the second priority encoder 76 is connected to the input terminals of the OR circuits $72_0$ to $72_N$ (only OR circuit $72_1$ is shown) of the signal generation circuits $64_0$ to $64_N$ through an inverter (not shown), so the inverted signal of the match signal MSIG is input to the OR circuits $72_0$ to $72_N$. Therefore, as clearly shown in FIG. 4, in the comparison result control circuit 60 of the first embodiment, the signal lines and OR circuits for generating the feedback signal ORFB have been omitted. As described above, in the conventional search device, the portion in which the signal lines were arranged takes a large area of the entire circuit. Therefore, by omitting that portion, the scale of the circuit is greatly reduced as compared with the conventional search device.

Next, as the operation of the first embodiment, the comparison operation in the repeat data search device 20 is first described. When data (original data) are compressed, the data compression controller 22 takes out unit data of predetermined bit length in sequence from the original data as search data, as will be described later, and outputs the unit data to the repeat data search device 20 in sequence, together with a search instruction SEARCH and a write address WADR.

If the search instruction SEARCH is input, in the repeat data search device 20 the clock SR will be output from the timing controller 50 to the write buffer 56, the address decoder 52 and the match line controllers $58_0$ to $58_N$, the match line controller 58 will precharge the match lines MATCH0 to MATCHN prior to the comparison operation in the CAM cell array 26, and the write buffer 56 will hold the input search data and drive the bit line pairs BL0, BL0' to BLM, BLM' according to the input search data.

In each CAM cell 28 of the CAM cell array 26, if the data Q output from the NOT circuit 30 is a 1 (high level), the N-MOSFET 38 will be on, and if the data Q' output from the NOT circuit 32 is a 1 (high level), the N-MOSFET 40 will be on. Therefore, when the data Q (Q') held in the loop of the NOT circuits 30 and 32 and the data D (D') supplied through the bit line pair BL, BL' match with each other, the N-MOSFET 42 is not turned on, but in the case of nonmatch, a current flows from the drain of one of the N-MOSFET 38 and 40 being on to the source and the N-MOSFET 42 is turned on. Therefore, the level of the match line MATCH precharged is pulled down (or discharged) to a low level.

The CAM cells 28 perform the above-described data comparison at the same time. Incidentally, since a plurality of CAM cells 28 (CAM cell row) are connected to one match line MATCH, the comparison operation of comparing the character data stored in the CAM cell row and the input character data is completed in the first half of one cycle of the clock SR, and each match line is held in a high level state only when, in all CAM cells 28 being connected, the N-MOSFETs 42 are not turned on, i.e., only when the character data stored in the CAM cell row and the character data input to the write buffer 56 match with each other, and is made low in the case of nonmatch.

In the second half of one cycle of the clock SR, the word line of the CAM cell row corresponding to the write address WADR input by the address decoder 52 is asserted (or enabled) and the search data is written to that CAM cell row. Then, if the writing of the search data to the CAM cell row is finished and the word line is made low and at the same time the driving of each bit line pair by the write buffer 56 is stopped, the precharging of each match line by the match line controller 58 will be performed again.

The above-described operation (comparison operation) is made during one cycle of the clock SR and repeated in synchronization with the search data, the search instruction SEARCH, and the write address WADR which were input by the data compression controller 22.

Next, the operation of the comparison result control circuit 60 will be described with reference to FIG. 6. In the figure, the original data are text data, a character data string of ABABBC has already been stored in the CAM cell rows of the addresses 0 to 5 in the recited order, and character data have been input as search data in order of "ABBBC . . . " The latches $62_0$ to $62_5$ are represented by ML0 to ML5, the latches $66_0$ to $66_5$ are represented by PS0 to PS5, and the signals output by the AND circuits $70_0$ to $70_5$ are represented by PE0 to PE5. Also, assume that in the other repeat data search devices the results of the comparison operations will hereinafter be "non-match." Actually, the comparison results are latched in latches $62_0$–$62_5$ and are output in the next cycle after a search character is input to each CAM cell row and comparison operation of the search character is done, but in FIG. 6, the character input-comparison operation and the results latch-output operation are executed in the same cycle to easily understand the concept of the search operation.

Figure 6:
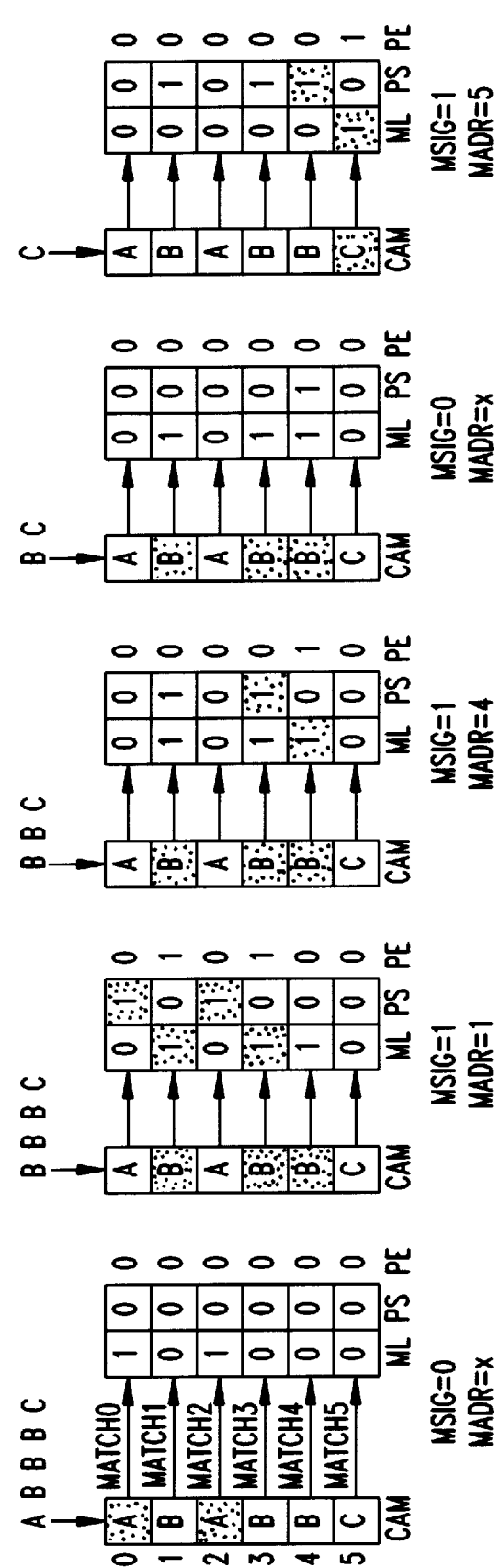
FIGS. 6(A) to 6(E) are diagrams used to explain the operation of the comparison result control circuit of the first embodiment.

If character data of A is first input as search data, as shown in FIG. 6(A), the comparison result will become "match" in the CAM cell rows of the addresses 0 and 2 (hatched in FIG. 6), the match lines (MATCH1, MATCH3, MATCH4, MATCH5) other than the match lines MATCH0 and MATCH2 will be discharged to a low level, and only match lines MATCH0 and MATCH2 will be held high. After the levels of the match lines MATCH0 to MATCH5 are respectively held in the latches ML0 to ML5 of the comparison result control circuit 60, they are input to the signal generation circuits $64_0$ to $64_5$ in the next cycle.

As shown in FIG. 6(A), the levels held in the latches PS0 to PS5 are low (0) (latches PS6 to PSN and latches PS0 to PSN of other blocks (not shown) are also 0), so all of the signals PE0 to PE5 output from the AND circuits $70_0$ to $70_5$ go low, and also the match signal MSIG0 output from the first priority encoder 74 and the match signal MSIG output from the second priority encoder 76 go low. Thus, in the first embodiment, even if only one character matches, i.e., even if with a single comparison operation there is the CAM cell row in which the comparison result matches, the match signal MSIG does not go to a high level. Also, the match signal MSIG is a low level, so all of the outputs of the OR circuits $72_0$ to $72_5$ go high, and the levels of the signals output from the latches ML0 to ML5 are held, as they are, in the latches PS0 to PS5 (see FIG. 6(B)).

If character data of B is input as the next search data, as shown in FIG. 6(B), the comparison result will match in the CAM cell rows of the addresses 1, 3, and 4, and the levels of the match lines (only match lines MATCH1, MATCH3, and MATCH5 are high levels) will be held in the latches ML0 to ML5, respectively. And, since in the next cycle the outputs of the latches ML1, ML3, and ML5 go high and also the latches PS0 and PS2 (i.e., latches PS of the preceding stage of latches ML1 and ML3) go high, as shown in FIG. 6(B), the signals PE1 and PE3 (outputs of AND circuits $70_1$ and $70_3$) go high, and the match signal MSIG0 output from the first priority encoder 74 and the match signal MSIG output from the second priority encoder 76 go high.

Thus, when two or more characters sequentially match, i.e., only when a sequentially input data string comprising a plurality of search data is stored in the CAM cell array 26, the match signal MSIG goes to a high level. Note that if it is assumed that the first priority encoder 74 outputs a lowest address as a match address MADR0, the match address MADR0 will go to the address 1 corresponding to the signal PE1. Also, for the match address MADR that is output from the second priority encoder 76, while it depends upon the values of the match addresses input by other repeat data search devices, when in other repeat data search devices data has not matched, the value of the lower bit of the match address MADR becomes equal to the value of the match address MADR0. Also, the value of the higher bit of the match address MADR becomes equal to the value of the address (address given to each of a plurality of repeat data search devices) of the encoder block, and since this case is the block of the address 0, the value of the higher bit of each of the match addresses MADR goes to a 0.

If character data of B is input as the next search data, as shown in FIG. 6(C), the same match lines as the last time will go high, and after the levels of the match lines are held in the latches ML0 to ML5, they are output to the signal generation circuits $64_0$ to $64_5$. In this case, among the latches ML1, ML3, and ML4 whose outputs are high, the latch corresponding to the latch PS of the preceding stage whose output is high is only the latch ML4. Therefore, among the signals PE0 to PE5, only the signal PE4 output by the AND circuit 704 goes to a high level. As a result, the match signal MSIG0 output by the first priority encoder 74 is held high and the match address MADR0 is the address 4 corresponding to the signal PE4.

Also, since the match signal MSIG is held high, a signal corresponding to the logical product between the output ML(n,m) of the latch ML of an address n and the output PS(n−1,m) of the latch PS of the preceding stage will be output to the latch PS of the address n if a current cycle is m. As a result, only the latch PS4 is held high.

Subsequently, character data of B is input as the next search data, as shown in FIG. 6(D). In this case, the levels of the match lines which are held in the latches ML0 to ML5 and then input to the signal generation circuits $64_0$ to $64_5$, are the same as the last time, but since for all of the latches ML1, ML3, and ML4 which output a high level signal, the signal which is output from the latch PS of the preceding stage is a low level, all of the signals PE0 to PE5 go low and the match signals MSIG0 and MSIG go low. Also, if the match signal MSIG goes to a low level, each of the output signals of the OR circuits $72_0$ to $72_5$ of the signal generation circuits $64_0$ to $64_5$ will go to a high level, so the levels of the signals output by the latches ML1 to ML5 are held, as they are, in the latches PS0 to PS5.

Further, if character data of C is input as the next search data, as shown in FIG. 6(E), only the match line MATCH5 will go to a high level. After the levels of the match lines are held in the latches ML0 to ML5 once, they are output to the signal generation circuits $64_0$ to $64_5$. In this case, only the latch ML5 outputs a high level signal and the latch PS4 of the preceding stage also outputs a high level signal. Therefore, among the signals PE0 to PE5, only the signal PE5 output by the AND circuit $70_5$ goes to a high level. As a result, the match signal MSIG0 output by the first priority encoder 74 is held high and the match address MADR0 is the address 5 corresponding to the signal PE5.

Figure 7:
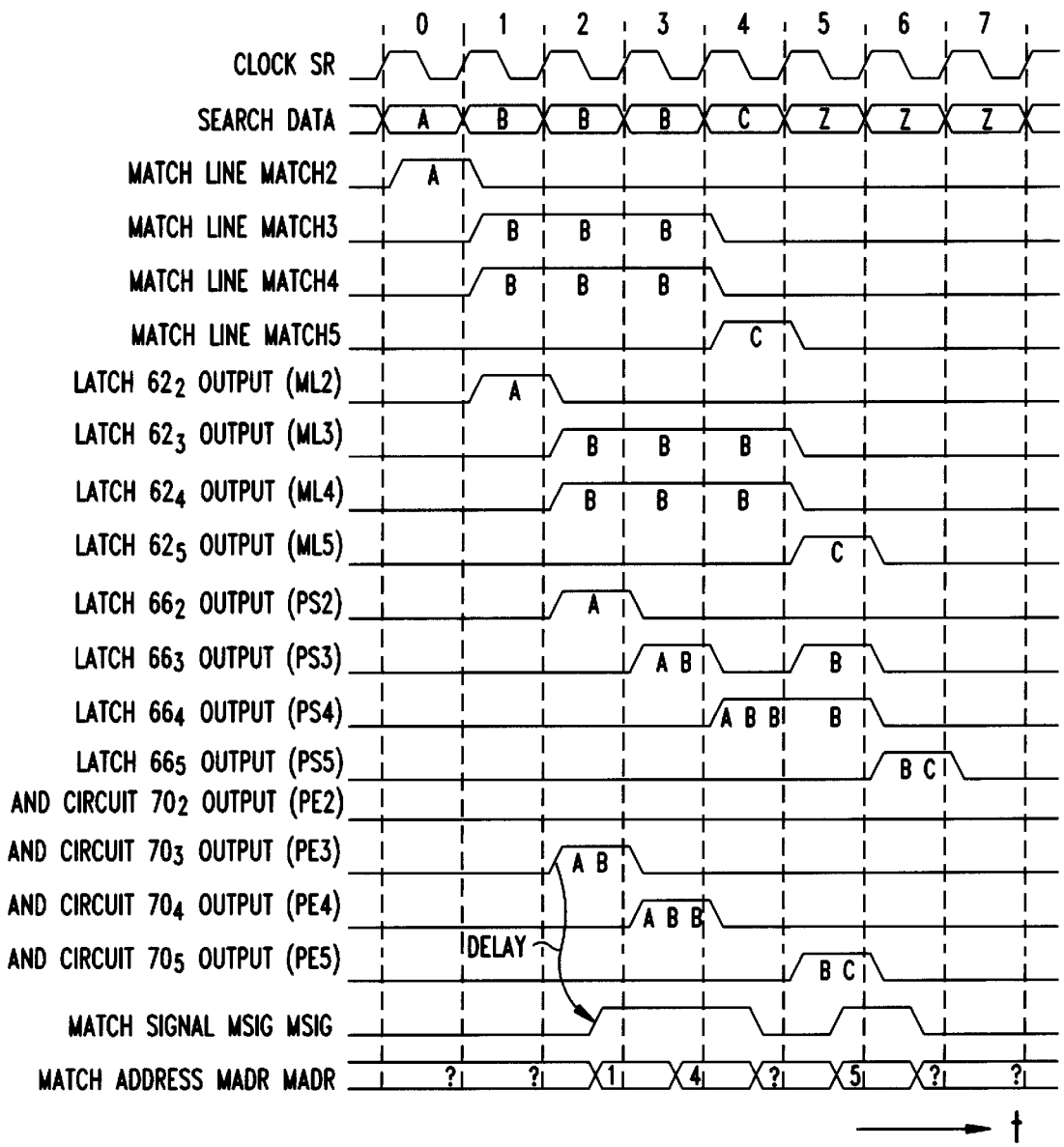
FIG. 7 is a timing diagram used to explain the operation of the comparison result control circuit of the first embodiment.

Incidentally, in the above-described operation of the repeat data search device 20, the levels of the match lines MATCH2 to MATCH5, the levels of the signals output by the latches ML2 to ML5 and PS2 to PS5, and the levels of the signals PE2 to PE5 output by the AND circuits $70_2$ to $70_5$ change at the timings shown in FIG. 7. Note that in FIG. 7 the illustration of the level changes by the precharging of the match lines has been omitted.

While the change in the level held in each latch, the level changes in the signal PE and match signal MSIG, and the changes in the value of the match address MADR have separately been shown in FIGS. 6(A) to 6(E) in correspondence to each search data input in sequence, in fact the search data is input in sequence every one cycle of the clock SR, as shown in FIG. 7. Also, the level change in each signal corresponding to the comparison result for the input search data is propagated in sequence for each one cycle of the clock SR by a pipeline control system.

Note that since the match signal MSIG is a signal corresponding to the logical sum of the signals PE input to the first priority encoders 74 of all of the repeat data search devices, the length of a signal line through which the signal passes is very long and the level change in the signal PE is delayed as shown in FIG. 7. In view of this delay time, the frequency of the clock SR is determined so that the length of one cycle thereof becomes longer than the delay time.

Figure 16:
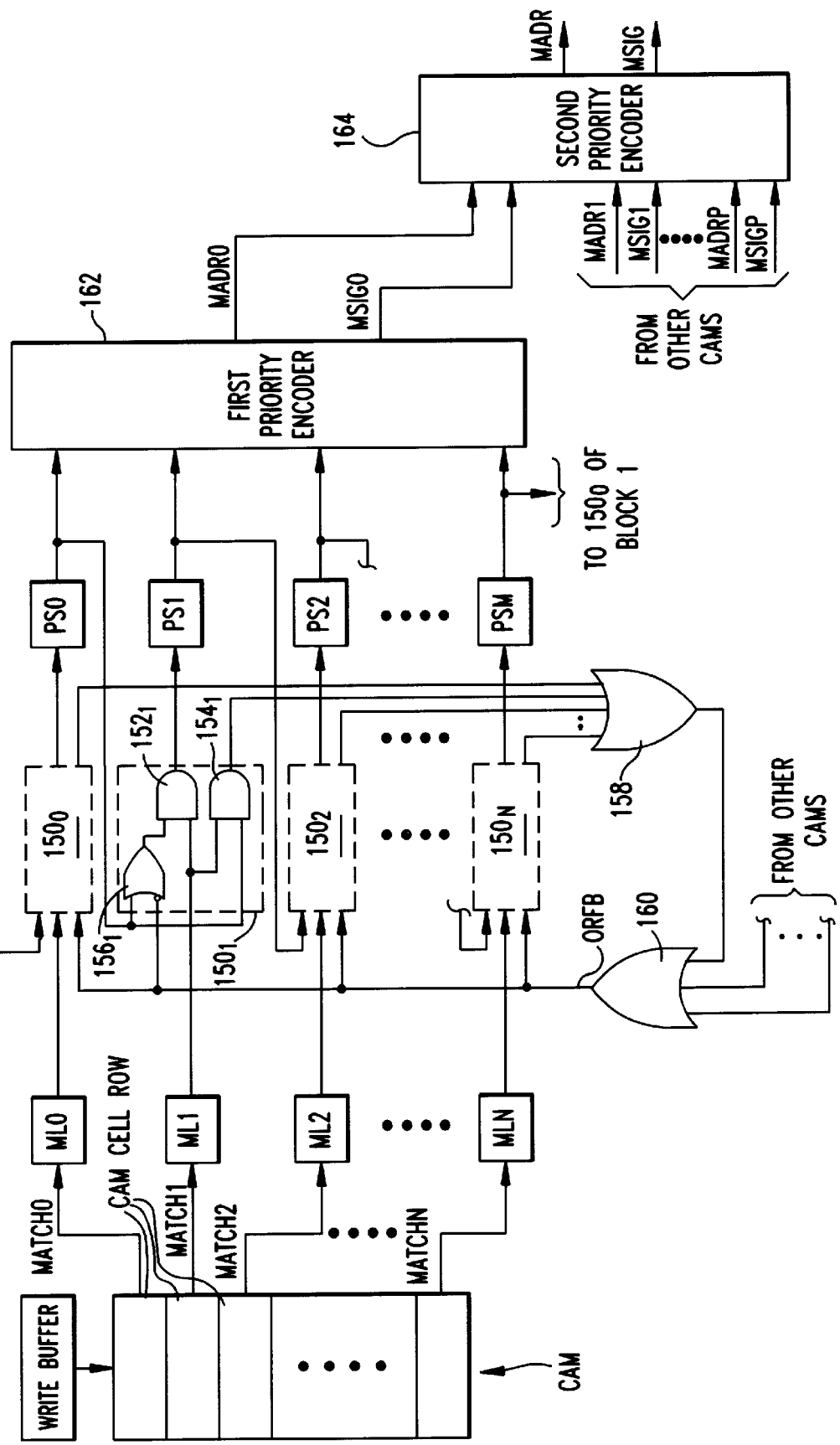
FIG. 16 is a block diagram showing a conventional search device.
Figure 17:
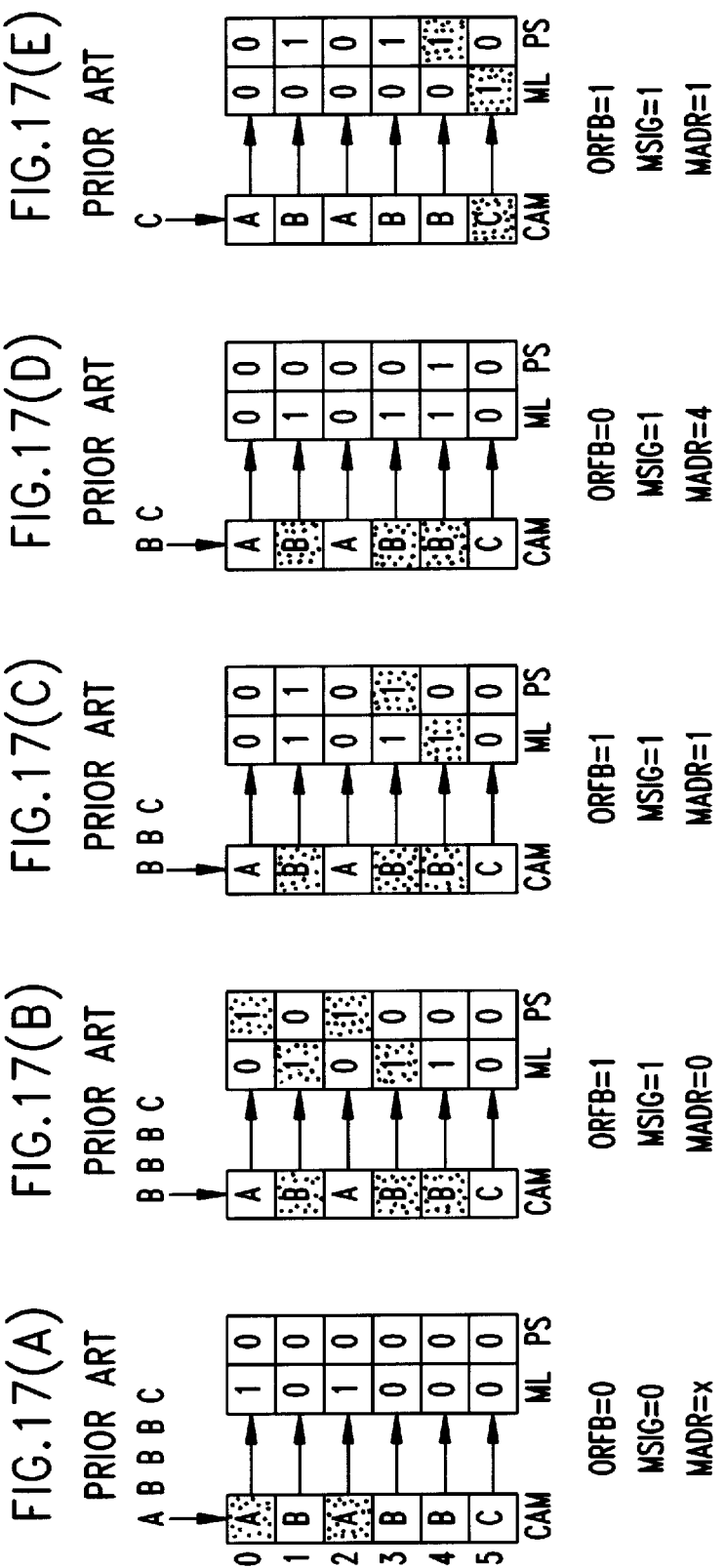
FIGS. 17(A) to 17(E) are diagrams showing the operation of the search device shown in FIG. 16.
Figure 18:
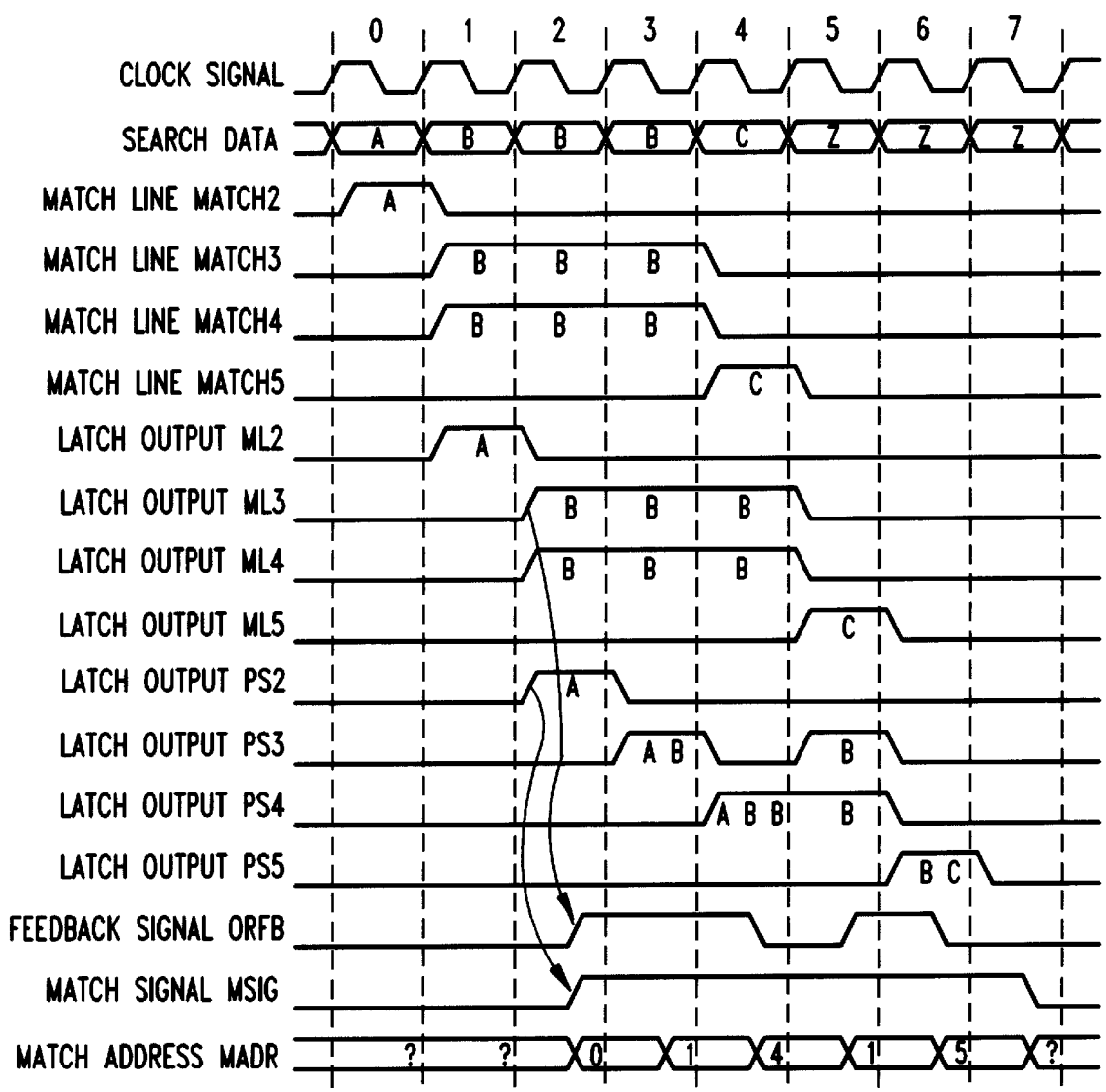
FIG. 18 is a timing diagram showing the operation of the search device shown in FIG. 16.

In the comparison result control circuit 60 according to the first embodiment of the present invention, the signal PE output from the signal generation circuit 64 is input to the first priority encoder 74 without passing through the latch, unlike the conventional search device. Therefore, as will also be seen from FIG. 16 showing a timing diagram of the conventional search device, as compared with FIG. 7 the level change in the signal PE that is input to the first priority encoder 74 is one clock earlier as compared with the signal PS in the conventional search device, and in the stage in which only one character matches, the signal PE does not go to a high level. As a result, the change in the value of the match address MADR that is output by the second priority encoder 76 becomes one clock earlier as compared with the match address MADR in the conventional search device.

Also, the match signal MSIG that is output by the second priority encoder 76 is one clock earlier than the match signal MSIG in the conventional search device and goes to a high level only when two or more characters continuously match, and the level of the match signal likewise changes at the same timing as the feedback signal ORFB of the conventional search device.

Figure 8:
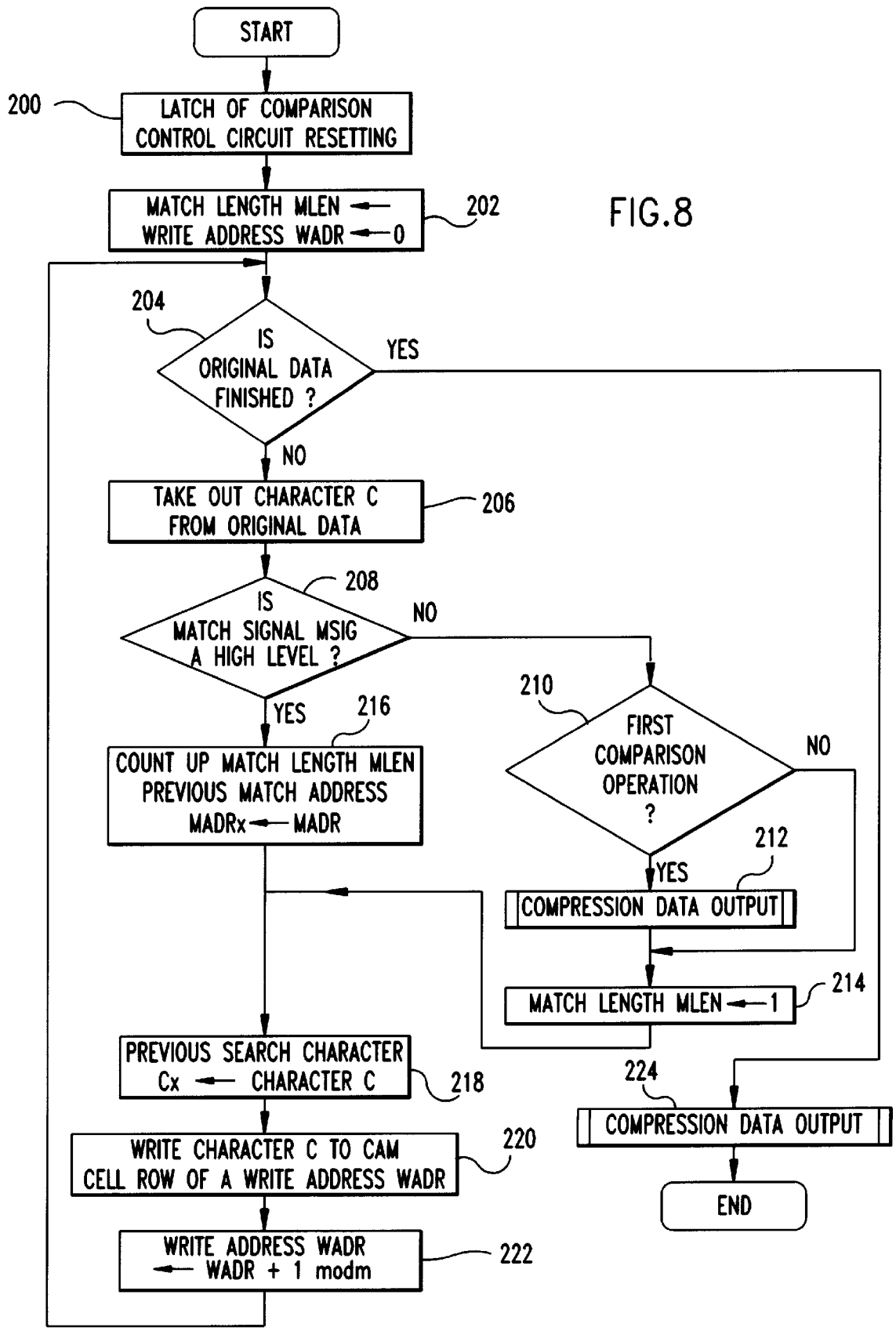
FIG. 8 is a flowchart used to explain the steps that are executed by the data compression controller of the first embodiment.

Next, the processing in the data compression controller 22 will be described with reference to the flowchart of FIG. 8. The processing shown in FIG. 8 will be executed if data (original data) to be compressed are transferred to the data compression controller 22 through the bus 18 and the compression of the original data is instructed by the CPU 12. In the flowchart of FIG. 8, it is assumed that the search character C is input to each CAM cell row and the comparison result of the character C is latched to and output from the latches $62_0$–$62_N$ as same as shown in FIG. 6.

In step 200 the latches $62_0$ to $62_N$ and $66_0$ to $66_N$ of the comparison result control circuit 60 of the repeat data search device 20 are reset. In step 202 a match length MLEN is initialized to 1 and the write address WADR is initialized to 0. In step 204 it is decided if the output of the original data to the repeat data search device 20 has been finished. If NO, the step 204 will advance to step 206. In the step 206, data of a character C corresponding to one character of the head of the original data is taken out from the original data as search data and input to the repeat data search device 20 together with a search instruction SEARCH and a write address WADR. As a result, the search operation described above is performed in the repeat data search device 20.

In the next step 208 it is decided if the match signal MSIG that is output by the second priority encoder 76 has gone to a high level. At this time, the match signal MSIG has been held low because in the step 200 each latch 62 and each latch 66 have been reset. Therefore, the decision in the step 208 is "NO" and the step 208 advances to step 210. In the step 210 it is decided if a current comparison operation is the first comparison operation of the original data. If NO, the step 210 will advance to step 214 without performing the output process of the compression data in step 212. As described above, the match signal MSIG will not go to a high level unless two or more characters continuously match, so when the non-match of the comparison result continues, the character searched the last time is output as compression data, as will be described later. Therefore, at this point of time there is no data to be output as compression data, so the step 212 will not be performed.

In step 214 the match length MLEN is set to 1 and the step 214 advances to the step 219. In step 219 the data of the current character C is set to the previously searched character Cx, and in the next step 220 the data of the character C is written to the CAM cell row corresponding to a current write address WADR (in the first comparison operation, 0). This write process is actually performed by asserting (or enabling) the word line of the CAM cell row corresponding to the write address WADR by the address decoder 52. In step 222, as the next write address WADR, the write address WADR is incremented by 1 (therefore, character data is written to the CAM cell row in ascendant order of addresses), and the remainder obtained by dividing by the size m of the CAM cell array 26 (in this embodiment, m=N+1) is set.

Therefore, data is written to the CAM cell row of the address 0 after data arc written to all of the CAM cell rows, so the CAM cell array 26 is used as a so-called ring buffer and there is no possibility that the overflow of the CAM cell array 26 occurs.

Figure 9:
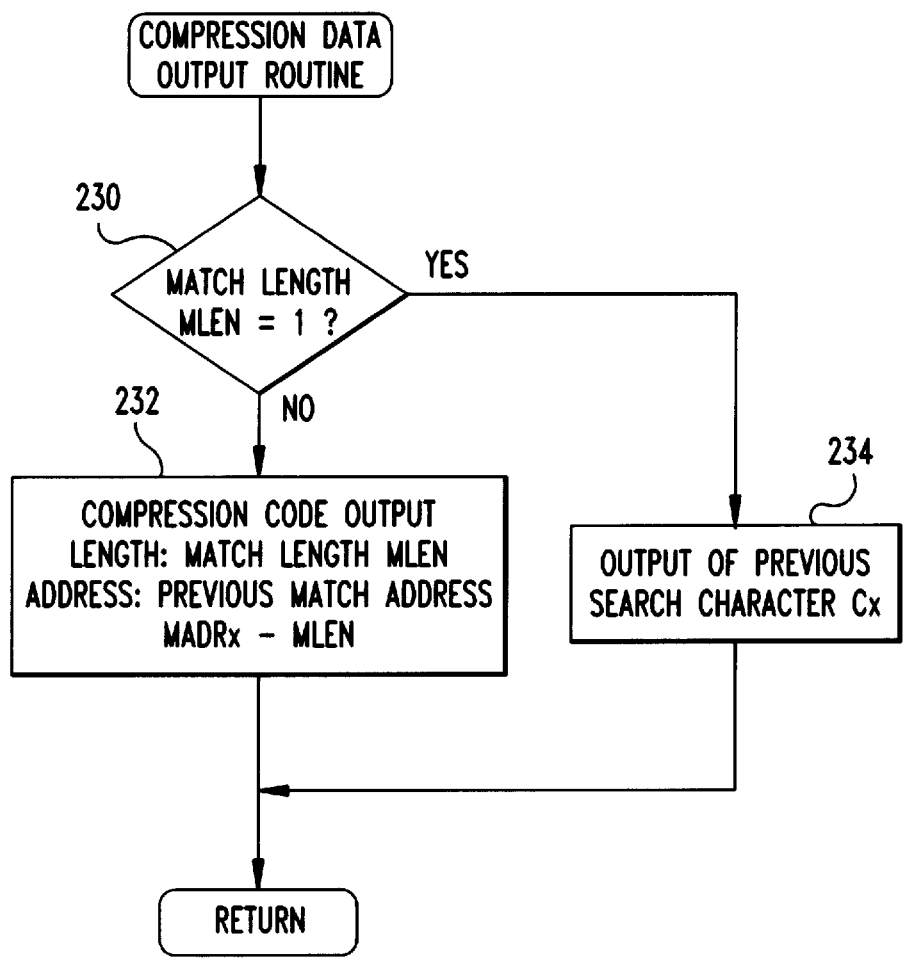
FIG. 9 is a flowchart used to explain the content of the compression data output routine in the flowchart of FIG. 8.

After the step 222 is executed, it returns back to the step 204. When the decision in the step 204 is NO, the step 206 and steps thereafter are again executed. In the step 206, data of a character C following to the previous search character Cx is taken out from the original data as search data, and output to the repeat data search device 20 together with a search instruction SEARCH and a write address WADR. And, when the decision in the step 208 is NO, the step 208 advances to the step 210. When the decision in the step 210 is YES, the compression data output routine in the step 212 is performed. As shown in FIG. 9, in this compression data output routine, it is decided in step 230 if the match length MLEN is a 1. When the previous comparison result is not "match," the step 230 advances to step 234. In the step 234 the previous search character Cx is output as compression data, and then the step 234 returns to the step 214 of the flowchart of FIG. 8.

Incidentally, when in the flowchart of FIG. 8 the decision of the step 208 is YES, the step 208 advances to step 218. In the step 218, the match length MLEN is counted up and the match address MADR output by the second priority encoder 76 is substituted into the previous match address MADR,. Then, the step 218 advances to the step 219. Therefore, during the time the match address MSIG is high, the output of the compression data is not performed.

Also, since a case where the match signal MSIG that has gone to a high level in the previous comparison operation goes to a low level and the decision in the step 210 is YES, is a case where the end of a repeat character string having a length of two or more characters was detected, the compression data output routine is performed in the step 212. Since in the above-described step 218 the match length MLEN has been counted up, the decision in the step 230 is denied and the step 230 advances to step 232.

In the step 232, compression code for compressing a repeat character string is obtained. In this embodiment, the compression code comprises first code representative of the length of a repeat character string and second code representative of a pointer indicating the position of the same character string as the above-described repeat character string that has already been output. The match length MLEN is output as the first code, and the difference between the previous match address $MADR_x$ and the match length MLEN ($MADR_x$–MLEN) is output as the second code. Therefore, the length of the compression data output by the data compression controller 22 becomes shorter than the original data.

When the data compression controller 22 outputs this compression data, a code representative of a partition is also inserted between the character code and the compression code, in order to discriminate the character code and the compression code when a compressed character string is restored. Thus, by executing the step 232 each time a repeat character string is found and by converting the found repeat character string into the compression code and outputting it, the redundancy in the original data is removed and then the original data is compressed into compression data.

If the above-described steps are repeated and the position at which the data of the character C is taken out from the original data arrives the end of the original data, the decision in the step 204 will be affirmed and in the step 224 the compression data output routine will be performed again. In this case, if the value of the match length MLEN is 2 or more, the output of the compression code will be performed in the step 232, but in the case where the value of the match length MLEN is a 1, in the step 234 the data of the previous search character C, is output as compression data and the process is finished.

During the compression process including the first comparison operation, the result of the comparison operation often matches in a CAM cell row to which character data has not been written. This occurs when the data stored before the compression process in the CAM cell row matches with search data by accident. In order to prevent the problem caused by this, as proposed as an example in Japan Laid-Open Patent Publication No. HEI 5-319944 by the inventor of this application, in a case where the match signal MSIG goes to a high level when data has not been written to all of the CAM cell rows, an input match address MADR and a write address WADR are compared and, when the match address MADR is greater or equal, the result of a current comparison operation is made invalid. The other way to prevent the problem is adding latches to each CAM cell row to indicate whether character data has been written or not on the CAM cell row.

Also, while there has been described an example of a constitution (constitution in which the calculation shown in equation (3) is performed) in which character data is written in ascendant order of the addresses of CAM cell rows, the match of a comparison result is a 1 (high level), and the non-match of the comparison result is a 0 (low level), the constitution of the comparison result control circuit 60 is not limited to the embodiment described above. The present invention includes all circuit constitutions which realize any of calculations shown in equations (3) to (6).

Second Embodiment

Figure 10:
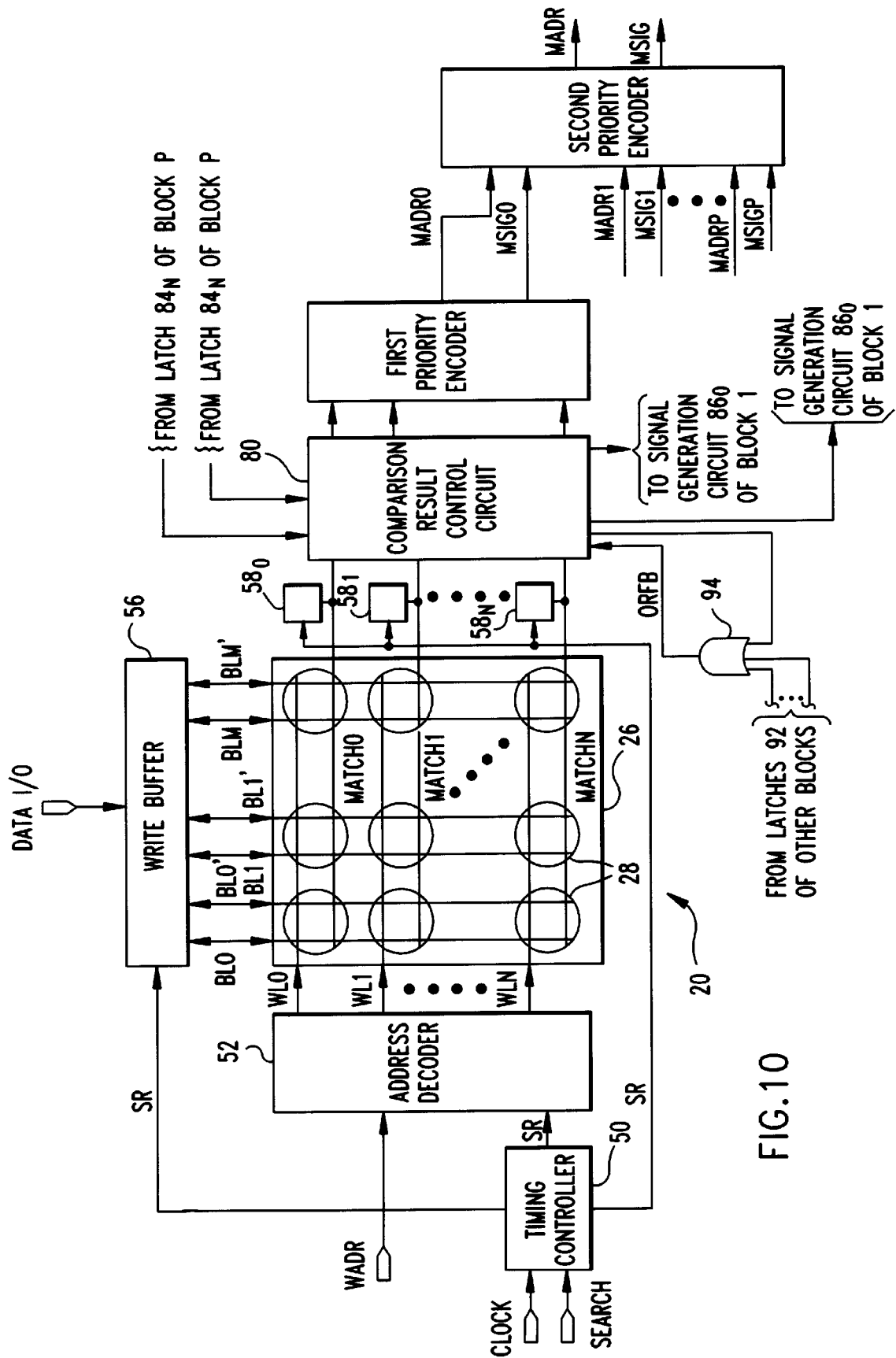
FIG. 10 is a block diagram showing a repeat data search device according to a second embodiment of the present invention.

Next, a second embodiment of the present invention will be described. The same reference numerals will be applied to the same parts as the first embodiment and therefore a description of the same parts will be omitted. Instead of the comparison result control circuit 60 (FIG. 4) described in the first embodiment, the second embodiment uses a comparison result control circuit 80, as shown in FIGS. 10 and 11.

Figure 11:
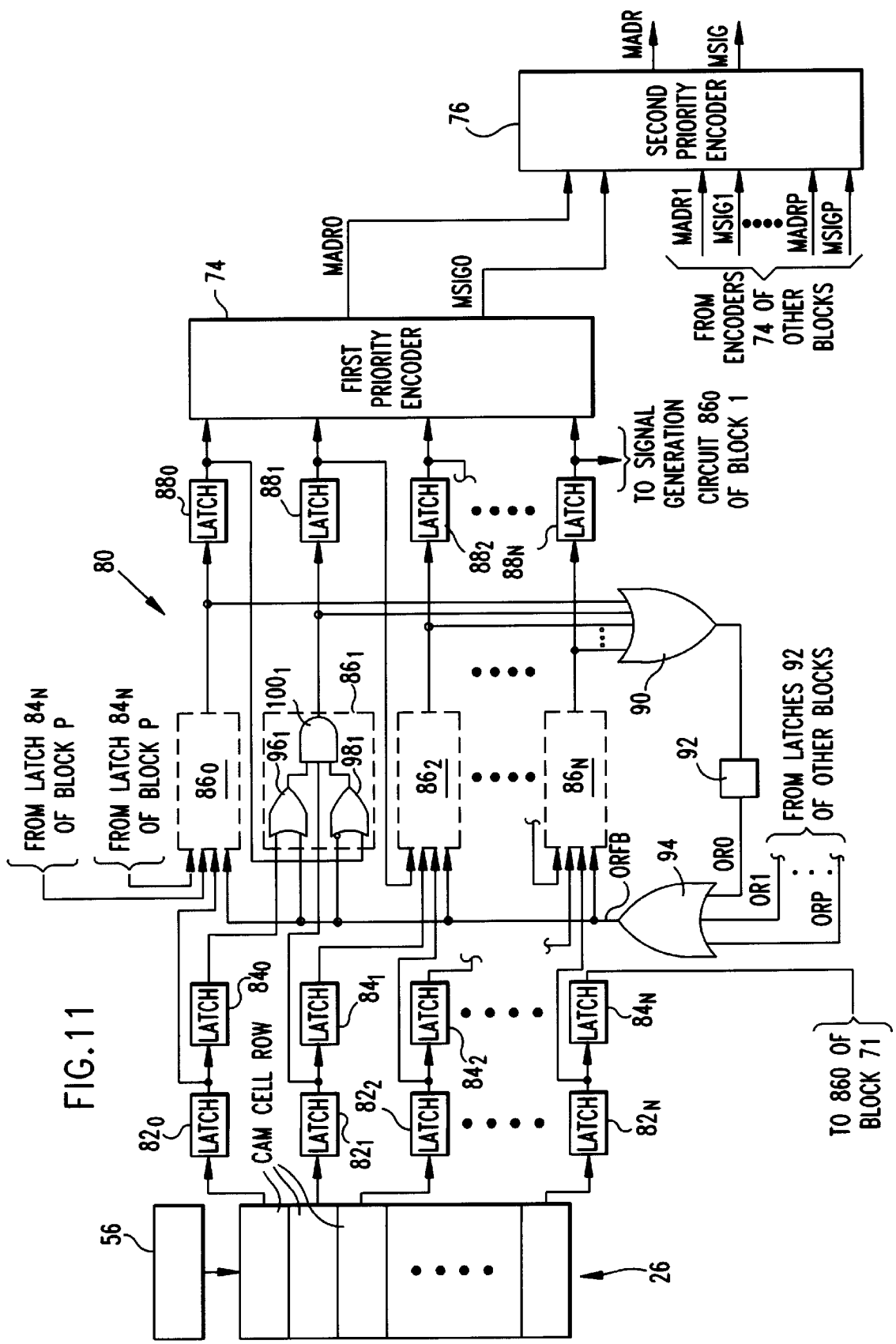
FIG. 11 is a block diagram showing the comparison result control circuit of the second embodiment.

As shown in FIG. 11, the comparison result control circuit 80 comprises latches $82_0$ to $82_N$ as third signal hold means, latches $84_0$ to $84_N$ as fourth signal hold means, signal generation circuits $86_0$ to $86_N$ as third signal generation means, latches $88_0$ to $88_N$ as fifth signal hold means, and a latch 92 as control means for OR circuits 90 and 94 as feedback signal generation means. The latch 92 operates in synchronization with a clock SR, and a signal passing through the latch 92 is delayed by one cycle of the clock SR.

Note that in FIG. 11 the illustration of match line controllers $58_0$ to $58_N$ has been omitted. Also, among the signal generation circuits $86_0$ to $86_N$, only the signal generation circuit $86_1$ connected to a match line MATCH1 is shown in FIG. 11, but signal generation circuits are the same in constitution. Therefore, only that circuit portion of the comparison result control circuit 80 corresponding to the match line MATCH1 will hereinafter be described.

The match line MATCH1 is connected to the input terminal of the latch $82_1$. The output terminal of the latch $82_1$ is connected to the input terminal of the latch $84_1$ and one of the three input terminals of an AND circuit $100_1$ of the signal generation circuit $86_1$. The other two inputs of the AND circuit $100_1$ is connected to the output terminals of OR circuits $96_1$ and $98_1$. One of the two inputs of the OR circuit $96_1$ is connected to the output terminal of the latch $84_0$ of the preceding stage. Also, one of the two inputs of the OR circuit $98_1$ is connected to the output terminal of the latch $88_0$ of the preceding stage.

The output terminal of the AND circuit $100_1$ is connected to the input terminal of the latch $88_1$. The output terminal of the latch $88_1$ is connected to the input terminal of a first priority encoder 74 and the input terminal of an OR circuit $98_2$ (not shown) of the signal generation circuit $86_2$ of the next stage. Also, the output terminals of the AND circuits $100_0$ to $100_N$ are connected to the input terminals of the OR circuit 90. The output terminal of the OR circuit 90 is connected to the input terminal of the latch 92, and the output terminal of the latch 92 is connected to one of the input terminals of the OR circuit 94.

Note that FIG. 10 shows only the comparison result control circuit 80 of the repeat data search device 20 of a block 0, but in the same way, the output terminals of latches 92 of the comparison result control circuits 80 of other blocks 1 to P are connected to the remaining input terminals of the OR circuit 94, as shown in FIG. 11. Also, one of two input terminals of an OR circuit $98_0$ of the signal generation circuit $86_0$ is connected to the output terminal of a latch $88_N$ of the comparison result control circuit 80 of the block P. Also, the output terminal of the latch $88_N$ of the comparison result control circuit 80 of the block 0 is connected to one of two input terminals of an OR circuit $98_0$ of the comparison result control circuit 80 of the block 1 (FIG. 10).

The output terminal of the OR circuit 94 is connected to the input terminals of the OR circuits $96_0$ to $96_N$ (only OR circuit $96_1$ is shown) of the signal generation circuits $86_0$ to $86_N$ and also to the input terminals of the OR circuits $98_0$ to $98_N$ (only OR circuit $98_1$ is shown) through an inverter (not shown), so the inverted signal of the match signal MSIG is input to the OR circuits $72_0$ to $72_N$. Also, although an illustration is omitted, the output terminal of the OR circuit 94 is likewise connected to the signal generation circuits $86_0$ to $86_N$ of the comparison result control circuits 80 of other blocks 1 to P. Note that the above-described latch 92 is disposed at the halfway of a signal path leading from the output terminals of the AND circuit $100_0$–$100_N$ through the OR circuits 90 and 94 to the input terminals of OR circuits $96_0$ to $96_N$ and $98_0$ to $98_N$.

Figure 12:
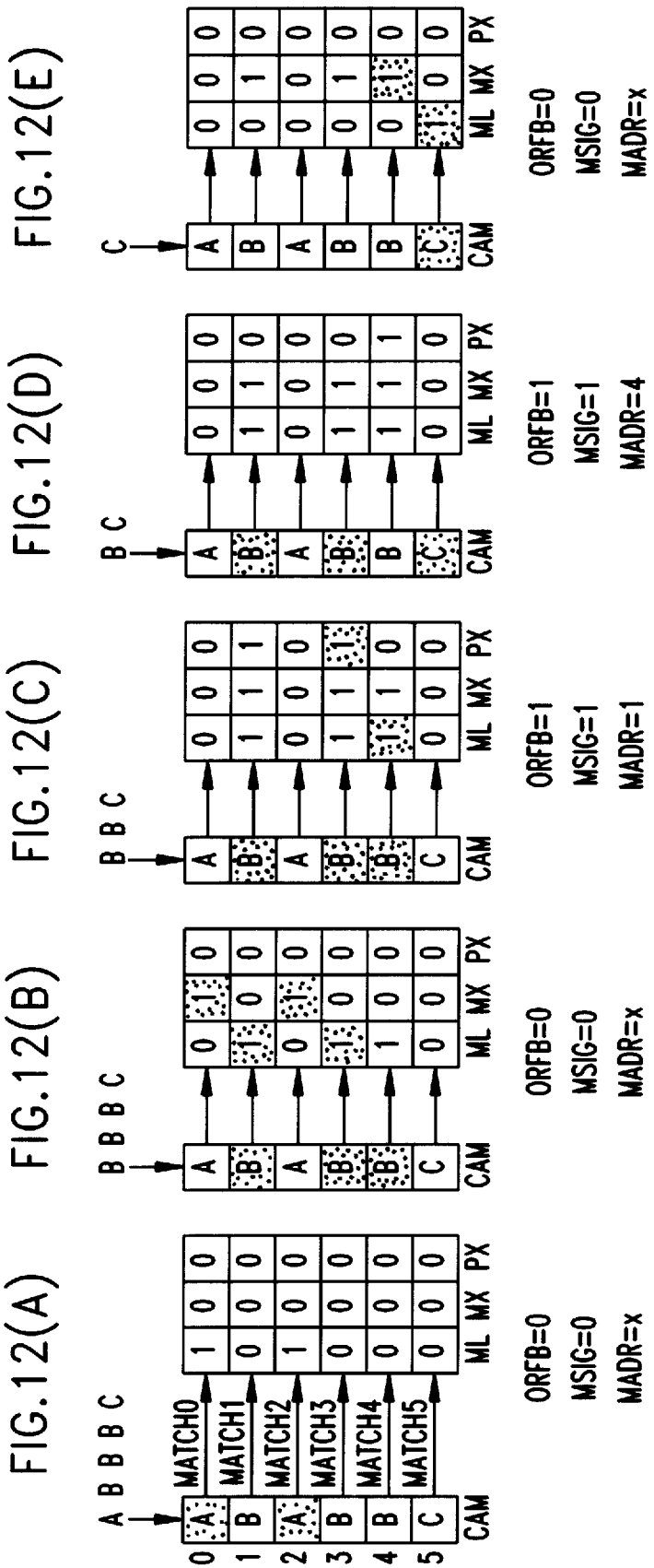
FIGS. 12(A) to 12(E) are diagrams used to explain the operation of the comparison result control circuit of the second embodiment.
Figure 13:
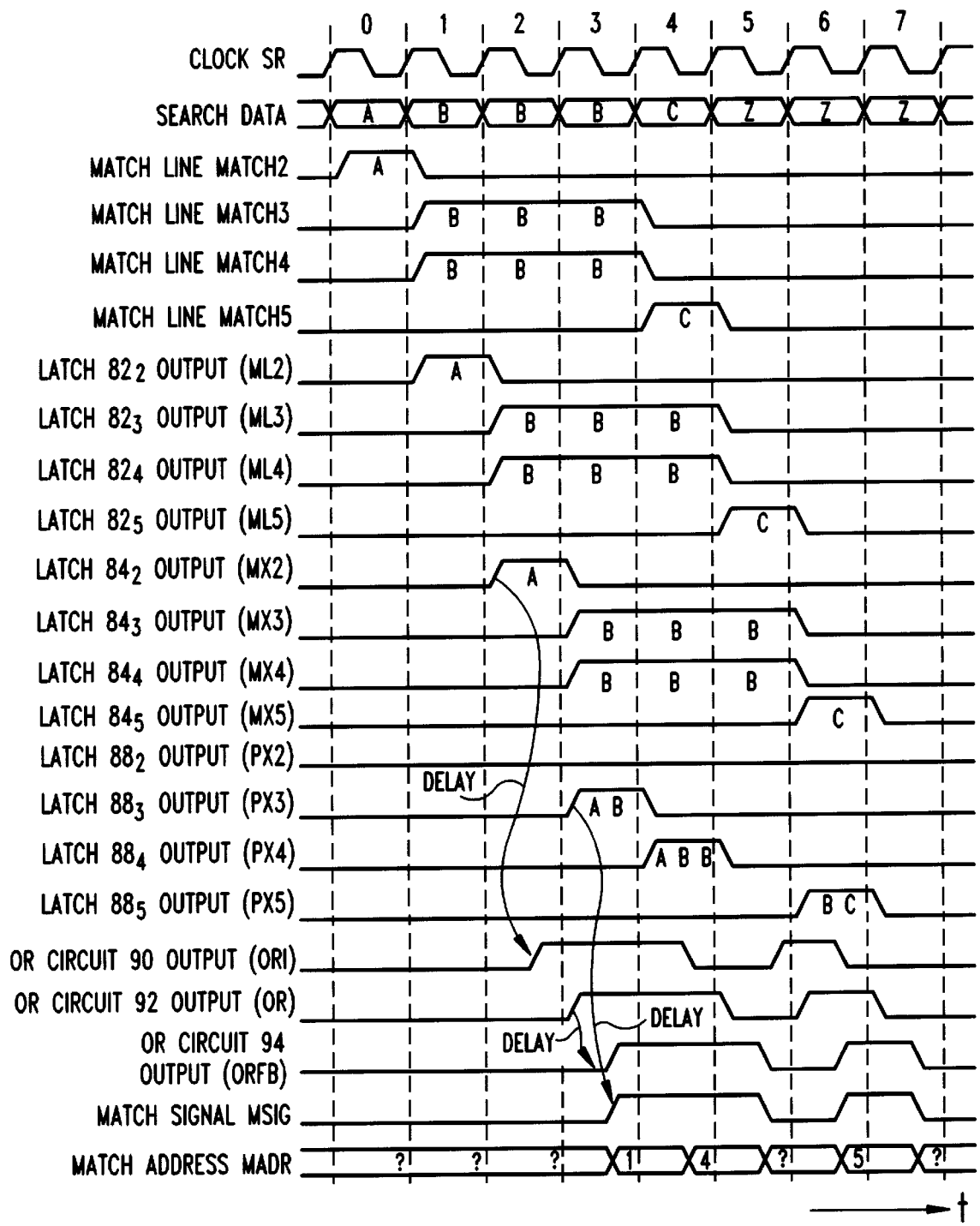
FIG. 13 is a timing diagram used to explain the operation of the comparison result control circuit of the second embodiment.

Next, as the operation of the second embodiment of the present invention, the operation of the comparison result control circuit 80 will be described with reference to FIGS. 12 and 13. In the same way as that described in FIG. 6, a character data string of ABABBC has already been stored in the CAM cell rows of the addresses 0 to 5 in the recited order, and character data have been input as search data in order of "ABBBC . . . ." The latches $82_0$ to $82_5$ are represented by ML0 to ML5, the latches $84_0$ to $84_5$ are represented by MX0 to MX5, the latches $88_0$ to $88_5$ are represented by PX0 to PX5, the signal output by the OR circuit 90 is represented by a signal ORI, the signal output by the latches 92 is represented by a signal OR, and the signal output by the OR circuit 94 is represented by a feedback signal ORFB. Actually, the comparison results are latched in latches $82_0$–$82_5$ and are output in the next cycle after a search character is input to each CAM cell row and comparison operation of the search character is done, but in FIG. 6, the character input-comparison operation and the results latch-output operation are executed in the same cycle to easily understand the concept of the search operation.

If character data of A is first input (period 0 in FIG. 13) as search data, as shown in FIG. 12(A), the comparison result will become "match" in the CAM cell rows of the addresses 0 and 2, and among the match lines MATCH0 to MATCH5, only the match lines MATCH0 and MATCH2 will be held high. After the levels of the match lines MATCH0 to MATCH5 are respectively held in the latches ML0 to ML5 of the comparison result control circuit 80, they are input to the latches MX0 to MX5 and the signal generation circuits $86_0$ to $86_5$ in the next cycle (period 1 in FIG. 13).

The levels of the signals output by the latches ML0 to ML5 are held in the latches MX0 to MX5, as shown in FIG. 12(B). Also, since at this stage the feedback signal ORFB is low level and the signals output by the latches MX0 to MX5 are all low (latches MX6 to MXN (not shown) and latches MX0 to MXN of other blocks (not shown) are also low), the output signals of the OR circuits $96_0$ to $96_N$ and AND circuits $100_0$ to $100_N$ of the signal generation circuits $86_0$ to $86_5$ also go low, and the level of the feedback ORFB output through the OR circuits 90, 92, and 94 and the levels held in the latches PX0 to PX5 also go low (FIG. 12(B)).

Therefore, further, the match signal MSIG which is generated by the signals output from the latches PX0 to PX5 in the next cycle (period 2 in FIG. 13), also goes to a low level. Thus, in the second embodiment, even if only one character matches, i.e., even if with the first comparison operation there is the CAM cell row in which the comparison result matches, the match signal MSIG does not go to a high level.

On the other hand, if character data of B is input as the next search data (period 1 in FIG. 13), as shown in FIG. 12(B), the comparison result will match in the CAM cell rows of the addresses 1, 3, and 4, and the levels of the match lines (only match lines MATCH1, MATCH3, and MATCH5 are high levels) will be held in the latches ML0 to ML5, respectively. And, in the next cycle (period 2 in FIG. 13), the output signals of the latches ML1, ML3, and ML5 go high, the levels of the signals output from the latches ML0 to ML5 are held in the latches MX0 to MX5, the outputs of the latches MX0 and MX2 (i.e., latches MX of the preceding stage of latches ML1 and ML3) go high, and the outputs of the OR circuits $96_1$ and $96_3$ go high. Also, the level change in the feedback signal ORFB is delayed by one cycle of the clock SR, as will be described later. Therefore, during this cycle (period 2), the feedback signal is held low, and the outputs of the OR circuits $98_0$ to $98_N$ go high.

Therefore, the outputs of the AND circuits $100_1$ and $100_3$ go high, and these high level signals are held in the latches PX1 and PX3, as shown in FIG. 12(C). Thus, when in the comparison result control circuit 80 of the second embodiment, it is detected that 2 characters match, the outputs of the AND circuits 100 would be influenced even if the feedback signal ORFB were a low level. Therefore, in the next cycle (period 3 in FIG. 13), the match signals MSIG0 and MSIG generated by the signals input from the latches PX0 to PX5 to the first priority encoder 74 also go high. Thus, when two or more characters sequentially match, i.e., only when a sequentially input data string comprising a plurality of search data is stored in the CAM cell array 26, the match signal MSIG goes to a high level.

With respect to the comparison results for the search data that are input in sequence to the repeat data search device 20, the signal output by the AND circuit 100 changes in the same way as the signal PE described in the first embodiment, but since the signal from the AND circuit is output through the latch PX to the first priority encoder 74, the level change in the signal output from the latch PX to the first priority encoder 74 is delayed one clock with respect to the signal PE. Also, since the length of the signal path for generating the match signals MSIG0 and MSIG is long, as described in the first embodiment, the level change in the match signal MSIG is delayed with respect to the level change in the output signal of the latch PX3, as shown in FIG. 13.

Also, the signals output by the AND circuits $100_N$ to $100_N$ is output as a feedback signal ORFB through the OR circuits 90, 92 and 94, so the length of the signal path for generating the feedback signal ORFB becomes longer. Also, in the second embodiment, the time for a signal to pass through the signal path is regulated by the latch 92 newly added. Therefore, as will be seen from the comparison of FIG. 13 with FIG. 7, the level change in the feedback signal ORFB is also delayed with respect to the match signal MSIG in the first embodiment by one cycle of the clock SR.

On the other hand, if character data of B is input as the next search data (period 2 in FIG. 13), as shown in FIG. 12(C), the same match lines as the last time will go high, and after the levels of the match lines are held in the latches ML0 to ML5 once, in the next cycle (period 3 in FIG. 13) they are output to the latches MX0 to MX5 and the signal generation circuits $86_0$ to $86_5$. As shown in FIG. 13, during this period 3, the feedback signal ORFB that is output by the OR circuit 94 goes to a high level, the output signal of the OR circuit 96 goes to a high level independently of the level of the signal that is input by the latch MX of the preceding stage, and the output signal of the OR circuit 98 matches with the level of the signal that is input by the latch PX of the preceding stage.

At this time, as shown in FIG. 12(C) with hatching, since among the latches ML1, ML3, and ML4 whose outputs go high, the latch corresponding to the latch PX of the preceding stage whose output is high is only the latch ML4, only the output signal of the AND circuit $100_4$ of the signal generation circuit $86_4$ goes to a high level. This result is held in the latches PX0 to PX5 and, in the next cycle (period 4 in FIG. 13), is output to the first priority encoder 74. The match signals MSIG0 and MSIG are held high and the value of the match address MADR is the address 4 of the latch PX4 (FIG. 12(D)). Also, the feedback signal ORFB is also held high.

Also, as shown in FIG. 12(D), if character data of B is input as the next search data (period 3 in FIG. 13), the levels of the match lines will be held in the latches ML0 to ML5 and in the next cycle (period 4), they will be input to the signal generation circuits $86_0$ to $86_5$. These levels are the same as the last time and the feedback signal ORFB is a high level, but since for all of the latches ML1, ML3, and ML4 which output a high level signal, the signal which is output from the latch PX of the preceding stage is a low level, all of the signals output by the AND circuits $100_0$ to $100_N$ go low. Also, the match signal MSIG0, the match signal MSIG, and the feedback signal ORFB go low in the next cycle (period 5).

Further, if character data of C is input as the next search data (period 4), as shown in FIG. 12(E), only the match line MATCH5 will go to a high level. After the levels of the match lines are held in the latches ML0 to ML5 once, in the next cycle (period 5) they are output to the signal generation circuits $86_0$ to $86_5$. Since, during this period 5, the feedback signal ORFB goes to a low level, the output signal of the OR circuit 98 goes to a high level independently of the level of the signal that is input by the latch PX of the preceding stage, and the output signal of the OR circuit 96 matches with the level of the signal that is input by the latch MX of the preceding stage.

Since during this period, only the latch ML5 outputs a high level signal and the latch MX4 of the preceding stage also outputs a high level signal, only the signal output by the AND circuit $100_5$ goes to a high level. Therefore, the match signal MSIG0, the match signal MSIG, and the feedback signal ORFB go high in the next cycle (period 6), and also the value of the match address MADR0 becomes the address 5 of the latch PX 5 that output a high level signal.

Thus, during the cycle (period 4) in which the end of a repeat character string having a length of two or more characters is detected, the feedback signal ORFB does not go to a low level, and in the next cycle the signal goes to a low level. The levels (search result of a single character) output from the latches ML0 to MLN in the cycle in which the end of the repeat character string is detected, are output from the latches MX0 to MXN in the next cycle in which the feedback signal ORFB goes to a low level. Therefore, when there exists a repeat character string having a length of two or more characters in which the head of the string is a single character that matches in the cycle in which the above-described end is detected (in the example of FIG. 12, a character string of BC stored in the CAM cell rows of the addresses 4 and 5), that repeat character string can be searched.

As described above, in the comparison result control circuit 80 according to the second embodiment of the present invention, the level change in the feedback signal ORFB is allowed to delay by one cycle of the clock SR, as compared with the conventional search device and the search device of the first embodiment, and the signal output by the AND circuit 100 of the signal generation circuit 86 passes through the signal path for generating the feedback signal ORFB (signal path leading from the output of the signal generation circuit 86 through the OR circuits 90, 92, and 94 to the input of the signal generation circuit 86) for a time corresponding to two cycles of the clock SR. Therefore, the cycle of the clock SR can be reduced to about a half length (about twice as much frequency), so the comparison result control circuit 80 can be operated at twice as much speed and the data compression processing can be operated at high speed, as compared with the conventional device.

Next, the processing in the data compression controller 22 will be described with reference to the flowchart of FIG. 14, but a description of that portion different from the first embodiment will be given. In the flowchart of FIG. 8, it is assumed that the search character CO is input to each CAM cell row and the comparison result of the character CO is latched to and output from the latches $82_0$–$82_N$ as same as shown in FIG. 12. In the second embodiment, in step 211 (corresponding to the step 210 of the first embodiment) it is decided if a current comparison operation is the first or second comparison operation of original data. If YES, the step 211 will advance to step 214 without performing the compression data output processing.

The feedback signal ORFB of the second embodiment, as with the match signal MSIG of the first embodiment, will not go to a high level unless two or more characters continuously match, and also the level change delays with respect to the match signal MSIG of the first embodiment by one cycle of the clock SR, so when the non-match of the comparison result continues, the character searched two cycles before is output as compression data, as will be described later. Therefore, when the decision in the step 211 has been YES, there is no data to be output as compression data, so the compression data output processing will not be performed.

Also, after step 214 is performed, it advances to step 217. In the step 217, the data of the previous search character C1 is set to a character C2 searched two cycles before, in order to output the search character C2 as compression data. In step 218, the data of a current search character CO is set to the previous search character C1.

Figure 15:
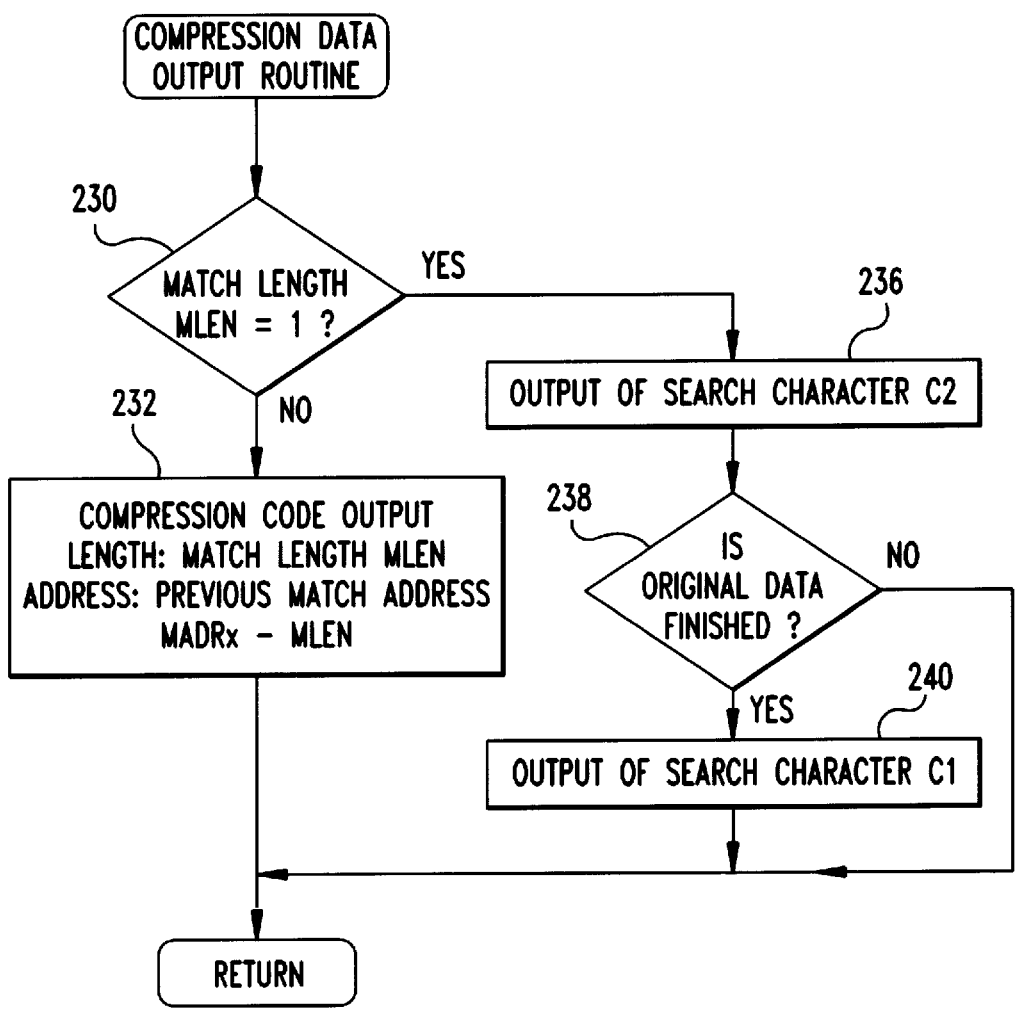
FIG. 15 is a flowchart used to explain the content of the compression data output routine in the flowchart of FIG. 14.

Next, the compression data output processing according to the second embodiment of the present invention will be described with reference to the flowchart of FIG. 15. When the decision in step 230 is YES (match length MLEN is a 1), in step 236 the data of the above-described search character C2 is output as compression data. In the next step 238 it is decided if the original data is finished. If the end character 'C' of the original data is the end of a repeat character string having a length of two or more characters, the above-described end character 'C' will be output as compression code in step 232. In the case other than that, the decision in the step 238 is affirmed, and since in step 240 the data of the above-described end character 'C' has been set to the previous search character C1, the data of the previous search character C1 is output as compression data.

While there has been described an example of a constitution (constitution in which the calculation shown in equation (7) is performed) in which character data is written in ascendant order of the addresses of CAM cell rows, the match of a comparison result is a 1 (high level), and the non-match of the comparison result is a 0 (low level), the constitution of the comparison result control circuit 80 is not limited to the embodiment described above. The present invention includes all circuit constitutions which realize any of calculations shown in equations (7) to (10).

Third Embodiment

Next, a third embodiment of the present invention will be described. The same reference numerals will be applied to the same parts as the first and second embodiments and therefore a description of the same parts will be omitted. Instead of the comparison result control circuit 60 (FIGS. 2 and 4) described in the first embodiment and the comparison result control circuit 80 (FIGS. 10 and 11) described in the second embodiment, the third embodiment uses a comparison result control circuit 110, as shown in FIGS. 19 and 20.

Figure 19:
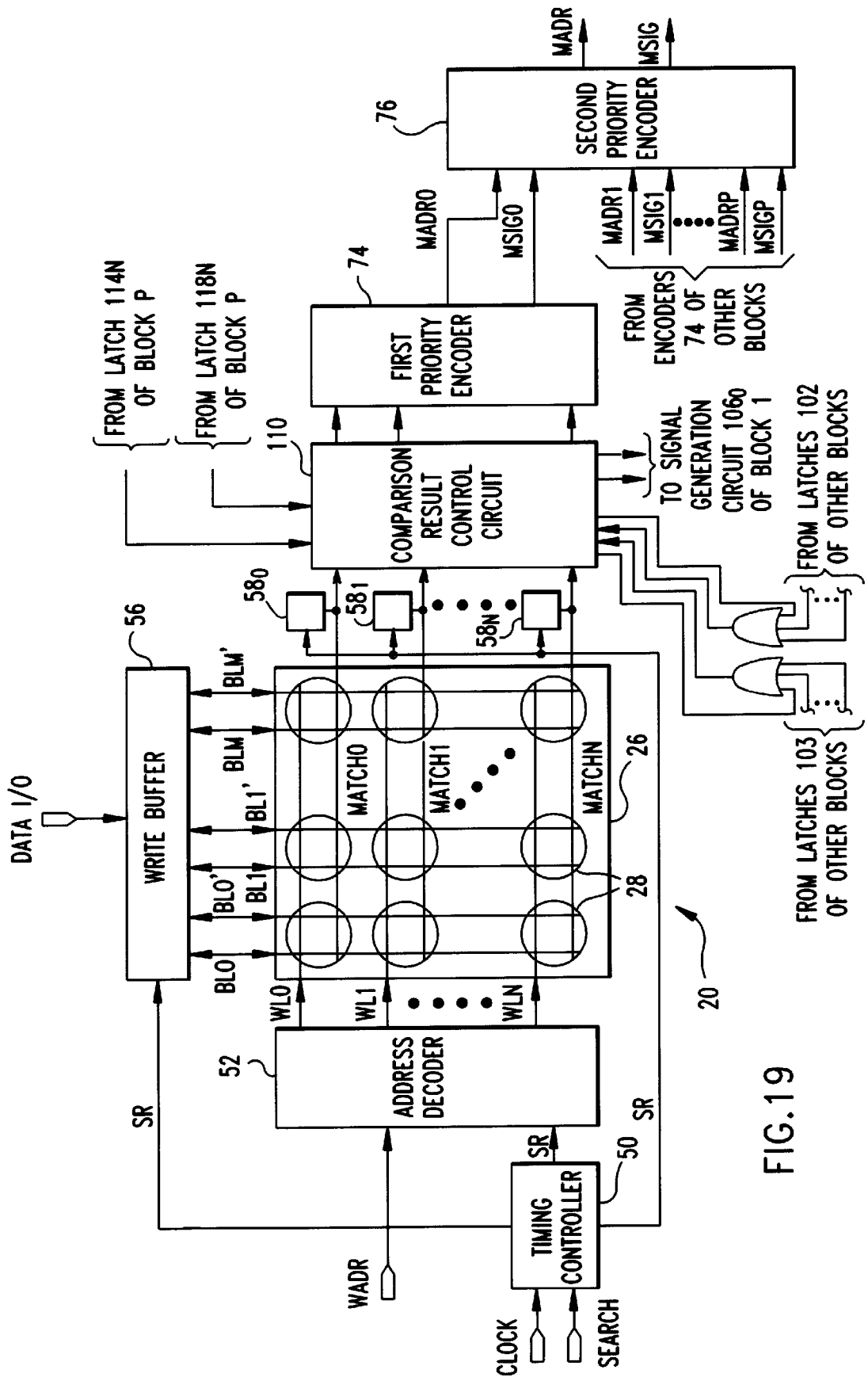
FIG. 19 is a block diagram showing a repeat data search device of the third embodiment.

As shown in FIG. 19, the comparison result control circuit 110 comprises latches $112_0$ to $112_N$ as sixth signal hold means, latches $114_0$ to $114_N$ as seventh signal hold means, signal generation circuits $116_0$ to $116_N$ as fourth signal generation means, latches $118_0$ to $118_N$ as eighth signal hold means, OR circuits 120, 121, 124 and 125 as feedback signal generation means, AND circuits $132_0$ to $132_N$ and $134_0$ to $134_N$, a latch 136, AND circuit 138, OR circuit 140, and latches 124 and 125 as regulation means. The latches 136, 124 and 125 operate in synchronization with a clock SR, and a signal passing through the latches is delayed by one cycle of the clock SR.

Figure 20:
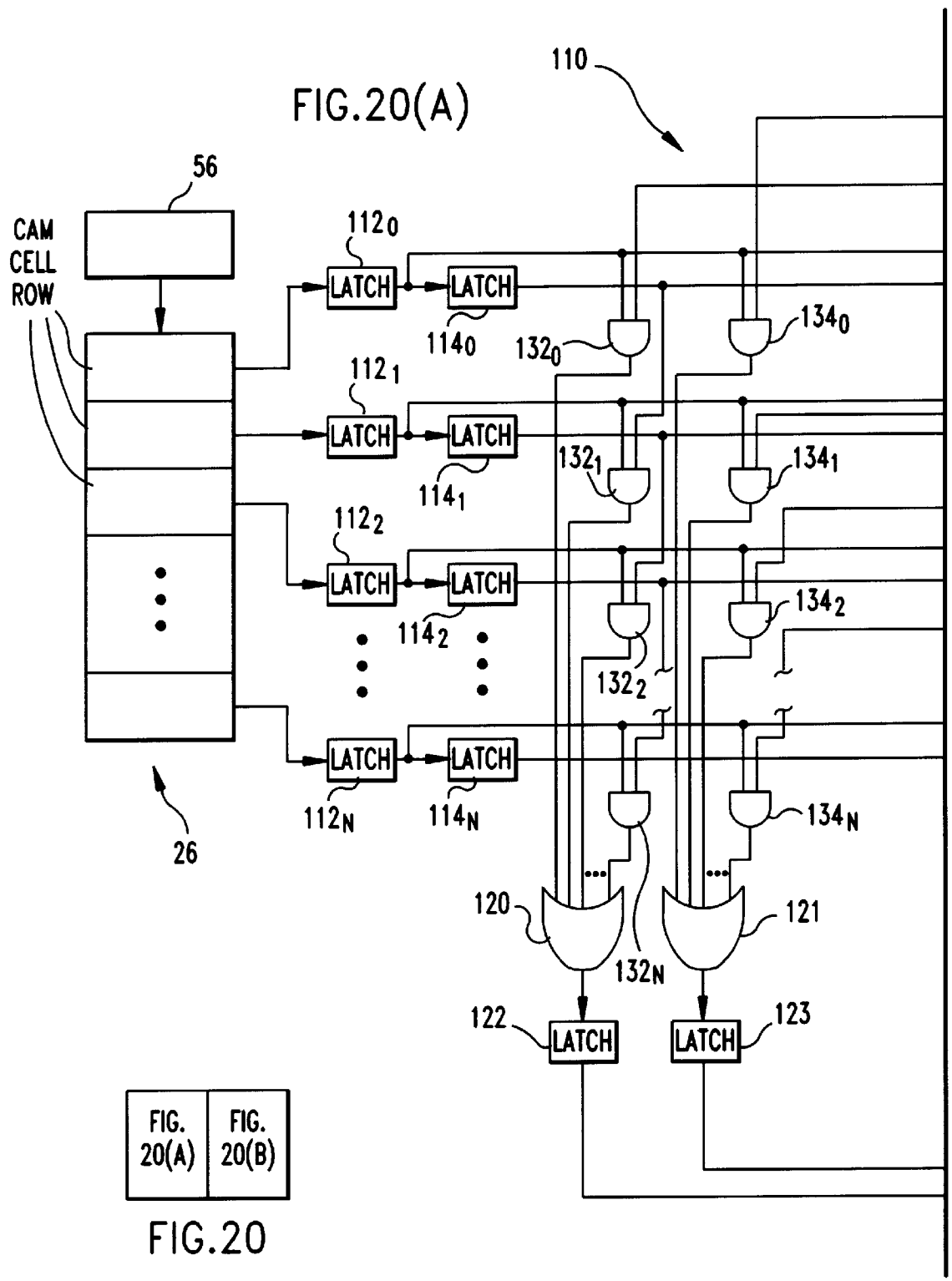
FIG. 20 is a block diagram showing the comparison result control circuit of the third embodiment.
Figure 20B:
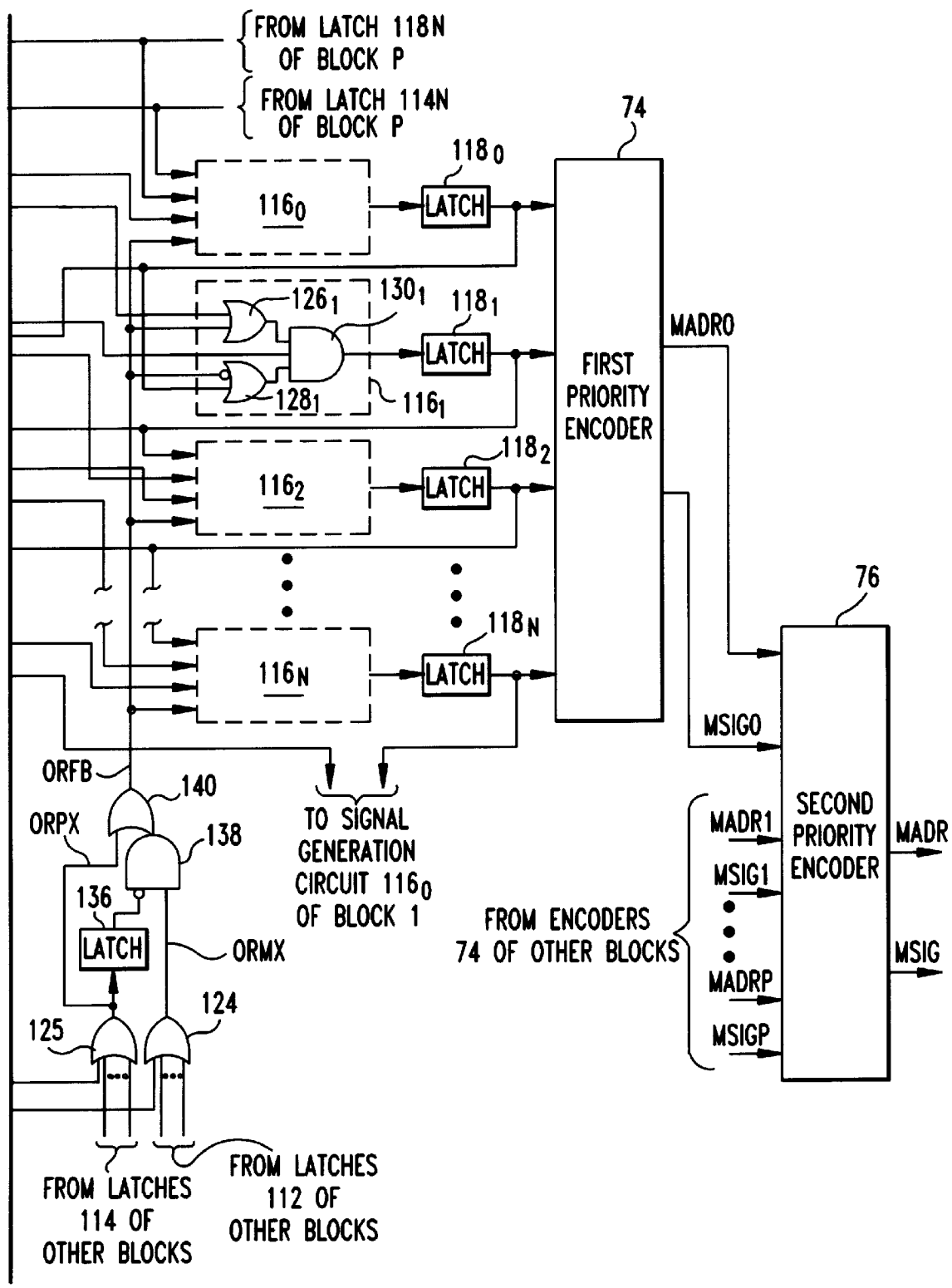

Note that in FIG. 20 the illustration of match line controllers $58_0$ to $58_N$ has been omitted. Also, among the signal generation circuits $116_0$ to $116_N$, only the signal generation circuit $116_1$ connected to a match line MATCH1 is shown in FIG. 20, but signal generation circuits are the same in constitution. Therefore, only that circuit portion of the comparison result control circuit 110 corresponding to the match line MATCH1 will hereinafter be described.

The match line MATCH1 is connected to the input terminal of the latch $112_1$. The output terminals of the latch $112_1$ are connected to the input terminal of the latch $114_1$ and AND circuits $132_1$ and $134_1$ of the feedback signal generation means of an AND circuit $130_1$ of the signal generation circuit $116_1$. The output terminal of the latch $114_1$ is connected to the input terminal of the AND circuit $132_2$ of the next stage. The other two of the three input terminals of the AND circuit $130_1$ are connected to the output terminals of OR circuits $126_1$ and $128_1$ of the signal generation circuit $116_1$. One of the two input terminals of the OR circuit $126_1$ is connected to the output terminal of the latch $114_0$ of the preceding stage. Also, one of the two input terminals of the OR circuit $128_1$ is connected to the output terminal of the latch $118_1$ of the preceding stage. One of the two input terminals of the AND circuit $132_1$ is connected to the output terminal of the latch $114_0$ of the preceding stage, and one of the two input terminals of the AND circuit $134_1$ is connected to the latch $118_0$ of the preceding stage.

The output terminal of the AND circuit $130_1$ is connected to the input terminal of the latch 118, the output terminals of which are connected to the input terminal of a first priority encoder 74, the input terminal of the OR circuit $128_2$ of the signal generation circuit $116_2$ of the next stage (not shown), and the input terminal of the AND circuit $134_2$ of the next stage. Also, the OR circuit 120 is provided with a multiplicity of input terminals to which the output terminals of the AND circuits $132_0$ to $132_N$ are connected. The output terminal of the OR circuit 120 is connected to the input terminal of the latch 122, the output terminal of which is connected to one of the input terminals of the OR circuit 124. Also, the OR circuit 121 is provided with a multiplicity of input terminals to which the output terminals of the AND circuits $134_0$ to $134_N$. The output terminal of the OR circuit 121 is connected to the input terminal of the latch 122, the output terminal of which is connected to one of the input terminals of the OR circuit 125. The output of the OR circuit 124 is connected to one of the two input terminals of the AND circuit 138, to the other input terminal of which is connected the output terminal of the latch 136 through an inverter not shown. The output terminals of the OR circuit 125 are connected to the input terminal of the latch 136, and one of the two input terminals of the OR circuit 140, to the other input terminal of which is connected the output terminal of the AND circuit 138.

Note that FIG. 19 shows only the comparison result control circuit 110 of the repeat data search device 20 of a block 0, but in the same way, the output terminals of latches 122 of the comparison result control circuits 110 of other blocks 1 to P are connected to the remaining input terminals of the OR circuit 124, and the output terminals of the latches 123 of the comparison result control circuits 110 of other blocks are connected to the remaining input terminals of the OR circuit 125. One of two input terminals of an OR circuit $126_0$ of the signal generation circuit $116_0$ is connected to the output terminal of a latch $114_N$ of the comparison result control circuit 1 10 of the block P, and the output terminal of the latch $114_N$ of the comparison result control circuit 110 of the block 0 is connected to one of two input terminals of an OR circuit $126_0$ of the comparison result control circuit 110 of the block 1 (see FIG. 19 too). One of two input terminals of an OR circuit $128_0$ of the signal generation circuit $116_0$ is connected to the output terminal of a latch $118_N$ of the comparison result control circuit 110 of the block P, and the output terminal of the latch $118_N$ of the comparison result control circuit 110 of the block 0 is connected to one of two input terminals of an OR circuit $128_0$ of the comparison result control circuit 110 of the block 1 (see FIG. 19 too).

The output terminal of the OR circuit 140 is connected to each of the input terminals of the OR circuits $126_0$ to $126_N$ and also to the input terminals of the OR circuits $128_0$ to $128_N$ through an inverter not shown. Also, although an illustration is omitted, the output terminal of the OR circuit 140 is likewise connected to the signal generation circuits $116_0$ to $116_N$ of the comparison result control circuits 110 of other blocks 1 to P. Note that the above-described latch 122 is disposed at the halfway of a signal path leading from the output terminals of the AND circuits $132_0$–$132_N$ through the OR circuits 120 and 124 to the input terminals of OR circuits $126_0$ to $126_N$ and $128_0$ to $128_N$. And the latch 123 is disposed at the halfway of a signal path leading from the output terminals of the AND circuits $134_0$–$134_N$ through the OR circuits 121 and 125 to the input terminals of OR circuits $126_0$ to $126_N$ and $128_0$ to $128_N$.

Figure 22:
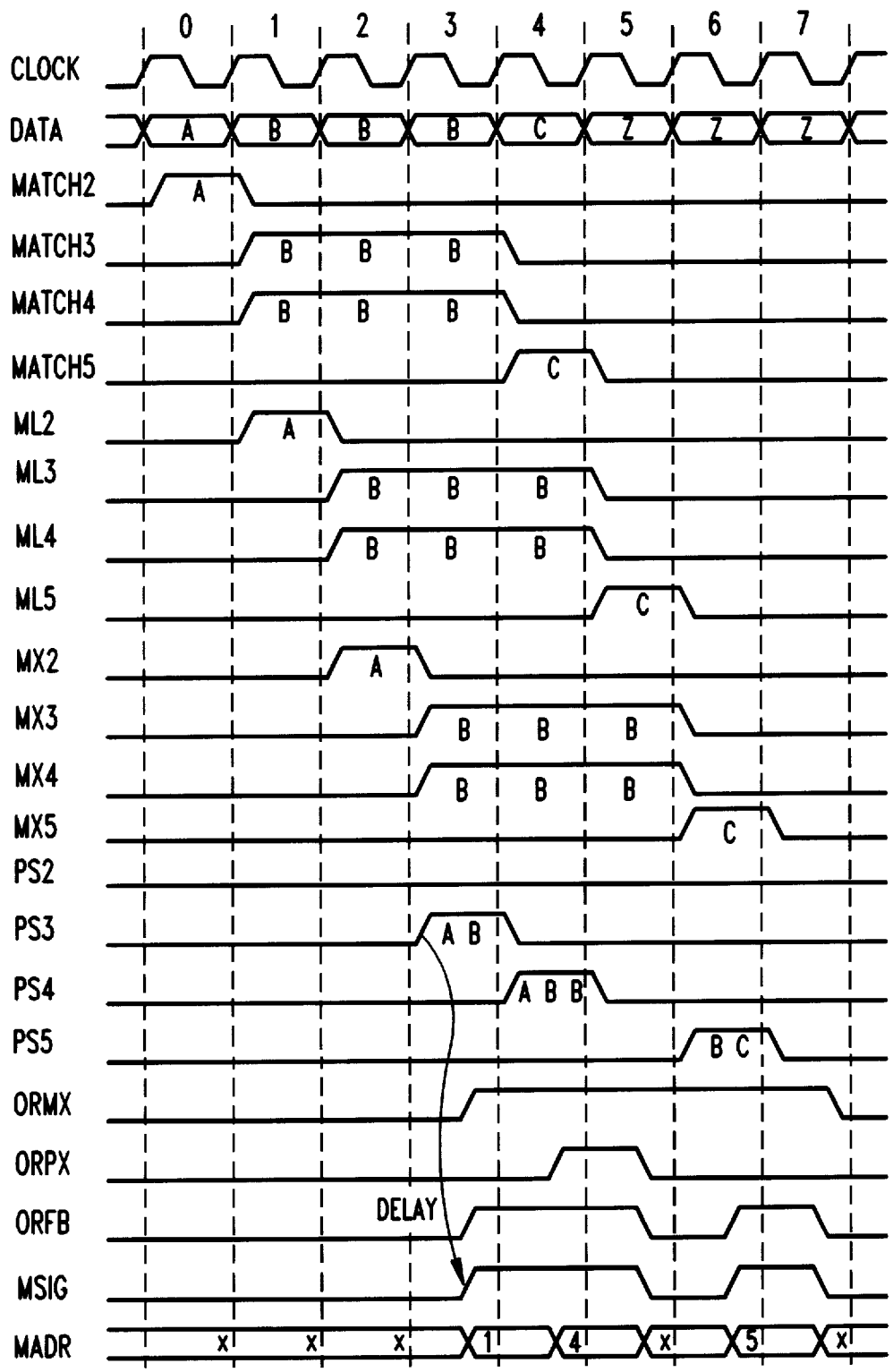
FIG. 22 is a timing diagram used to explain the operation of the comparison result control circuit of the third embodiment.

Next, as the operation of the third embodiment of the present invention, the operation of the comparison result control circuit 110 will be described with reference to FIGS. 21 and 22. In the same way as that described in FIGS. 6 and 12, a character data string of ABABBC has already been stored in the CAM cell rows of the addresses 0 to 5 in the recited order, and character data have been input as search data in order of "ABBBC ...." The latches $112_0$ to $112_5$ are represented by ML0 to ML5, the latches $114_0$ to $114_5$ are represented by MX0 to MX5, the latches $118_0$ to $118_5$ are represented by PX0 to PX5, the signal output by the OR circuit 124 is represented by a signal ORMX, the signal output by the OR circuit 125 is represented by a signal ORPX, and the signal output by the OR circuit 140 is represented by a feedback signal ORFB.

If character data of A is first input (period 0 in FIG. 22) as search data, as shown in FIG. 21 (A), the comparison result will become "match" in the CAM cell rows of the addresses 0 and 2, and among the match lines MATCH0 to MATCH5, only the match lines MATCH0 and MATCH2 will be held high. After the levels of the match lines MATCH0 to MATCH5 are respectively held in the latches ML0 to ML5 of the comparison result control circuit 110, they are output to the latches MX0 to MX5, the signal generation circuits $116_0$ to $116_5$ and AND circuits $132_0$ to $132_5$ and $134_0$ to $134_5$ as feedback signal generation means in the next cycle (period 1 in FIG. 22).

The levels of the signals output by the latches ML0 to ML5 are held in the latches MX0 to MX5, as shown in FIG. 21(B). Also, since at this stage the feedback signal ORFB is low level and the signals output by the latches MX0 to MX5 are all low (latches MX6 to MXN (not shown) and latches MX0 to MXN of other blocks (not shown) are also low), the output signals of the OR circuits $126_0$ to $126_N$ and AND circuits $130_0$ to $130_N$ of the signal generation circuits $116_0$ to $116_5$ also go low, and the levels held in the latches PX0 to PX5 also go low (FIG. 12(B)).

Therefore, further, the match signal MSIG which is generated by the signals output from the latches PX0 to PX5 in the next cycle (C) (period 2 in FIG. 22), also goes to a low level. Thus, in the third embodiment, even if only one character matches, i.e., even if with the first comparison operation there is the CAM cell row in which the comparison result matches, the match signal MSIG does not go to a high level.

On the other hand, if character data of B is input as the next search data (period 1 in FIG. 22), as shown in FIG. 21(B), the comparison result will match in the CAM cell rows of the addresses 1, 3, and 4, and the levels of the match lines (only match lines MATCH1, MATCH3, and MATCH5 are high levels) will be held in the latches ML0 to ML5, respectively. And, in the next cycle (period 2 in FIG. 22), the output signals of the latches ML1, ML3, and ML5 go high, the levels of the signals output from the latches ML0 to ML5 are held in the latches MX0 to MX5, the outputs of the latches MX0 and MX2 (i.e., latches MX of the preceding stage of latches ML1 and ML3) go high, and the outputs of the OR circuits $126_1$ and $126_3$ go high. Also, the level change in the feedback signal ORFB is delayed by one cycle of the clock SR, as will be described later. Therefore, during this cycle (period 2), the feedback signal is held low, and the outputs of the OR circuits $128_0$ to $128_N$ go high.

Therefore, the outputs of the AND circuits $130_1$ and $130_3$ go high, and these high level signals are held in the latches PX1 and PX3, as shown in FIG. 21(C). Thus, when in the comparison result control circuit 110 of the third embodiment, it is detected that 2 characters match, the outputs of the AND circuits 130 would be influenced even if the feedback signal ORFB were a low level. Therefore, in the next cycle (period 3 in FIG. 22), the match signals MSIG0 and MSIG generated by the signals input from the latches PX0 to PX5 to the first priority encoder 74 also go high. Thus, when two or more characters sequentially match, i.e., only when a sequentially input data string comprising a plurality of search data is stored in the CAM cell array 26, the match signal MSIG goes to a high level.

With respect to the comparison results for the search data that are input in sequence to the repeat data search device 20, the signal output by the AND circuit 130 changes in the same way as the signal PE described in the first embodiment, but since the signal from the AND circuit is output through the latch PX to the first priority encoder 74, the level change in the signal output from the latch PX to the first priority encoder 74 is delayed one clock with respect to the signal PE. Also, since the length of the signal path for generating the match signals MSIG0 and MSIG is long, as described in the first embodiment, the level change in the match signal MSIG is delayed with respect to the level change in the output signal of the latch PX3, as shown in FIG. 22.

Also, the signals output by the AND circuits $132_0$ to $132_N$ and $134_0$ to $134_N$ is output as a feedback signal ORFB through the OR circuits 120, 122, 121 and 123, AND circuit 138 and OR circuit 140, so the length of the signal path for generating the feedback signal ORFB becomes longer. Also, in the third embodiment, the time for a signal to pass through the signal path is regulated by the latches 122 and 123 newly added. Therefore, as will be seen from the comparison of FIG. 22 with FIG. 7, the level change in the feedback signal ORFB is also delayed with respect to the match signal MSIG in the first embodiment by one cycle of the clock SR.

On the other hand, if character data of B is input as the next search data (period 2 in FIG. 22), as shown in FIG. 21(C), the same match lines as the last time will go high, and after the levels of the match lines are held in the latches ML0 to ML5 once, in the next cycle (period 3 in FIG. 22) they are output to the latches MX0 to MX5 and the signal generation circuits $116_0$ to $116_5$. As shown in FIG. 22, during this period 3, the feedback signal ORFB that is output by the OR circuit 140 goes to a high level, the output signal of the OR circuit 126 goes to a high level independently of the level of the signal that is input by the latch MX of the preceding stage, and the output signal of the OR circuit 128 matches with the level of the signal that is input by the latch PX of the preceding stage.

At this time, as shown in FIG. 21(C) with hatching, since among the latches ML1, ML3, and ML4 whose outputs go high, the latch corresponding to the latch PX of the preceding stage whose output is high is only the latch ML4, only the output signal of the AND circuit $130_4$ of the signal generation circuit $116_4$ goes to a high level. This result is held in the latches PX0 to PX5 and, in the next cycle (period 4 in FIG. 21), is output to the first priority encoder 74. The match signals MSIG0 and MSIG are held high and the value of the match address MADR is the address 4 of the latch PX4 (FIG. 21(D)). Also, the feedback signal ORFB is also held high. Also, as shown in FIG. 21(D), if character data of B is input as the next search data (period 3 in FIG. 22), the levels of the match lines will be held in the latches ML0 to ML5 and in the next cycle (period 4), they will be input to the signal generation circuits $116_0$ to $116_5$. These levels are the same as the last time and the feedback signal ORFB is a high level, but since for all of the latches ML1, ML3, and ML4 which output a high level signal, the signal which is output from the latch PX of the preceding stage is a low level, all of the signals output by the AND circuits $130_0$ to $130_N$ go low. Also, the match signal MSIG0, the match signal MSIG, and the feedback signal ORFB go low in the next cycle (period 5).

Further, if character data of C is input as the next search data (period 4), as shown in FIG. 21(E), only the match line MATCH5 will go to a high level. After the levels of the match lines are held in the latches ML0 to ML5 once, in the next cycle (period 5) they are output to the signal generation circuits $116_0$ to $116_5$. Since, during this period 5, the feedback signal ORFB goes to a low level, the output signal of the OR circuit 128 goes to a high level independently of the level of the signal that is input by the latch PX of the preceding stage, and the output signal of the OR circuit 126 matches with the level of the signal that is input by the latch MX of the preceding stage.

Since during this period, only the latch ML5 outputs a high level signal and the latch MX4 of the preceding stage also outputs a high level signal, only the signal output by the AND circuit $130_5$ goes to a high level. Therefore, the match signal MSIG0, the match signal MSIG, and the feedback signal ORFB go high in the next cycle (period 6), and also the value of the match address MADR0 becomes the address 5 of the latch PX 5 that output a high level signal.

Thus, during the cycle (period 4) in which the end of a repeat character string having a length of two or more characters is detected, the feedback signal ORFB does not go to a low level, and in the next cycle the signal goes to a low level. The levels (search result of a single character) output from the latches ML0 to MLN in the cycle in which the end of the repeat character string is detected, are output from the latches MX0 to MXN in the next cycle in which the feedback signal ORFB goes to a low level. Therefore, when there exists a repeat character string having a length of two or more characters in which the head of the string is a single character that matches in the cycle in which the above-described end is detected (in the example of FIG. 21, a character string of BC stored in the CAM cell rows of the addresses 4 and 5), that repeat character string can be searched.

As described above, in the comparison result control circuit 110 according to the third embodiment of the present invention, the level change in the feedback signal ORFB is allowed to delay by one cycle of the clock SR, as compared with the conventional search device and the search device of the first embodiment, and the signal output by the AND circuit 100 of the signal generation circuit 116 passes through the signal path for generating the feedback signal ORFB (signal path leading from the output of the AND circuit $132_0$ to $132_N$ and $134_0$ to $134_N$ through the OR circuits 120, 124 and 121, 125, AND circuit 138 and an OR circuit 140 to the input of the signal generation circuit 116) for a time corresponding to two cycles of the clock SR. Therefore, the cycle of the clock SR can be reduced to about a half length (about twice as much frequency), so the comparison result control circuit 110 can be operated at twice as much speed and the data compression processing can be operated at high speed, as compared with the conventional device.

Figure 14:
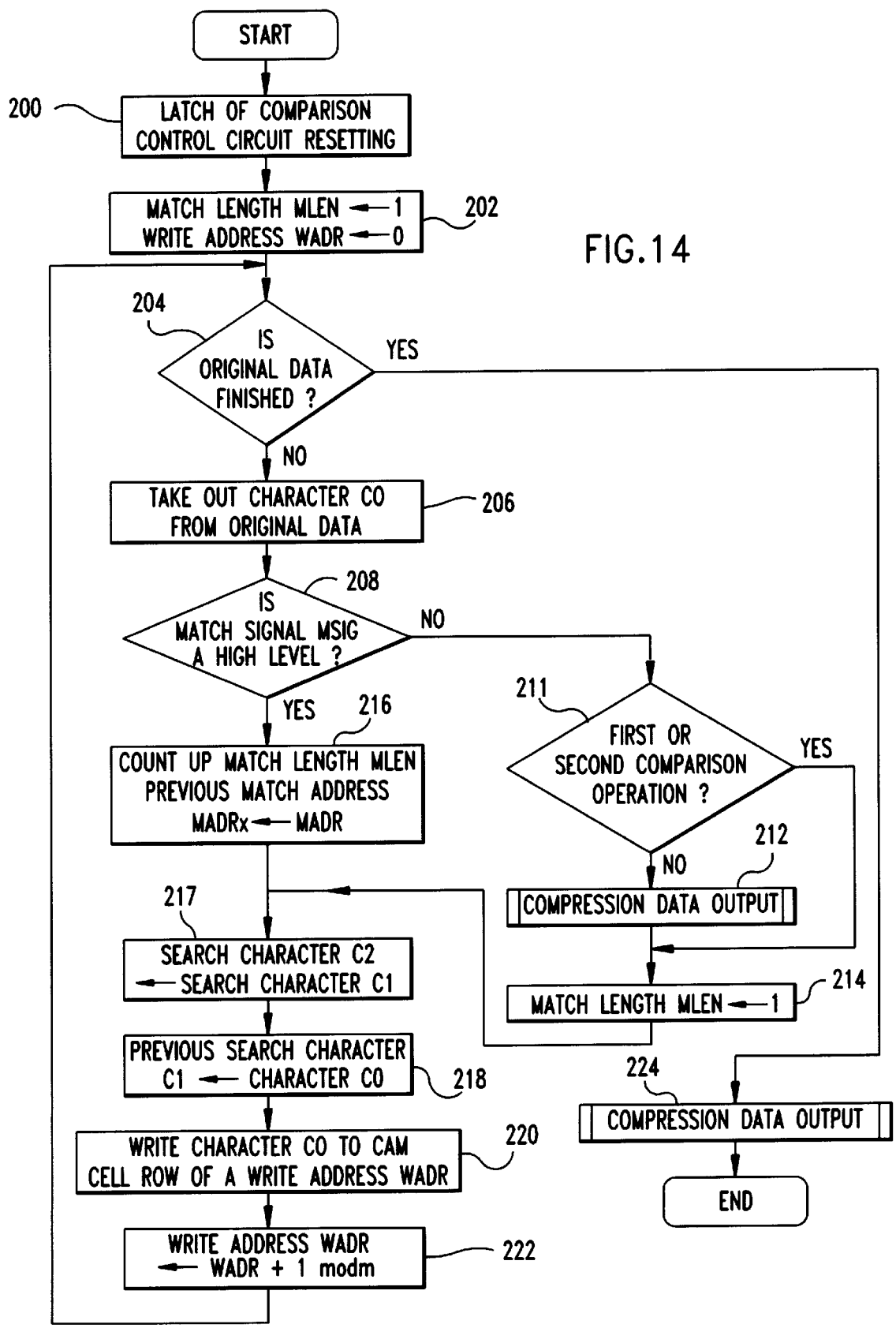
FIG. 14 is a flowchart used to explain the steps that are executed by the data compression controller of the second embodiment.

The processing in the data compression controller 22 according to the third embodiment of the invention is the same as in the second embodiment shown in the flowchart of FIG. 14.

Also, in all of the first, second and third embodiments, all the paths except the feedback paths can be configured as pipelines with any stages, so that the portion for which the processing becomes too slow due to the doubled frequency can be readily accommodated by insertion of latches to increase the 1-stage pipelines. When the number of stages of a pipeline is increased, the cycle until the compressed data for the search data input is output is extended, so it becomes necessary to save the character data and addresses for the corresponding cycles. In addition, the circuit will not be stopped when the input data are exhausted, but must be operated some more cycles to push out the data accumulated in the pipeline. In FIGS. 7, 13 and 22, search results are output by the latches ML2 to ML5 in the cycle following that in which the search data are input, but for the sake of simplicity, in the flowcharts shown in FIGS. 6, 12, 21 and 8, 14, search results are shown to be output by the latches ML2 to ML5 directly after the input of the search data, thereby reducing the number of stages of the pipeline by 1. The operation is also omitted for pushing out the data left in the pipeline at the end of the flowchart shown in FIG. 14.

While there has been described an example of a constitution (constitution in which the calculation shown in equation (11) is performed) in which character data is written in ascending order of the addresses of CAM cell rows, the match of a comparison result is a 1 (high level), and the non-match of the comparison result is a 0 (low level), the constitution of the comparison result control circuit 110 is not limited to the embodiment described above. The present invention includes all circuit constitutions which realize any of calculations shown in equations (11) to (14).

As has been described hereinbefore, the present invention has an excellent advantage that the device can be reduced in size.

Also, the present invention has an excellent advantage that data can be compressed at high speed.

I claim:

1. A search device for data compression, comprising:
   a plurality of memory means to store first unit data having a predetermined bit length;
   a plurality of comparison means corresponding in number to said plurality of memory means for comparing said first unit data stored in said memory means and second unit data being input and for outputting a comparison signal representative of the comparison result;
   control means for taking out said second unit data sequentially from primary data composed of a plurality of unit data and inputting said second unit data sequentially to each of said plurality of comparison means of said memory means and also for sequentially storing said second unit data input to each of said plurality of comparison means in said memory means in ascendant order of addresses respectively given to each set of each memory means and each comparison means;
   comparison result control means for computing said comparison signal according to an equation for each cycle to generate first and second intermediate signals PS and PE corresponding to each comparison means and a signal MSIG and for outputting said signal MSIG as said comparison result, said comparison signal being output from each of said plurality of comparison means each time said second unit data is input to said comparison means and said equation being given by if a current cycle is expressed by m, the comparison signal output from the comparison means of an address n is expressed by ML(n,m), a logical sum is expressed by "+," a logical product is expressed by "×," the maximum value of the address n is expressed by N, the address −1 is expressed by N, match of the comparison result is expressed by "1,"and non-match of the comparison result is expressed by "0,"

$PE(n,m)=ML(n,m)\times PS(n-1,m)$ $MSIG=PE(0,m)+PE(1,m)+...+PE(N,m)$ when $MSIG=1$, $PS(n,m+1)=ML(n,m)\times PS(n-1,m)$ when $MSIG=0$, $PS(n,m+1)=ML(n,m)$, and if the match of the comparison result is expressed by "0" and the non-match of the comparison result is expressed by "1,"

$PE(n,m)=ML(n,m)+PS(n-1,m)$ $MSIG=PE(0,m)\times PE(1,m)\times...\times PE(N,m)$ when $MSIG=0$, $PS(n,m+1)=ML(n,m)+PS(n-1,m)$ when $MSIG=1$, $PS(n,m+1)=ML(n,m)$.

2. The search device for data compression as set forth in claim 1, wherein said comparison result control means comprises:
   a plurality of first signal hold means corresponding in number to said plurality of comparison means for holding said comparison signal ML(n,m) that was output from the comparison means of the address n;
   a plurality of first signal generation means to which said comparison signal ML(n,m) held in said first signal hold means of the address n, a first intermediate signal PS(n−1,m) of an address n−1, and said signal MSIG are input and which generate a first intermediate signal PS(n,m+1) and a second intermediate signal PE(n,m) of the address n, the plurality of first signal generation means corresponding in number to said plurality of comparison means;
   a plurality of second signal hold means corresponding in number to said plurality of comparison means for holding a first intermediate signal PS(n,m) that was output from the first signal generation means of the address n and for outputting said first intermediate signal PS(n,m) to the first signal generation means of an address n+1; and
   second signal generation means for generating and outputting said signal MSIG based on said second intermediate signal PE(n,m) that was input from each of said plurality of first signal generation means.

3. The search device for data compression as set forth in claim 1 wherein said plurality of memory means and said plurality of comparison means are formed with a content addressable memory.

4. A search device for data compression, comprising:

a plurality of memory means to store first unit data having a predetermined bit length;

a plurality of comparison means corresponding in number to said plurality of memory means for comparing said first unit data stored in said memory means and second unit data being input and for outputting a comparison signal representative of the comparison result;

control means for taking out said second unit data sequentially from primary data composed of a plurality of unit data and inputting said second unit data sequentially to each of said plurality of comparison means of said memory means and also for sequentially storing said second unit data input to each of said plurality of comparison means in said memory means in descendent order of addresses respectively given to each set of each memory means and each comparison means;

comparison result control means for computing said comparison signal according to an equation for each cycle to generate first and second intermediate signals PS and PE corresponding to each comparison means and a signal MSIG and for outputting said signal MSIG as said comparison result, said comparison signal being output from each of said plurality of comparison means each time said second unit data is input to said comparison means and said equation being given by if a current cycle is expressed by m, the comparison signal output from the comparison means of an address n is expressed by ML(n,m), a logical sum is expressed by "+," a logical product is expressed by "×," the maximum value of the address n is expressed by N, the address N+1 is expressed by 0, match of the comparison result is expressed by "1,"and non-match of the comparison result is expressed by "0,"

$$PE(n,m)=ML(n,m)\times PS(n+1,m)\ MSIG=PE(0,m)+PE(1,m)+\ldots$$
$$+PE(N,m)\ \text{when}\ MSIG=1,\ PS(n,m+1)=ML(n,m)\times PS(n+1,m)$$
$$\text{when}\ MSIG=0,\ PS(n,m+1)=ML(n,m),\ \text{and}$$

if the match of the comparison result is expressed by "0" and the non-match of the comparison result is expressed by "1,"

$$PE(n,m)=ML\ (n,m)+PS(n+1,m)\ MSIG=PE(0,m)\times PE(1,m)\times\ldots$$
$$\times PE(N,m)\ \text{when}\ MSIG=0,\ PS(n,m+1)=ML(n,m)+PS(n+1,m)$$
$$\text{when}\ MSIG\ 1,\ PS(n,m+1)=ML(n,m).$$

5. The search device for data compression as set forth in claim 4, wherein said comparison result control means comprises:

a plurality of first signal hold means corresponding in number to said plurality of comparison means for holding said comparison signal ML(n,m) that was output from the comparison means of the address n;

a plurality of first signal generation means to which said comparison signal ML(n,m) held in said first signal hold means of the address n, a first intermediate signal PS(n+1,m) of an address n+1, and said signal MSIG are input and which generate a first intermediate signal PS(n,m+1) and a second intermediate signal PE(n,m) of the address n, the plurality of first signal generation means corresponding in number to said plurality of comparison means;

a plurality of second signal hold means corresponding in number to said plurality of comparison means for holding a first intermediate signal PS(n,m) that was output from the first signal generation means of the address n and for outputting said first intermediate signal PS(n,m) to the first signal generation means of an address n−1; and second signal generation means for generating and outputting said signal MSIG based on said second intermediate signal PE(n,m) that was input from each of said plurality of first signal generation means.

6. The search device for data compression as set forth in claim 4 wherein said plurality of memory means and said plurality of comparison means are formed with a content addressable memory.

7. A search device for data compression, comprising:

a plurality of memory means to store first unit data having a predetermined bit length;

a plurality of comparison means corresponding in number to said plurality of memory means for comparing said first unit data stored in said memory means and second unit data being input and for outputting a comparison signal representative of the comparison result;

control means for taking out said second unit data sequentially from primary data composed of a plurality of unit data and inputting said second unit data sequentially to each of said plurality of comparison means of said memory means and also for sequentially storing said second unit data input to each of said plurality of comparison means in said memory means in ascendant order of addresses respectively given to each set of each memory means and each comparison means;

comparison result control means for computing said comparison signal according to an equation for each cycle to generate third and fourth intermediate signals MX(n, m) and PX(n,m) corresponding to each comparison means, a feedback signal ORFB, and a signal MSIG and for outputting said signal MSIG as said comparison result, said comparison signal being output from each of said plurality of comparison means each time said second unit data is input to said comparison means and said equation being given by if a current cycle is expressed by m, the comparison signal output from the comparison means of an address n is expressed by ML(n,m), a logical sum is expressed by "+," a logical product is expressed by "×," the maximum value of the address n is expressed by N, the address −1 is expressed by N, match of the comparison result is expressed by "1," and non-match of the comparison result is expressed by "0,"

$$MX(n,m+1)=ML(n,m)\ ORFB=PX(0,m)+PX(1,m)+\ldots+PX(N,m)$$
$$\text{when}\ ORFB=1,\ PX(n,m+1)=ML(n,m)\times PX(n-1,m)\ \text{when}\ ORFB=0,$$
$$PX(n,m+1)=ML(n,m)\times MX(n-1,m)\ MSIG=PX(0,m)+PX(1,m)+\ldots+PX(N,m),\ \text{and}$$

if the match of the comparison result is expressed by "0" and the non-match of the comparison result is expressed by "1,"

$$MX(n,m+1)=ML(n,m)\ ORFB=PX(0,m)\times PX(1,m)\times\ldots\times PX(N,m)$$
$$\text{when}\ ORFB=1,\ PX(n,m+1)=ML(n,m)+PX(n-1,m)\ \text{when}\ ORFB=0,$$
$$PX(n,m+1)=ML(n,m)+MX(n-1,m)\ MSIG=PX(0,m)\times PX(1,m)\times\ldots\times PX(N,m).$$

8. The search device for data compression as set forth in claim 4, wherein said comparison result control means comprises:

a plurality of third signal hold means corresponding in number to said plurality of comparison means for holding said comparison signal ML(n,m) that was output from the comparison means of the address n;

a plurality of fourth signal hold means corresponding in number to said plurality of comparison means for holding as a third intermediate signal MX(n,m+1) said comparison signal ML(n,m) held once in said third signal hold means of the address n;

a plurality of third signal generation means to which said comparison signal ML(n,m) held in said third signal hold means of the address n, the third intermediate signal MX (n−1,m) held in the fourth signal hold means of an address n−1, a fourth intermediate signal PX(n−1,m) of the address n−1, and said feedback signal ORFB are input and which generate a fourth intermediate signal PX(n,m+1), the plurality of third signal generation means corresponding in number to said plurality of comparison means;

a plurality of fifth signal hold means corresponding in number to said plurality of comparison means for holding the fourth intermediate signal PX(n,m) that was output by the third signal generation means of the address n and for outputting said fourth intermediate signal PX(n,m) to the third signal generation means of an address n+1;

feedback signal generation means for generating said feedback signal ORFB based on said fourth intermediate signal PX that was input from each of said plurality of third signal generation means and for outputting said feedback signal to each of said plurality of third signal generation means; and first regulation means provided at the halfway of a signal path for regulating a time for a signal to pass through said signal path, the signal path including a first signal line for guiding said fourth intermediate signal PX(n,m) output by each of said plurality of third signal generation means, to said feedback signal generation means, and a second signal line for guiding said feedback signal ORFB output by said feedback signal generation means, to each of said plurality of third signal generation means.

9. The search device for data compression as set forth in claim 7 wherein said plurality of memory means and said plurality of comparison means are formed with a content addressable memory.

10. A search device for data compression, comprising:

a plurality of memory means to store first unit data having a predetermined bit length;

a plurality of comparison means corresponding in number to said plurality of memory means for comparing said first unit data stored in said memory means and second unit data being input and for outputting a comparison signal representative of the comparison result;

control means for taking out said second unit data sequentially from primary data composed of a plurality of unit data and inputting said second unit data sequentially to each of said plurality of comparison means of said memory means and also for sequentially storing said second unit data input to each of said plurality of comparison means in said memory means in descendent order of addresses respectively given to each set of each memory means and each comparison means;

comparison result control means for computing said comparison signal according to an equation for each cycle to generate third and fourth intermediate signals MX(n,m) and PX(n,m) corresponding to each comparison means, a feedback signal ORFB, and a signal MSIG and for outputting said signal MSIG as said comparison result, said comparison signal being output from each of said plurality of comparison means each time said second unit data is input to said comparison means and said equation being given by if a current cycle is expressed by m, the comparison signal output from the comparison means of an address n is expressed by ML(n,m), a logical sum is expressed by "+," a logical product is expressed by "×," the maximum value of the address n is expressed by N, the address N+1 is expressed by 0, match of the comparison result is expressed by "1,"and non-match of the comparison result is expressed by "0,"

$$MX(n,m+1)=ML(n,m)\ ORFB=PX(0,m)+PX(1,m)+\ldots+PX(N,m)$$

when $ORFB=1$, $PX(n,m+1)=ML(n,m)\times PX(n+1,m)$ when $ORFB=0$, $PX(n,m+1)=ML(n,m)\times MX(n+1,m)$ $MSIG=PX(0,m)+PX(1,m)++PX(N,m)$, and if the match of the comparison result is expressed by "0" and the non-match of the comparison result is expressed by "1,"

$$MX(n,m+1)=ML(n,m)\ ORFB=PX(0,m)\times PX(1,m)\times\ldots\times PX(N,m)$$

when $ORFB=0$, $PX(n,m+1)=ML(n,m)+PX(n+1,m)$ when $ORFB=1$, $PX(n,m+1)=ML(n,m)+MX(n+1,m)$ $MSIG=PX(0,m)\times PX(1,m)\times\ldots\times PX(N,m)$.

11. The search device for data compression as set forth in claim 10, wherein said comparison result control means comprises:

a plurality of third signal hold means corresponding in number to said plurality of comparison means for holding said comparison signal ML(n,m) that was output from the comparison means of the address n;

a plurality of fourth signal hold means corresponding in number to said plurality of comparison means for holding as a third intermediate signal MX(n,m+1) said comparison signal ML(n,m) held once in said third signal hold means of the address n;

a plurality of third signal generation means to which said comparison signal ML(n,m) held in said third signal hold means of the address n, the third intermediate signal MX(n+1,m) held in the fourth signal hold means of an address n+1, a fourth intermediate signal PX(n+1,m) of the address n+1, and said feedback signal ORFB are input and which generate a fourth intermediate signal PX(n,m+1), the plurality of third signal generation means corresponding in number to said plurality of comparison means;

a plurality of fifth signal hold means corresponding in number to said plurality of comparison means for holding the fourth intermediate signal PX(n,m) that was output by the third signal generation means of the address n and for outputting said fourth intermediate signal PX(n,m) to the third signal generation means of an address n−1;

feedback signal generation means for generating said feedback signal ORFB based on said fourth intermediate signal PX that was input from each of said plurality of third signal generation means and for outputting said feedback signal to each of said plurality of third signal generation means; and first regulation means provided at the halfway of a signal path for regulating a time for a signal to pass through said signal path, the signal path including a first signal line for guiding said fourth intermediate signal PX(n,m) output by each of said plurality of third signal generation means, to said feedback signal generation means, and a second signal line for guiding said feedback signal ORFB output by said feedback signal generation means, to each of said plurality of third signal generation means.

12. The search device for data compression as set forth in claim 10 wherein said plurality of memory means and said plurality of comparison means are formed with a content addressable memory.

13. A search device for data compression, comprising:

a plurality of memory means to store first unit data having a predetermined bit length;

a plurality of comparison means corresponding in number to said plurality of memory means for comparing said first unit data stored in said memory means and second unit data being input and for outputting a comparison signal representative of the comparison result;

control means for taking out said second unit data sequentially from primary data composed of a predetermined number of unit data and inputting said second unit data sequentially to each of said plurality of comparison means of said memory means and also for sequentially storing said second unit data input to each of said plurality of comparison means in said memory means in ascending order of addresses respectively given to each set of each memory means and each comparison means; and comparison result control means for computing said comparison signal according to an equation for each cycle to generate fifth, sixth, seventh and eighth intermediate signals MX(n,m), PX(n,m), ORMX(m) and ORPX(m) corresponding to each comparison means, a feedback signal ORFB, and a signal MSIG and for outputting said signal MSIG as said comparison result, said comparison signal being output from each of said plurality of comparison means each time said second unit data is input to said comparison means and said equation being given by if a current cycle is expressed by m, the comparison signal output from the comparison means of an address n is expressed by ML(n,m), a logical sum is expressed by "+," a logical product is expressed by "×," negation is expressed by "!," the maximum value of the address n is expressed by N, the value of address n−1 is expressed by N when the value of address n is "0," match of the comparison result is expressed by "1," and non-match of the comparison result is expressed by "0,"

$MX(n,m+1)=ML(n,m)$ $ORMX(m)=(ML(0,m) \times MX(N,m))+(ML(1,m) \times MX(0,m))+ \ldots +(ML(N,m) \times MX(N-1,m))$ $ORPX(m)=(ML(0,m) \times PX(N,m))+(ML(1,m) \times PX(0,m))+ \ldots +(ML(N,m) \times PX(N-1,m))$ $ORFB=ORPX(m)+(ORMX(m) \times !ORPX(m-1))$ when $ORFB=1$, $PX(n,m+1)=ML(n,m) \times PX(n-1,m)$ when $ORFB=0$, $PX(n,m+1)=ML(n,m) \times MX(n-1,m)$ $MSIG=PX(0,m)+PX(1,m)+ \ldots +PX(N,m)$, and if the match of the comparison result is expressed by "0" and the non-match of the comparison result is expressed by "1,"

$MX(n,m+1)=ML(n,m)$ $ORMX(m)=(ML(0,m)+MX(N,m)) \times (ML(1,m)+MX(0,m)) \times \ldots \times (ML(N,m)+MX(N-1,m))$ $ORPX(m)=(ML(0,m)+PX(N,m)) \times (ML(1,m)+PX(0,m)) \times \ldots \times (ML(N,m)+PX(N-1,m))$ $ORFB=ORPX(m)+(ORMX(m)+!ORPX(m-1))$ when $ORFB=0$, $PX(n,m+1)=ML(n,m)+PX(n-1,m)$ when $ORFB=1$, $PX(n,m+1)=ML(n,m)+MX(n-1,m)$ $MSIG=PX(0,m) \times PX(1,m) \times \ldots \times PX(N,m)$.

14. The search device for data compression as set forth in claim 13, wherein said comparison result control means comprises:

a plurality of sixth signal hold means corresponding in number to said plurality of comparison means for holding said comparison signal ML(n,m) that was output from the comparison means of the address n;

a plurality of seventh signal hold means corresponding in number to said plurality of comparison means for holding as a fifth intermediate signal MX(n,m+1) said comparison signal ML(n,m) held once in said sixth signal hold means of the address n;

a plurality of fourth signal generation means to which said comparison signal ML(n,m) held in said sixth signal hold means of the address n, the fifth intermediate signal MX(n−1,m) held in the seventh signal hold means of an address n−1, a seventh intermediate signal PX(n−1,m) of the address n−1, and said feedback signal ORFB are input and which generate a sixth intermediate signal PX(n,m+1), the plurality of fourth signal generation means corresponding in number to said plurality of comparison means;

a plurality of eighth signal hold means corresponding in number to said plurality of comparison means for holding the sixth intermediate signal PX(n,m) that was output by the fourth signal generation means of the address n and for outputting said sixth intermediate signal PX(n,m) to the fourth signal generation means of an address n+1;

a plurality of fifth signal generation means to which said comparison signal ML(n,m) held in said sixth signal hold means of the address n and the fifth intermediate signal MX(n−1,m) held in the seventh signal hold means of an address n−1 are input and which generate a seventh intermediate signal ORMX(m), the plurality of fifth signal generation means corresponding in number to said plurality of comparison means;

a plurality of sixth signal generation means to which said comparison signal ML(n,m) held in said sixth signal hold means of the address n and said sixth intermediate signal PX(n−1,m) held in said eighth signal hold means of address n−1 are input and which generate an eighth intermediate signal ORMX(m);

feedback signal generation means for generating said feedback signal ORFB based on said seventh intermediate signal ORMX(m) output by said fifth signal generation means, said eighth intermediate signal ORPX(m) output by said sixth signal generation means and said eighth intermediate signal delayed by one cycle ORPX(m−1) and for outputting said feedback signal to each of said plurality of fourth signal generation means;

second regulation means provided at the halfway of a signal path for regulating a time for a signal to pass through said signal path, the signal path including a third signal line for guiding said comparison signal ML(n,m) output by said plurality of sixth signal hold means and said fifth intermediate signal MX(n−1,m) output by said plurality of seventh signal hold means to said fifth signal generation means, a fourth signal line for guiding said seventh intermediate signal ORMX(m) output by said fifth signal generation means, to said feedback signal generation means, and a fifth signal line for guiding said feedback signal ORFB output by said feedback signal generation means, to each of said plurality of fourth signal generation means; and third regulation means provided at the halfway of a signal path for regulating a time for a signal to pass through said signal path, the signal path including a sixth signal line for guiding said comparison signal ML(n,m) output by said plurality of sixth signal hold means and said sixth intermediate signal MX(n−1,m) output by said plurality of eighth signal hold means to said sixth signal generation means, a seventh signal line for guiding said eighth intermediate signal ORPX(m) output by said sixth signal generation means, to said feedback signal generation means, and a fifth signal line for guiding said feedback signal ORFB output by said feedback signal generation means, to each of said plurality of fourth signal generation means.

15. The search device for data compression as set forth in claim 13 wherein said plurality of memory means and said plurality of comparison means are formed with a content addressable memory.

16. A search device for data compression, comprising:

a plurality of memory means to store first unit data having a predetermined bit length;

a plurality of comparison means corresponding in number to said plurality of memory means for comparing said first unit data stored in said memory means and second unit data being input and for outputting a comparison signal representative of the comparison result;

control means for taking out said second unit data sequentially from primary data composed of a predetermined number of unit data and inputting said second unit data sequentially to each of said plurality of comparison means of said memory means and also for sequentially storing said second unit data input to each of said plurality of comparison means in said memory means in descendent order of addresses respectively given to each set of each memory means and each comparison means; and comparison result control means for computing said comparison signal according to an equation for each cycle to generate fifth, sixth, seventh and eighth intermediate signals MX(n,m), PX(n,m), ORMX(m) and ORPX(m) corresponding to each comparison means, a feedback signal ORFB, and a signal MSIG and for outputting said signal MSIG as said comparison result, said comparison signal being output from each of said plurality of comparison means each time said second unit data is input to said comparison means and said equation being given by if a current cycle is expressed by m, the comparison signal output from the comparison means of an address n is expressed by ML(n,m), a logical sum is expressed by "+," a logical product is expressed by "×," negation is expressed by "!," the maximum value of the address n is expressed by N, the value of the address n+1 is expressed by 0 when the value of the address n is N, match of the comparison result is expressed by "1," and non-match of the comparison result is expressed by "0,"

MX(n,m+1)=ML(n,m) ORMX(m)=(ML(0,m)×MX(1,m))+(ML(1,m)× MX(2,m))+. . . +(ML(N,m)×MX(0,m)) ORPX(m)=(ML(0,m)× PX(1,m))+(ML(1,m)×PX(2,m))+. . . +(ML(N,m)×PX(0,m))

ORFB=ORPX(m)+(ORMX(m)×!ORPX(m−1)) when ORFB=1, PX(n,m+1)=ML(n,m)×PX(n+1,m) when ORFB=0, PX(n,m+1)= ML(n,m)×MX(n+1,m) MSIG=PX(0,m)+PX(1,m)+. . . +PX(N,m), and if the match of the comparison result is expressed by "0" and the non-match of the comparison result is expressed by "1,"

MX(n,m+1)=ML(n,m) ORMX(m)=(ML(0,m)+MX(1,m))×(ML(1,m)+ MX(2,m))×. . . ×(ML(N,m)+MX(0,m)) ORPX(m)=(ML(0,m)+ PX(1,m))×(ML(1,m)+PX(2,m))×. . . ×(ML(N,m)+PX(0,m))

ORFB=ORPX(m)×(ORMX(m)+!ORPX(m−1)) when ORFB=0, PX(n,m+1)=ML(n,m)+PX(n+1,m) when ORFB=1, PX(n,m+1)= ML(n,m)+MX(n+1,m) MSIG=PX(0,m)×PX(1,m)×. . . ×PX(N,m).

17. The search device for data compression as set forth in claim 16, wherein said comparison result control means comprises:

a plurality of sixth signal hold means corresponding in number to said plurality of comparison means for holding said comparison signal ML(n,m) that was output from the comparison means of the address n;

a plurality of seventh signal hold means corresponding in number to said plurality of comparison means for holding as a fifth intermediate signal MX(n,m+1) said comparison signal ML(n,m) held once in said sixth signal hold means of the address n;

a plurality of fourth signal generation means to which said comparison signal ML(n,m) held in said sixth signal hold means of the address n, the fifth intermediate signal MX(n+1,m) held in the seventh signal hold means of an address n+1, a seventh intermediate signal PX(n+1,m) of the address n+1, and said feedback signal ORFB are input and which generate a sixth intermediate signal PX(n,m+1), the plurality of fourth signal generation means corresponding in number to said plurality of comparison means;

a plurality of eighth signal hold means corresponding in number to said plurality of comparison means for holding the sixth intermediate signal PX(n,m) that was output by the fourth signal generation means of the address n and for outputting said sixth intermediate signal PX(n,m) to the fourth signal generation means of an address n−1;

a plurality of fifth signal generation means to which said comparison signal ML(n,m) held in said sixth signal hold means of the address n and the fifth intermediate signal MX(n+1,m) held in the seventh signal hold means of an address n+1 are input and which generate a seventh intermediate signal ORMX(m), the plurality of fifth signal generation means corresponding in number to said plurality of comparison means;

a plurality of sixth signal generation means to which said comparison signal ML(n,m) held in said sixth signal hold means of the address n and said sixth intermediate signal PX(n+1,m) held by said eighth signal hold means of address n+1 are input and which generate an eighth intermediate signal ORPX(m);

feedback signal generation means for generating said feedback signal ORFB based on said seventh intermediate signal ORMX(m) output by said fifth signal generation means, said eighth intermediate signal ORPX(m) output by said sixth signal generation means and said eighth intermediate signal delayed by one cycle ORPX(m−1) and for outputting said feedback signal to each of said plurality of fourth signal generation means;

second regulation means provided at the halfway of a signal path for regulating a time for a signal to pass through said signal path, the signal path including a third signal line for guiding said comparison signal ML(n,m)output by said plurality of sixth signal hold means and said fifth intermediate signal MX(n+1,m) output by said plurality of seventh signal hold means to said fifth signal generation means, a fourth signal line for guiding said seventh intermediate signal ORMX(m) output by said fifth signal generation means, to said feedback signal generation means, and a fifth signal line for guiding said feedback signal ORFB output by said feedback signal generation means, to each of said plurality of fourth signal generation means; and third regulation means provided at the halfway of a signal path for regulating a time for a signal to pass through said signal path, the signal path including a sixth signal line for guiding said comparison signal ML(n,m) output by said plurality of sixth signal hold means and said sixth intermediate signal MX(n+1,m) output by said plurality of eighth signal hold means to said sixth signal generation means, a seventh signal line for guiding said eighth intermediate signal ORPX(m) output by said sixth signal generation means, to said feedback signal generation means, and a fifth signal line for guiding said feedback signal ORFB output by said feedback signal generation means, to each of said plurality of fourth signal generation means.

18. The search device for data compression as set forth in claim 16 wherein said plurality of memory means and said plurality of comparison means are formed with a content addressable memory.

* * * * *